US012300754B2

(12) United States Patent
Wang et al.

(10) Patent No.: US 12,300,754 B2
(45) Date of Patent: *May 13, 2025

(54) CHANNEL CONFIGURATIONS WITH STACKED SEGMENTS FOR GATE-ALL-AROUND BASED DEVICES AND METHODS OF FABRICATION THEREOF

(71) Applicant: Taiwan Semiconductor Manufacturing Co., Ltd., Hsin-Chu (TW)

(72) Inventors: Chih-Ching Wang, Kinmen County (TW); Jon-Hsu Ho, New Taipei (TW); Wen-Hsing Hsieh, Hsinchu (TW); Kuan-Lun Cheng, Hsin-Chu (TW); Zhiqiang Wu, Hsinchu County (TW)

(73) Assignee: TAIWAN SEMICONDUCTOR MANUFACTURING CO., LTD, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/190,754

(22) Filed: Mar. 27, 2023

(65) Prior Publication Data

US 2023/0327025 A1    Oct. 12, 2023

Related U.S. Application Data

(63) Continuation of application No. 17/206,646, filed on Mar. 19, 2021, now Pat. No. 11,616,151.

(Continued)

(51) Int. Cl.
*H01L 29/786* (2006.01)
*H01L 29/423* (2006.01)

(52) U.S. Cl.
CPC .. *H01L 29/78696* (2013.01); *H01L 29/42392* (2013.01)

(58) Field of Classification Search
CPC ......... H01L 29/78696; H01L 29/42392; H01L 27/088; H01L 21/823412; H01L 29/78645;
(Continued)

(56) References Cited

U.S. PATENT DOCUMENTS 7,060,539 B2    6/2006  Chidambarrao et al.
8,552,501 B2   10/2013  Orlowski et al.
(Continued)

FOREIGN PATENT DOCUMENTS

TW          201812419     4/2019
WO      WO-2013012454     1/2013

*Primary Examiner* — Changhyun Yi
(74) *Attorney, Agent, or Firm* — HAYNES AND BOONE, LLP

(57) ABSTRACT

Multi-gate devices and methods for fabricating such are disclosed herein. An exemplary device includes a channel layer, a first source/drain feature, a second source/drain feature, and a metal gate. The channel layer has a first horizontal segment, a second horizontal segment, and a vertical segment connects the first horizontal segment and the second horizontal segment. The first horizontal segment and the second horizontal segment extend along a first direction, and the vertical segment extends along a second direction. The vertical segment has a width along the first direction and a thickness along the second direction, and the thickness is greater than the width. The channel layer extends between the first source/drain feature and the second source/drain feature along a third direction. The metal gate wraps channel layer. In some embodiments, the first horizontal segment and the second horizontal segment are nanosheets.

20 Claims, 42 Drawing Sheets

Related U.S. Application Data

(60) Provisional application No. 63/030,044, filed on May 26, 2020.

(58) Field of Classification Search
CPC ............. H01L 29/6675; H01L 29/0665; H01L 29/0653; H01L 29/0673; H01L 29/66545; H01L 29/785
See application file for complete search history.

(56) References Cited

U.S. PATENT DOCUMENTS

| | | | |
|---|---|---|---|
| 11,616,151 B2* | 3/2023 | Wang | H01L 29/66439 |
| | | | 257/288 |
| 2016/0204263 A1* | 7/2016 | Mukherjee | H01L 21/02538 |
| | | | 257/190 |
| 2017/0104061 A1 | 4/2017 | Peng et al. | |
| 2017/0256615 A1* | 9/2017 | Chen | H01L 27/088 |
| 2019/0057867 A1 | 2/2019 | Smith et al. | |

\* cited by examiner

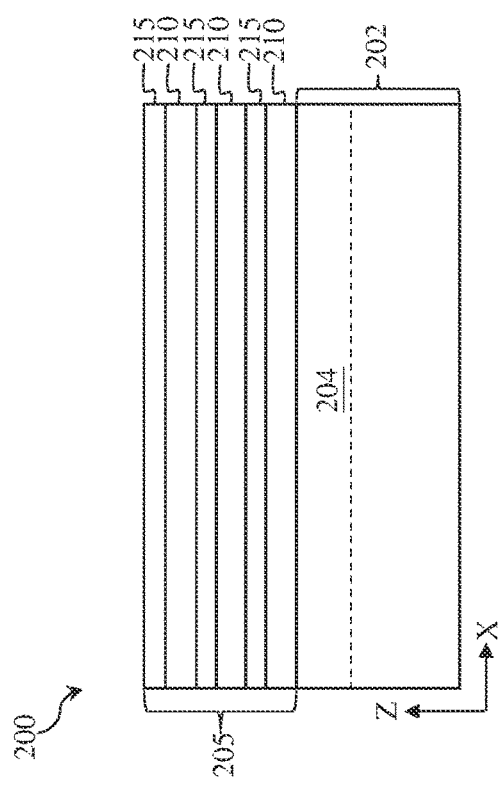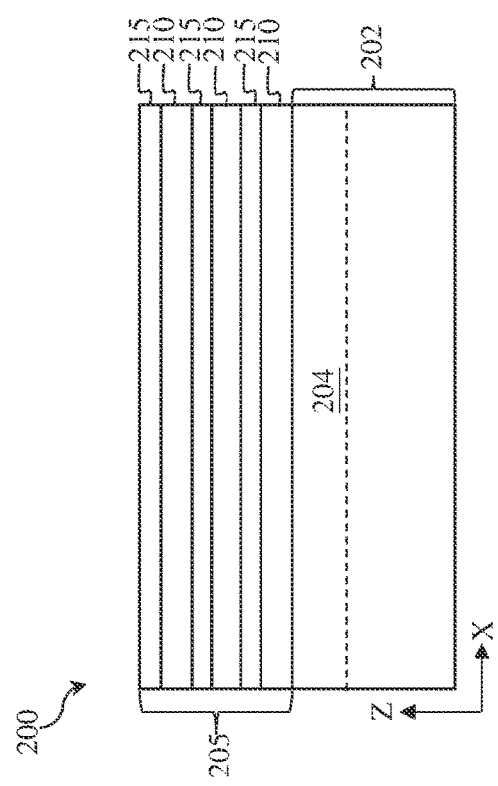

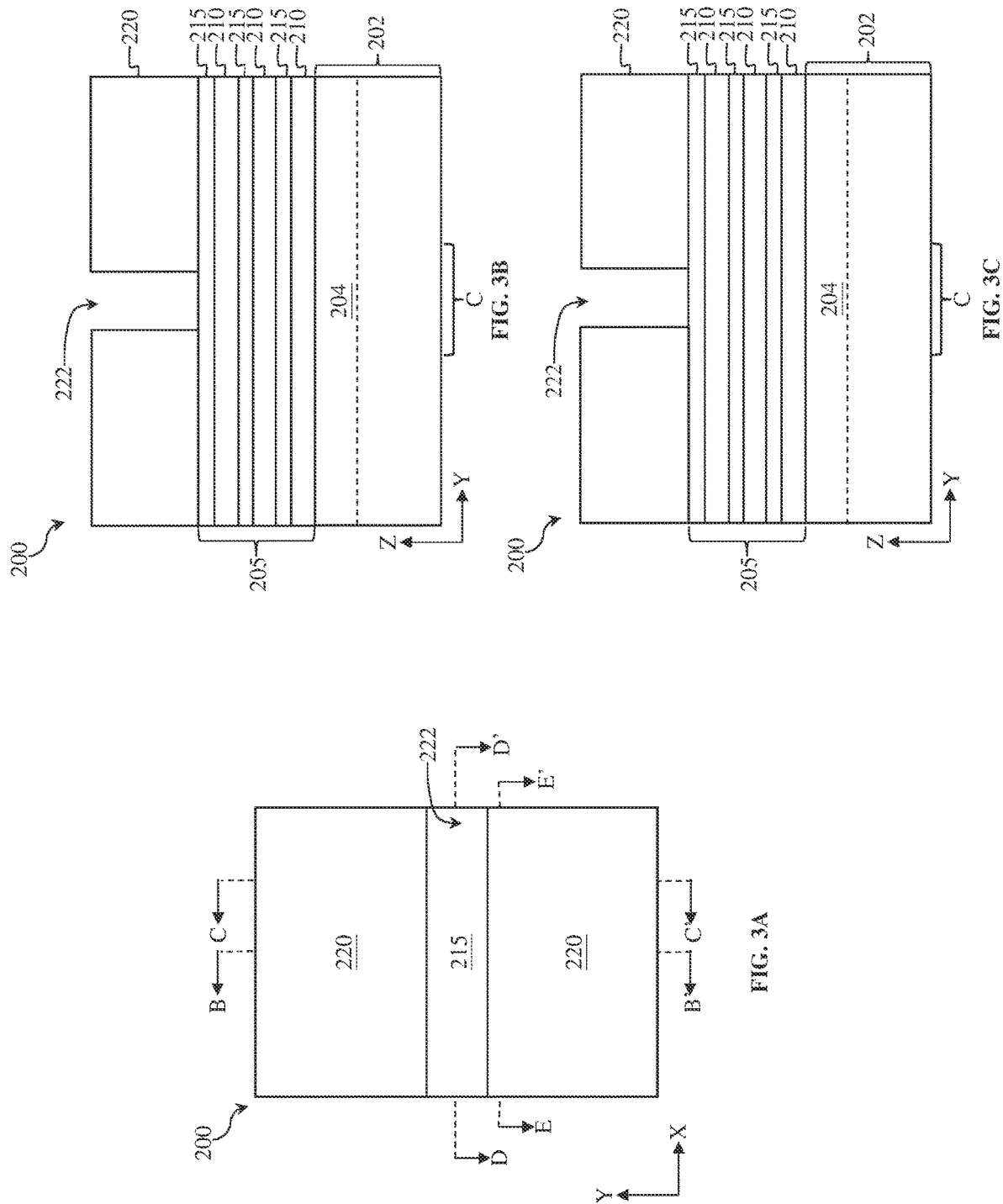

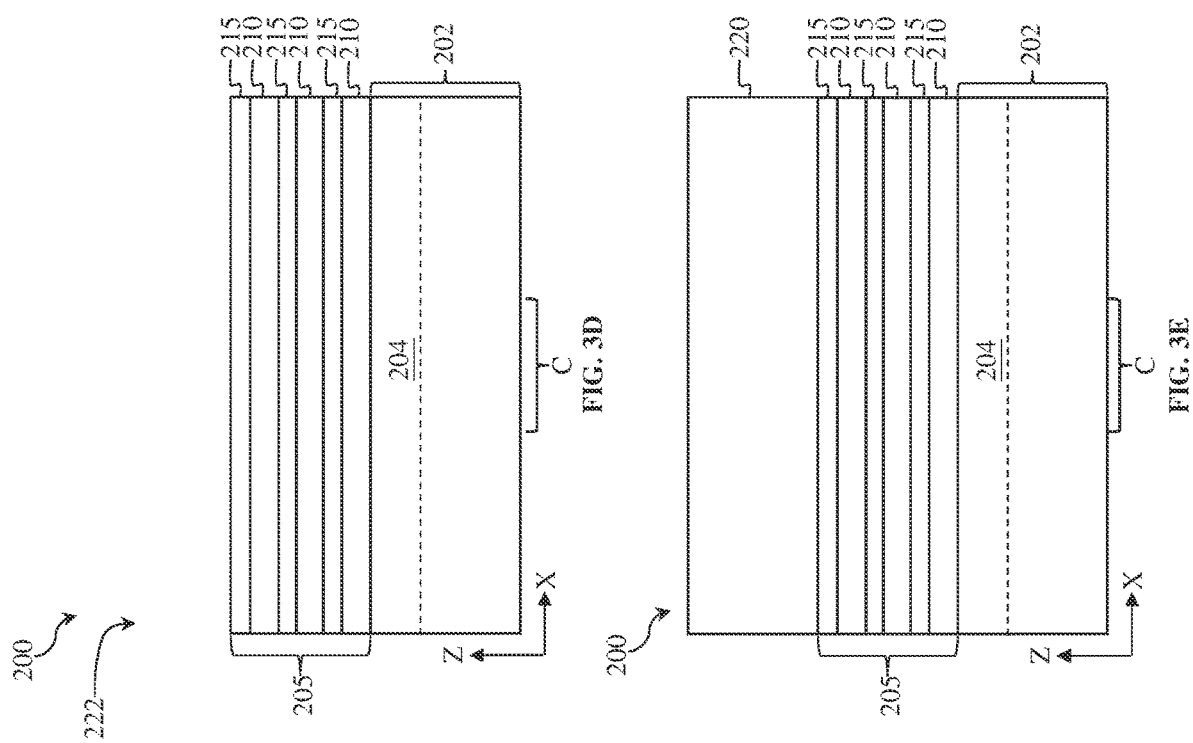

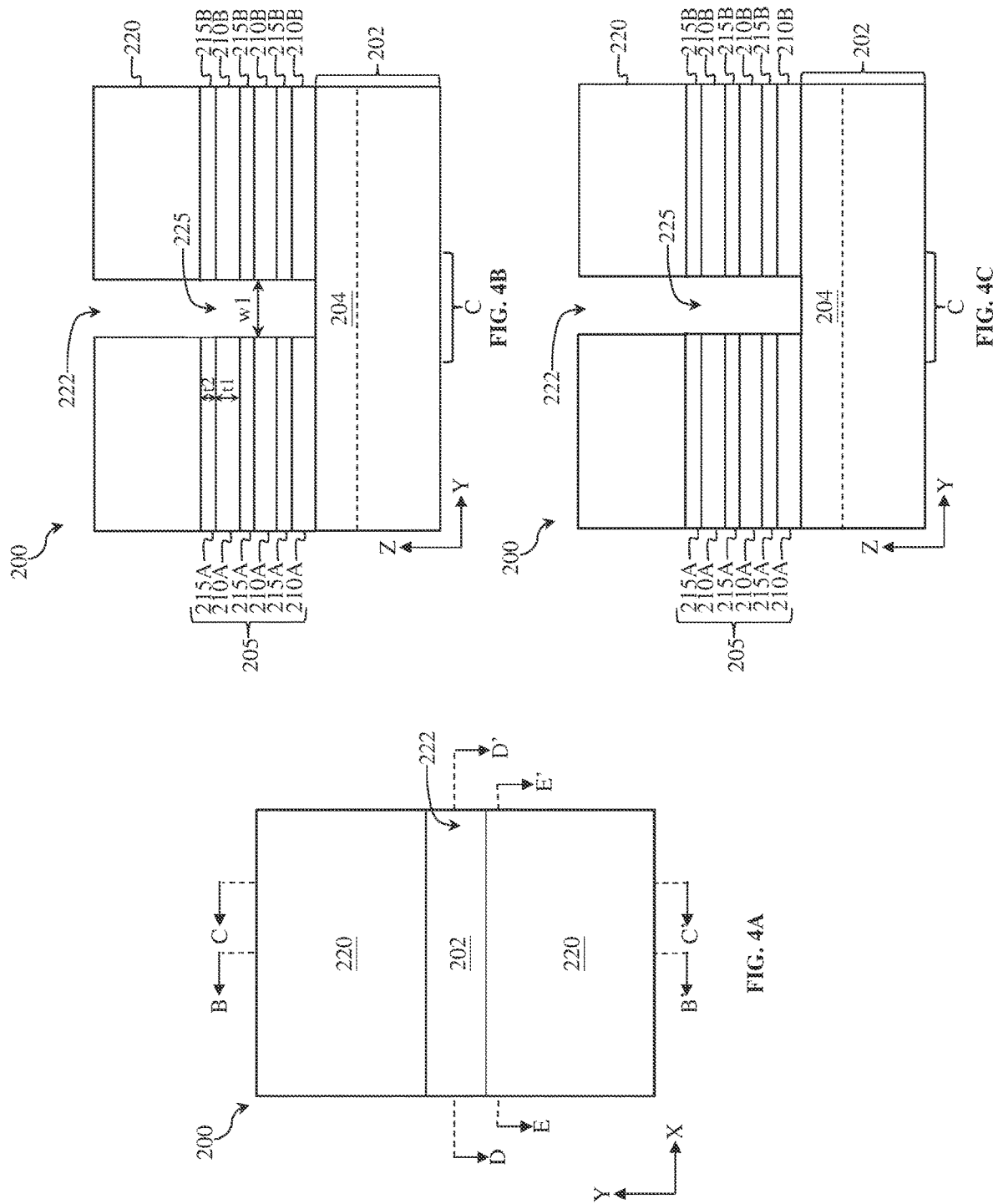

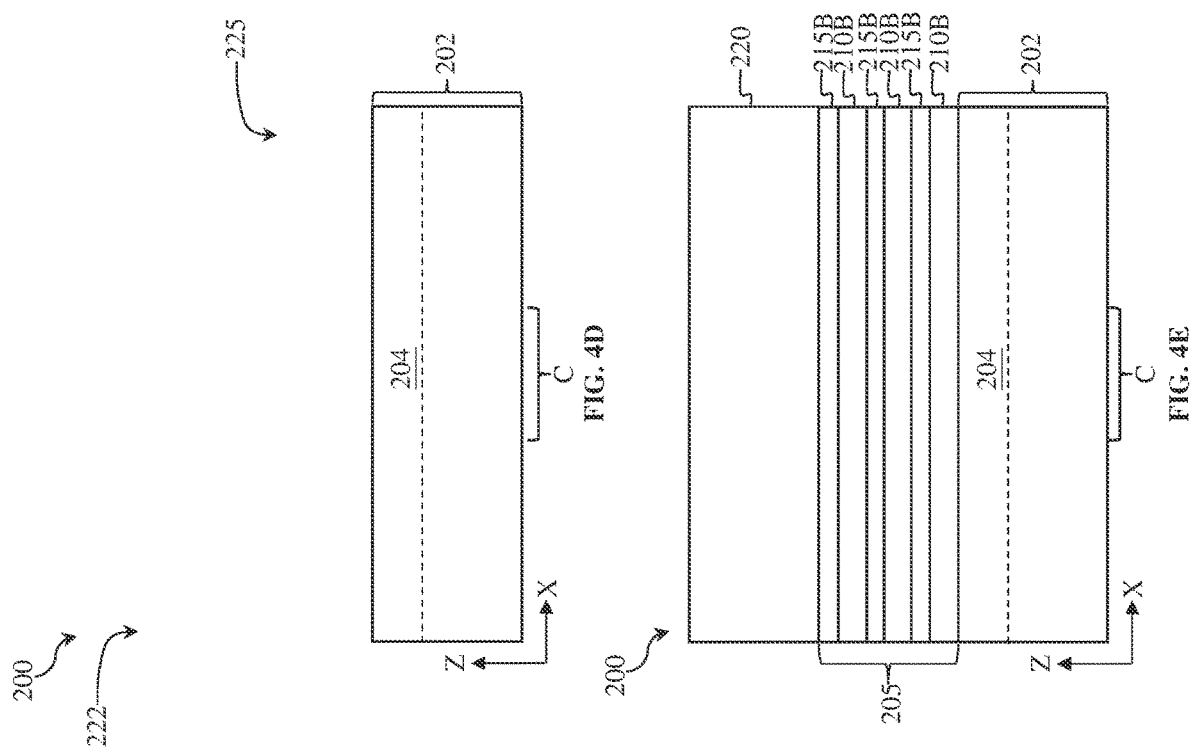

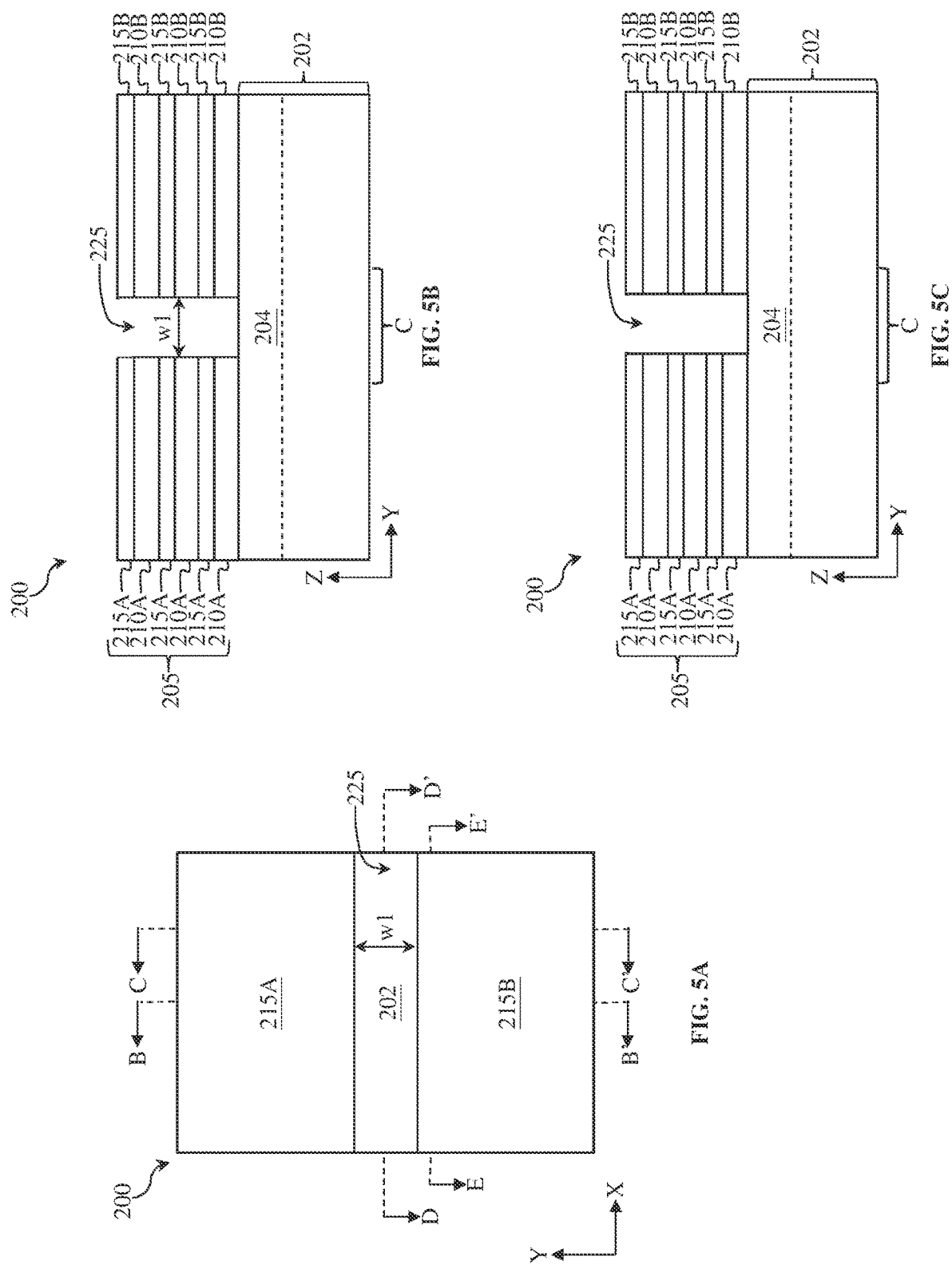

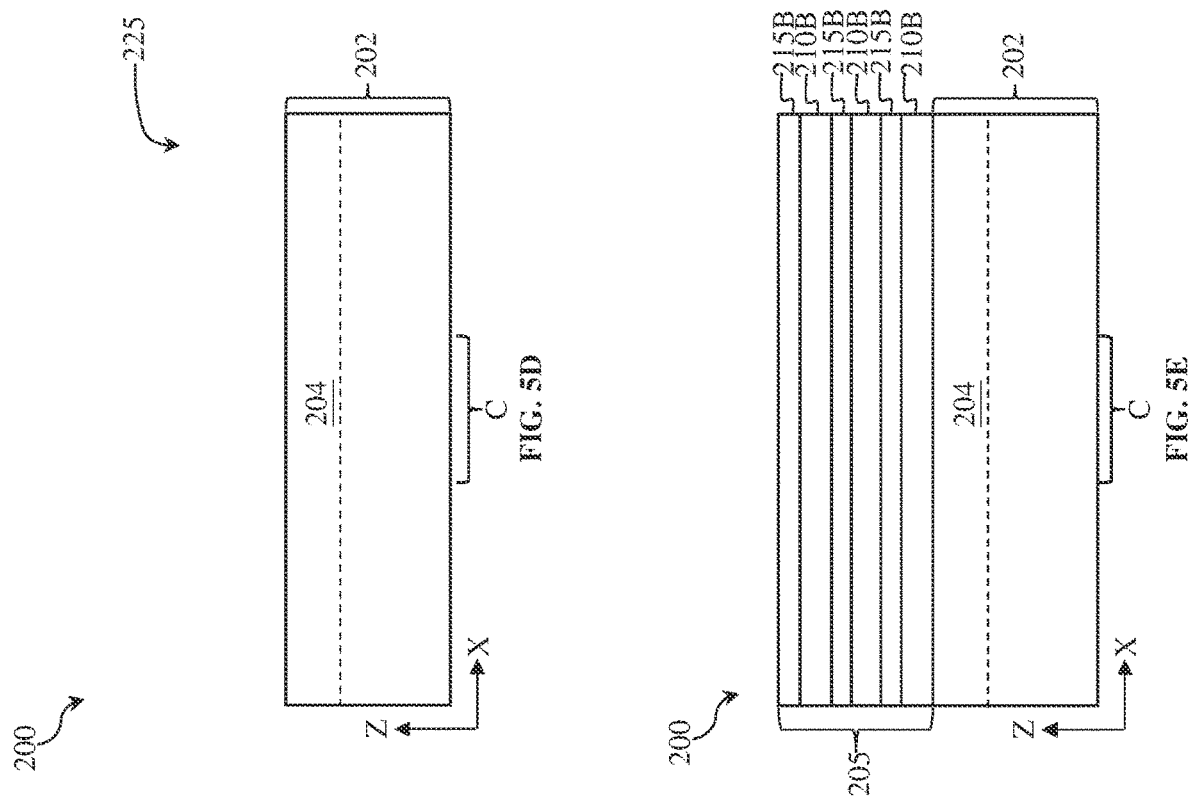

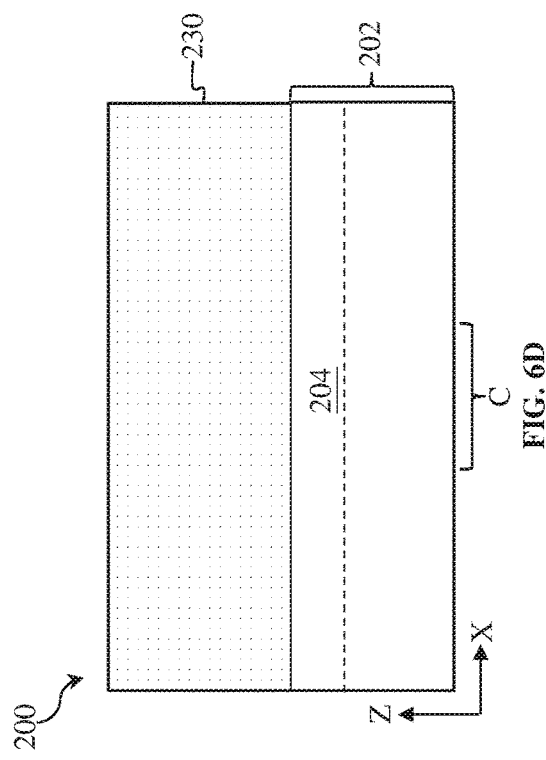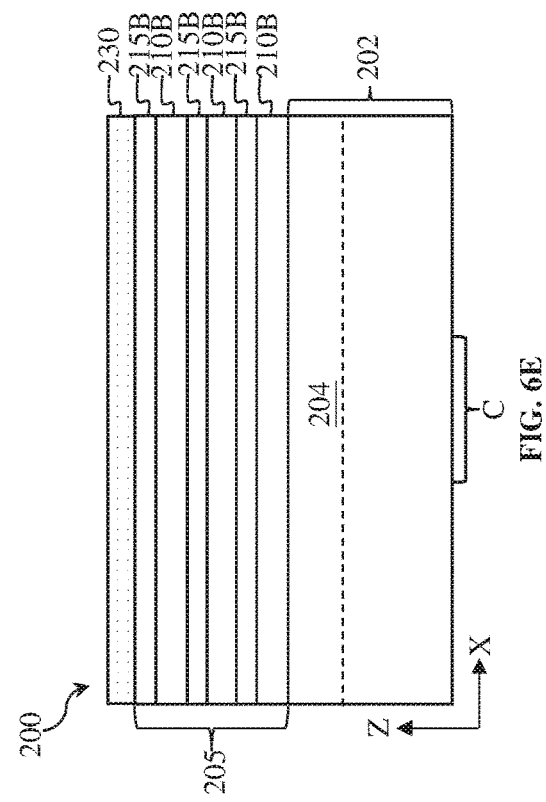

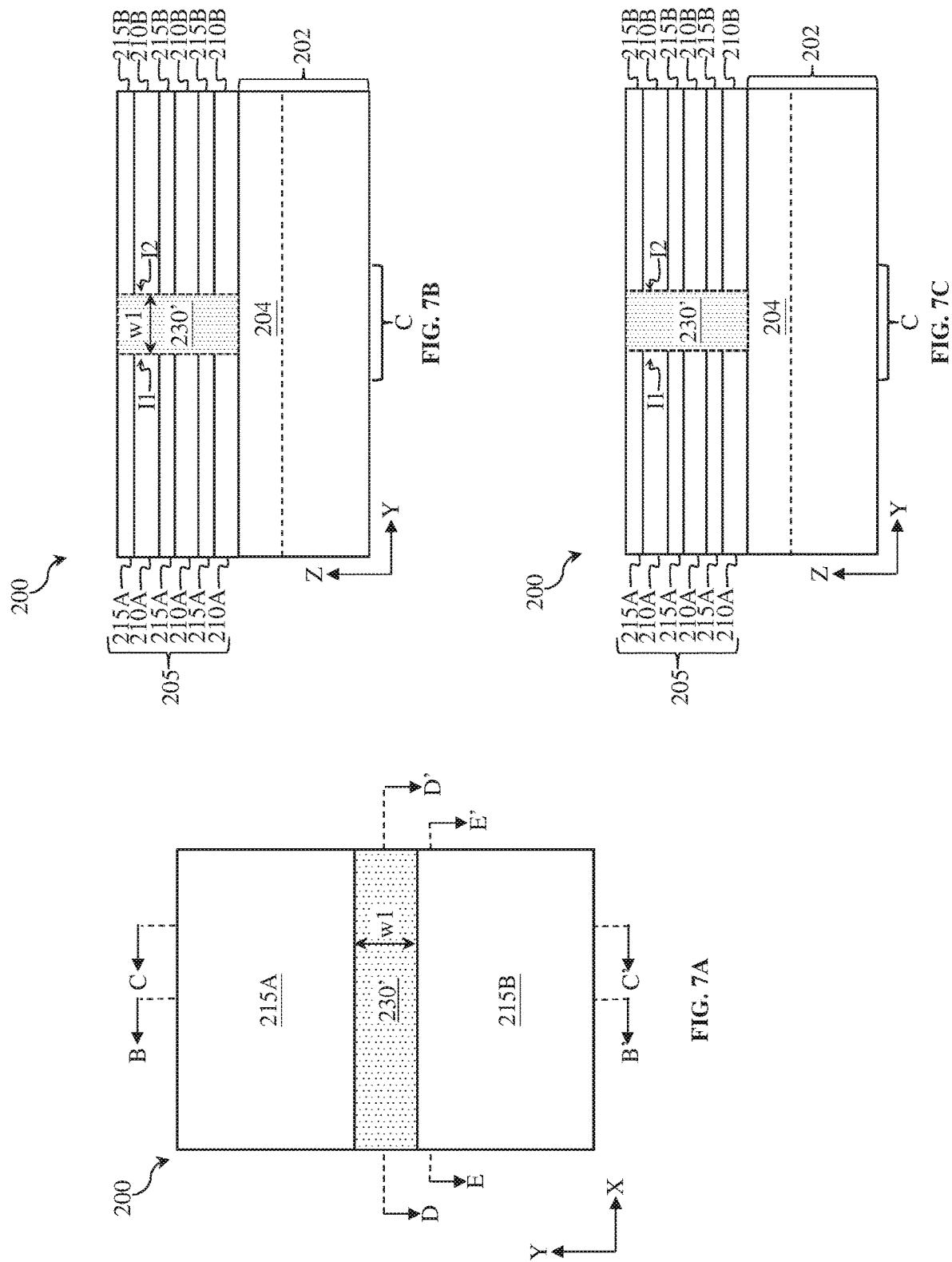

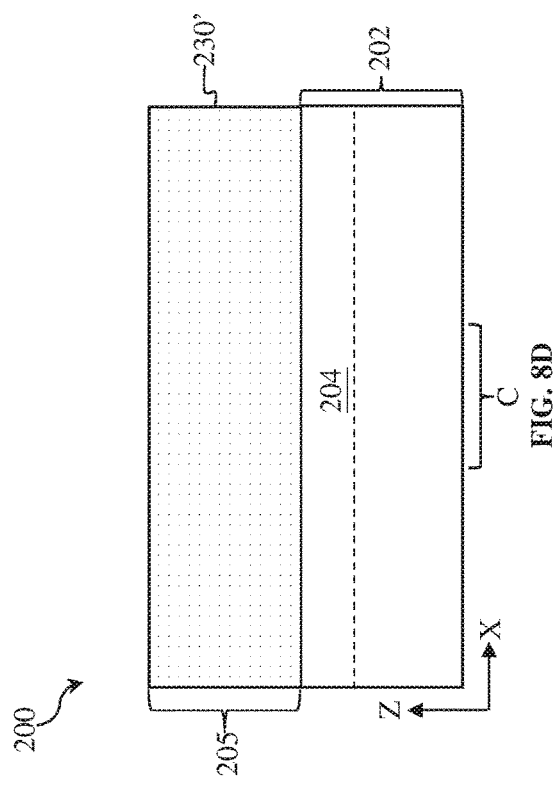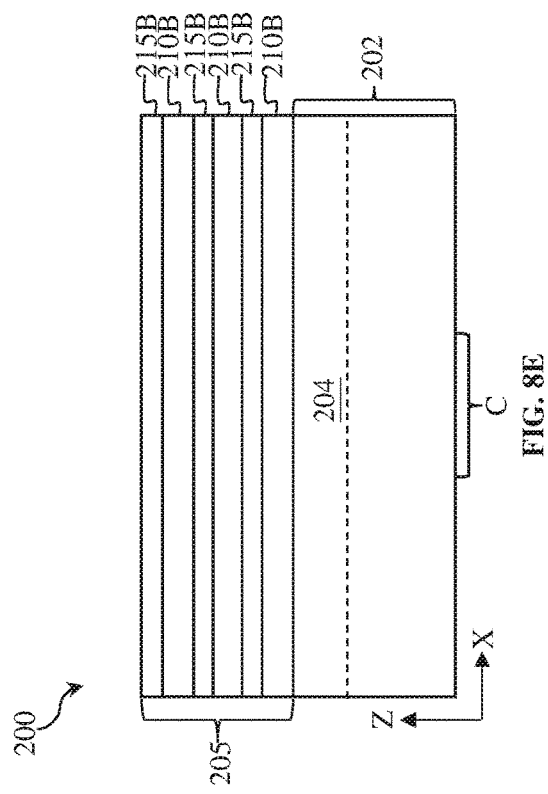

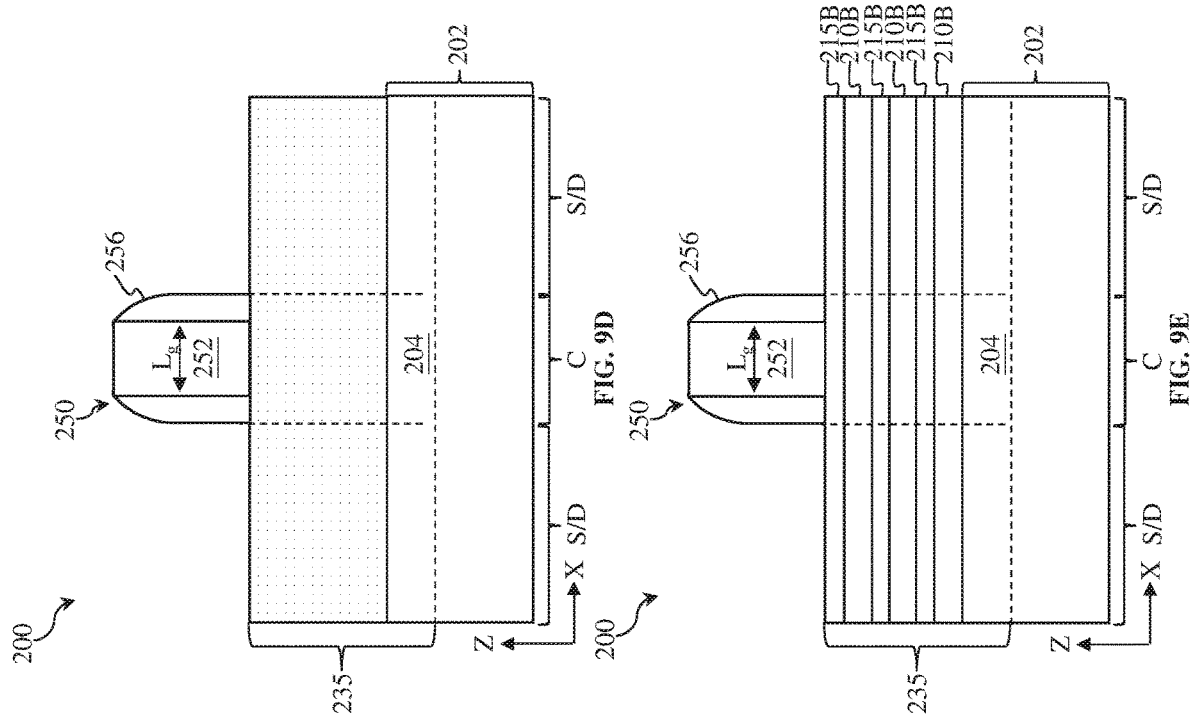

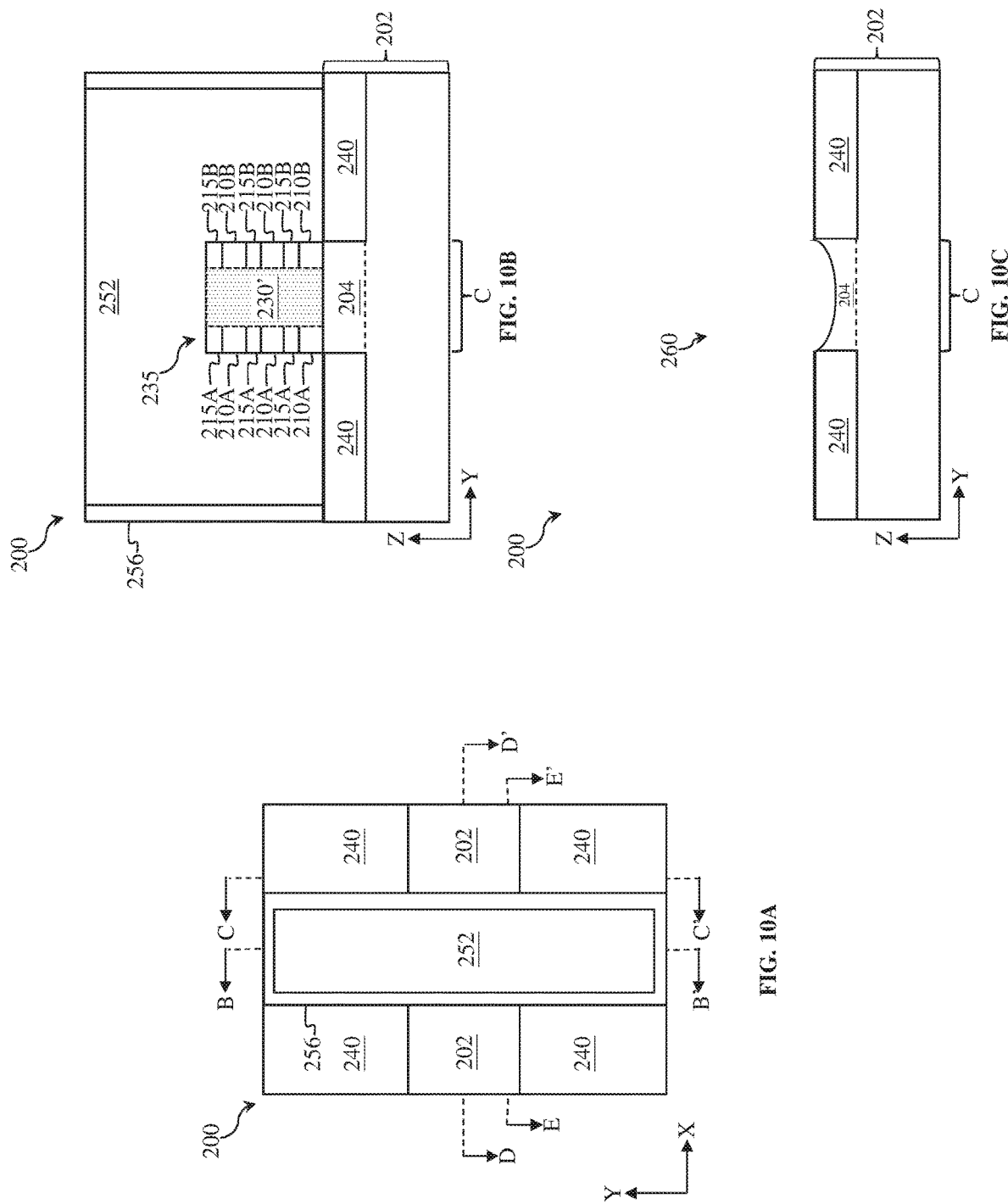

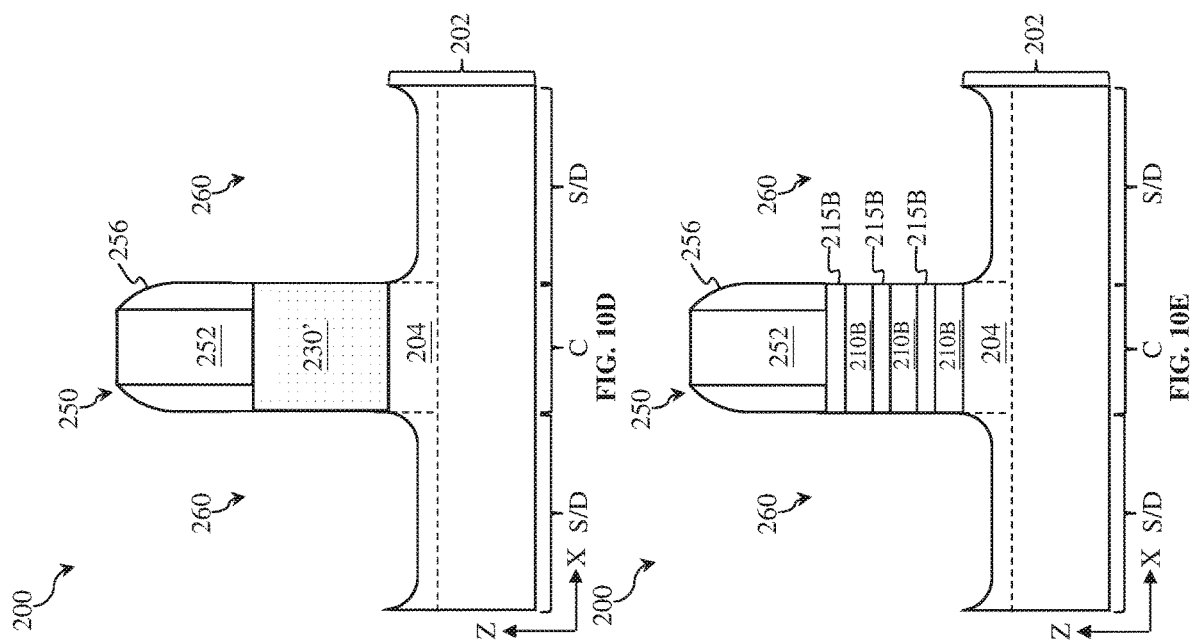

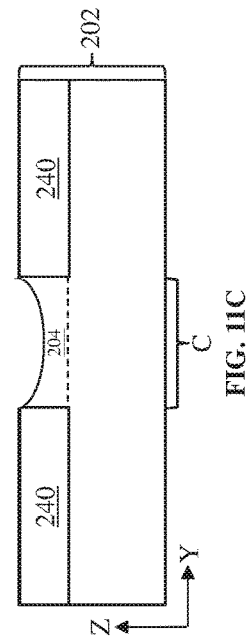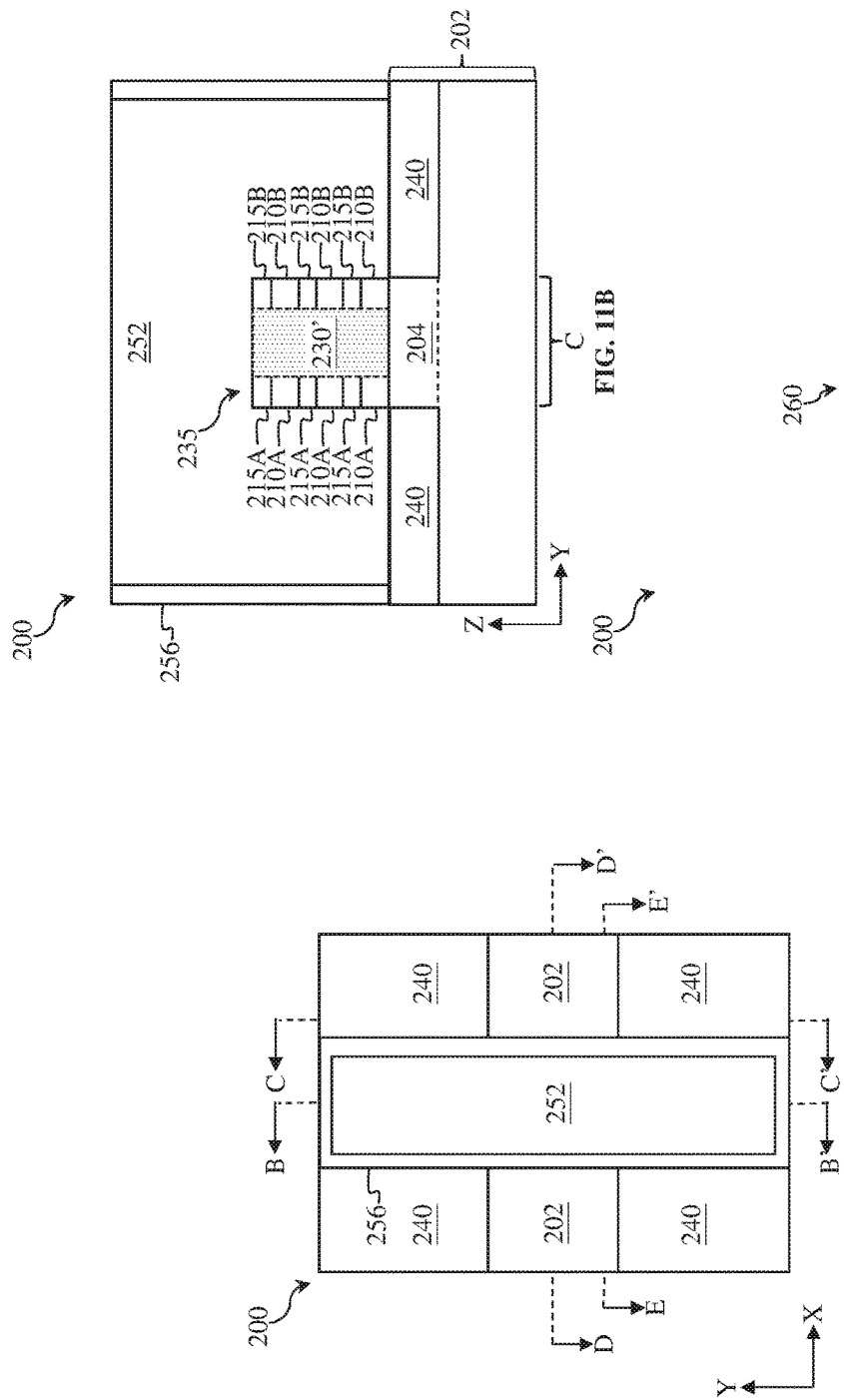

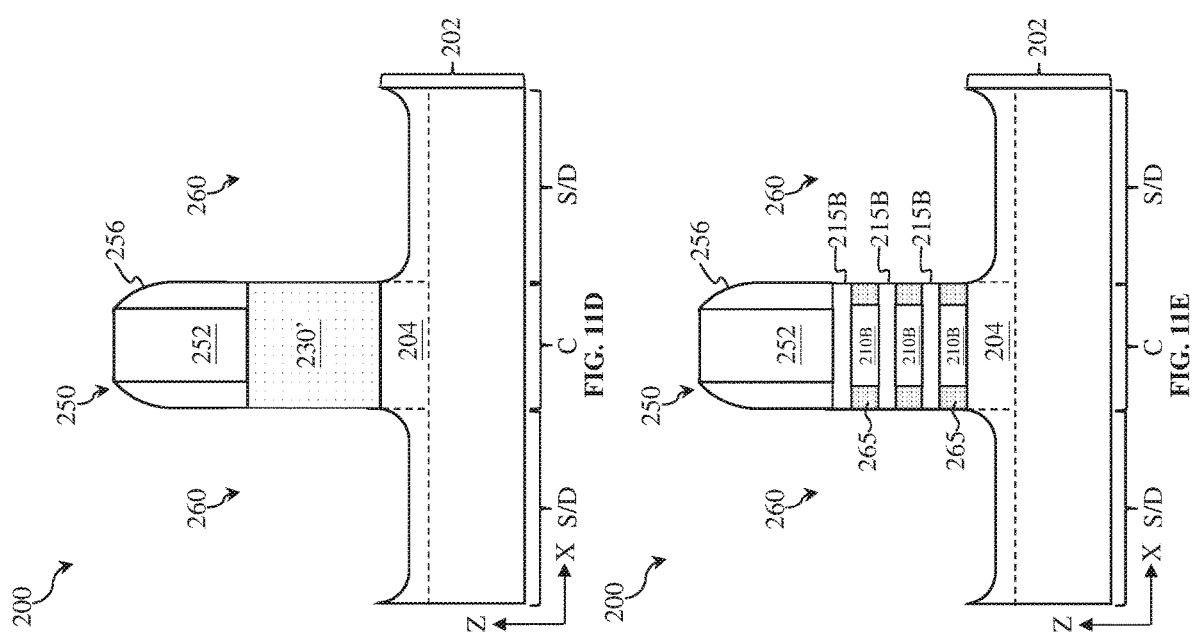

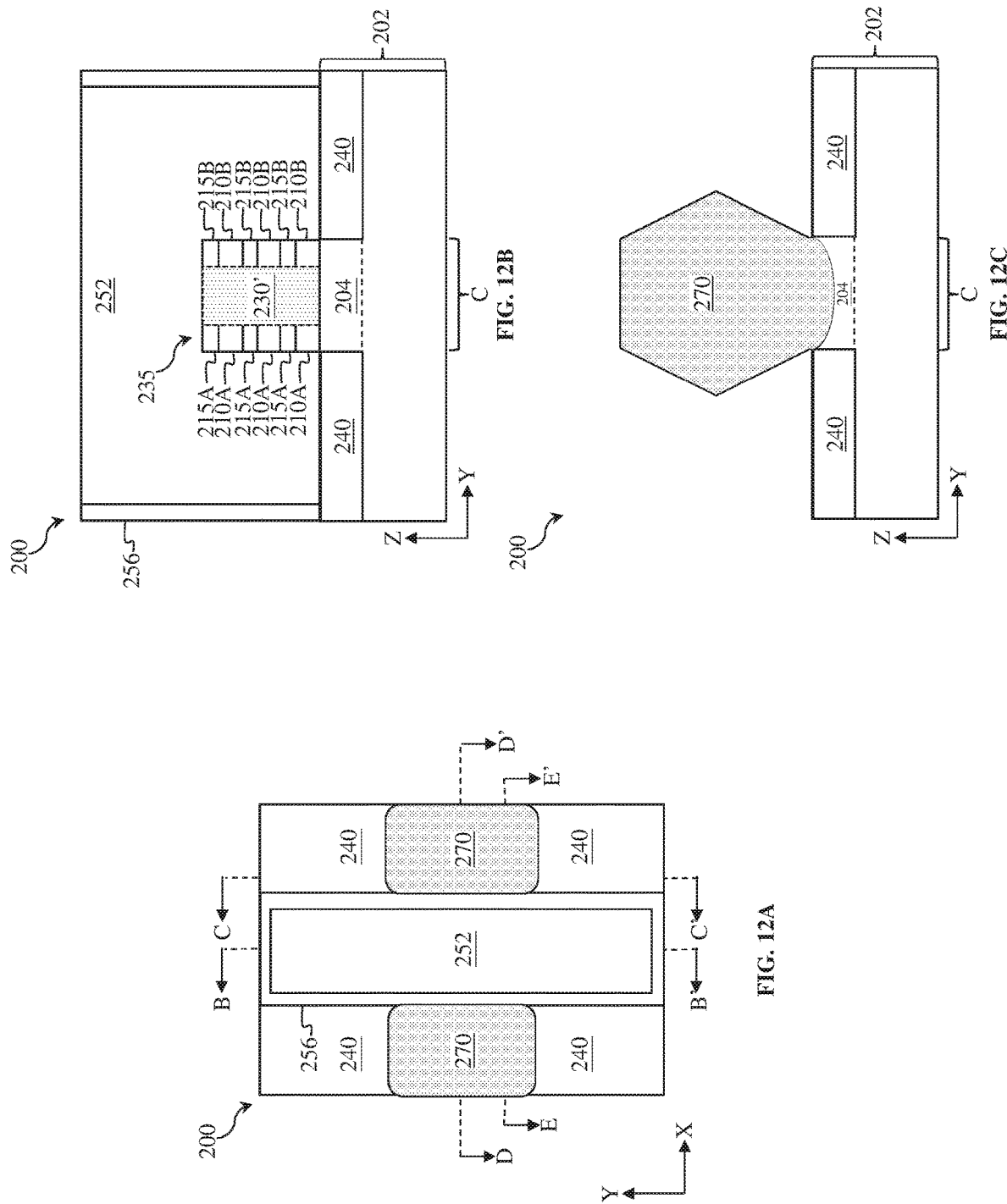

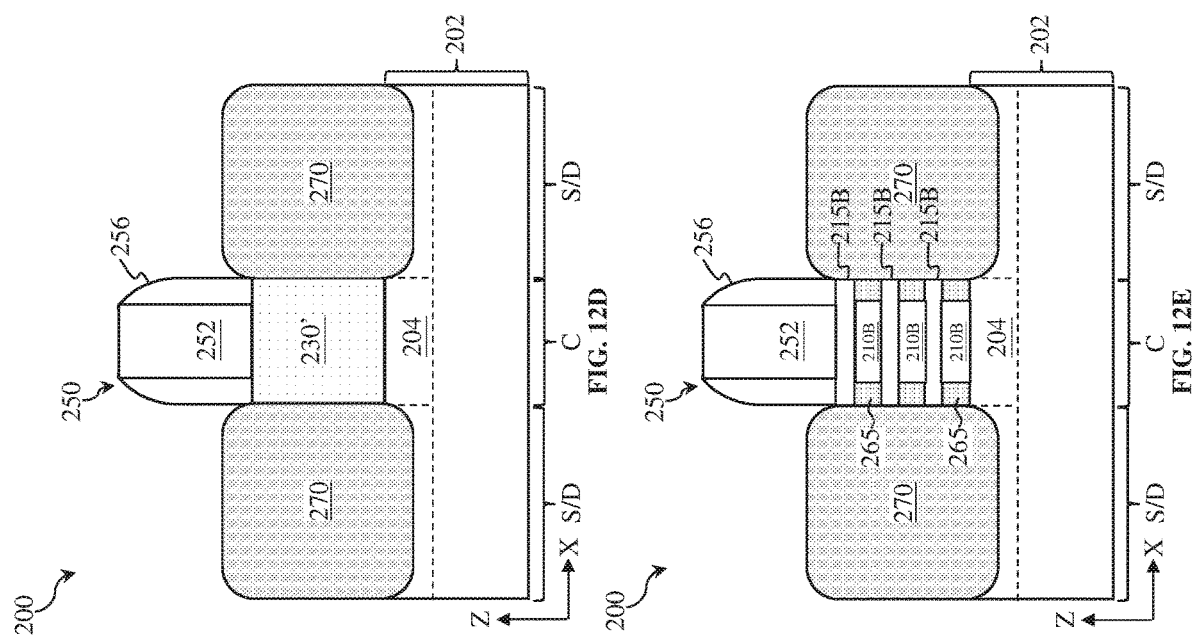

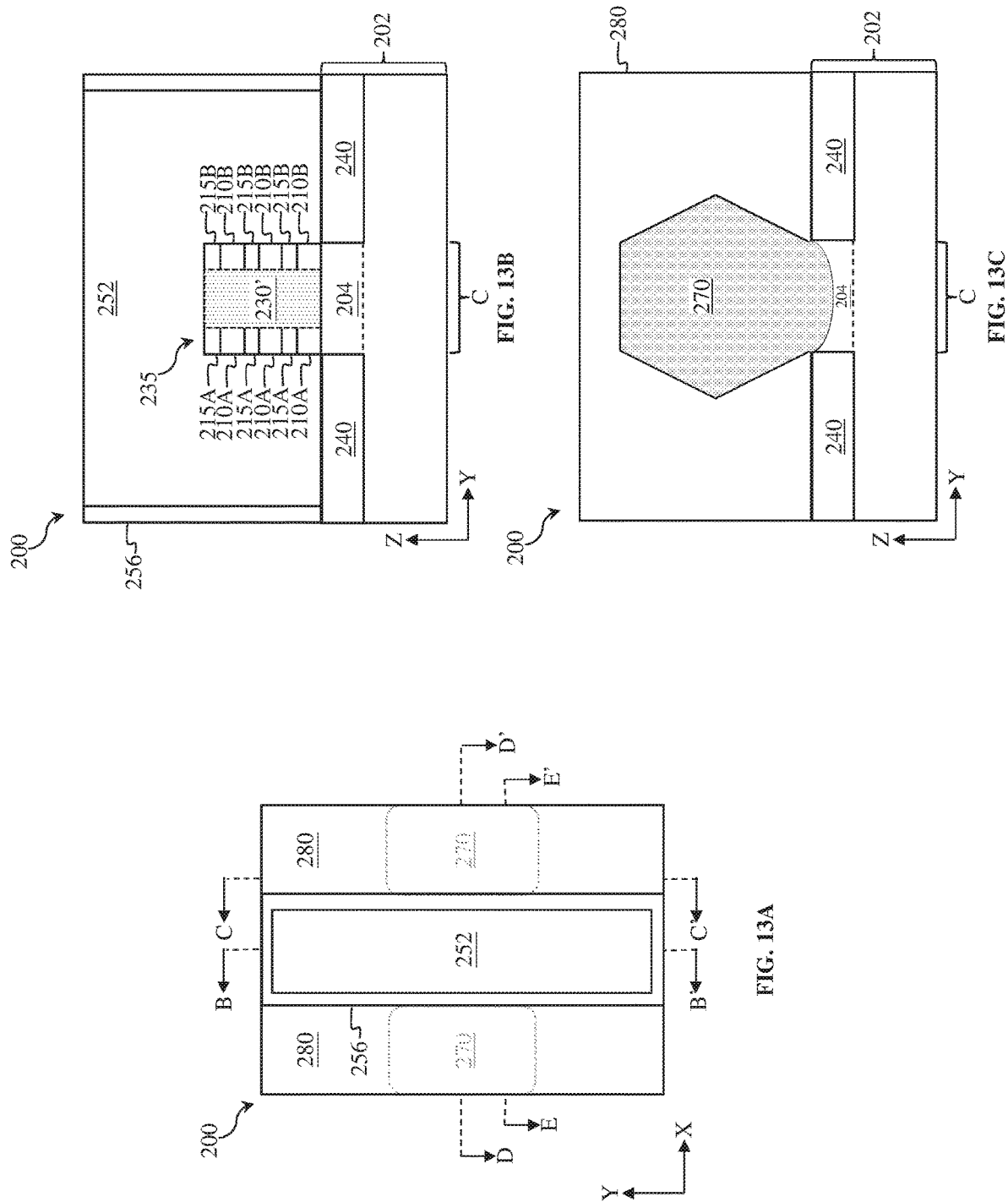

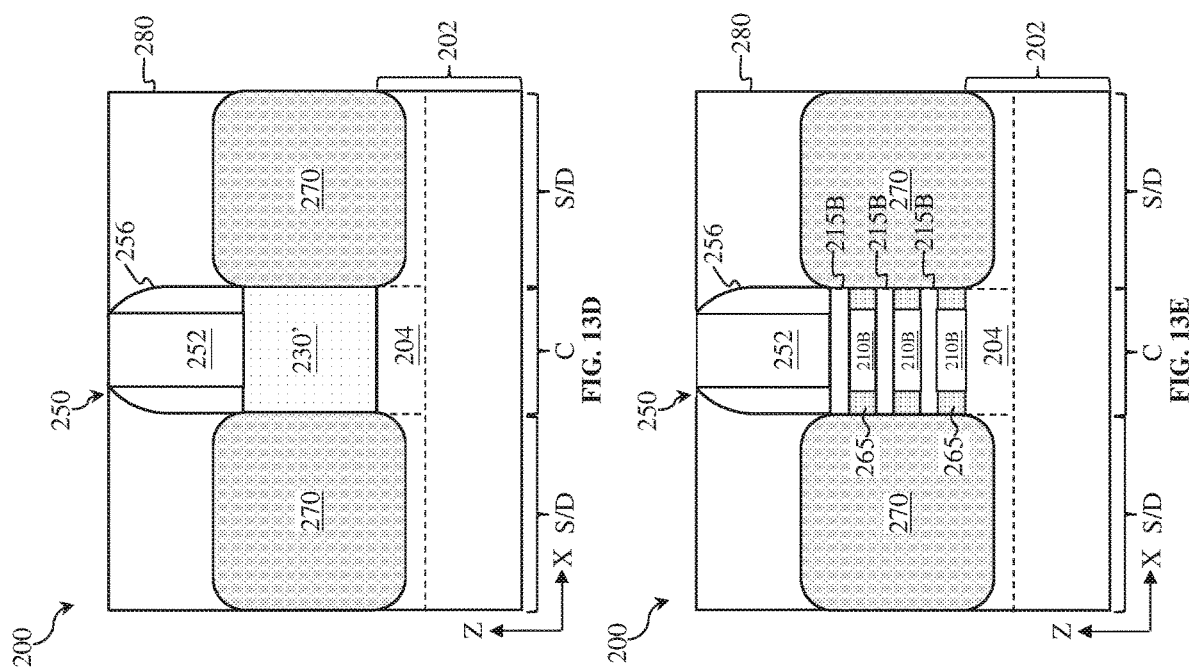

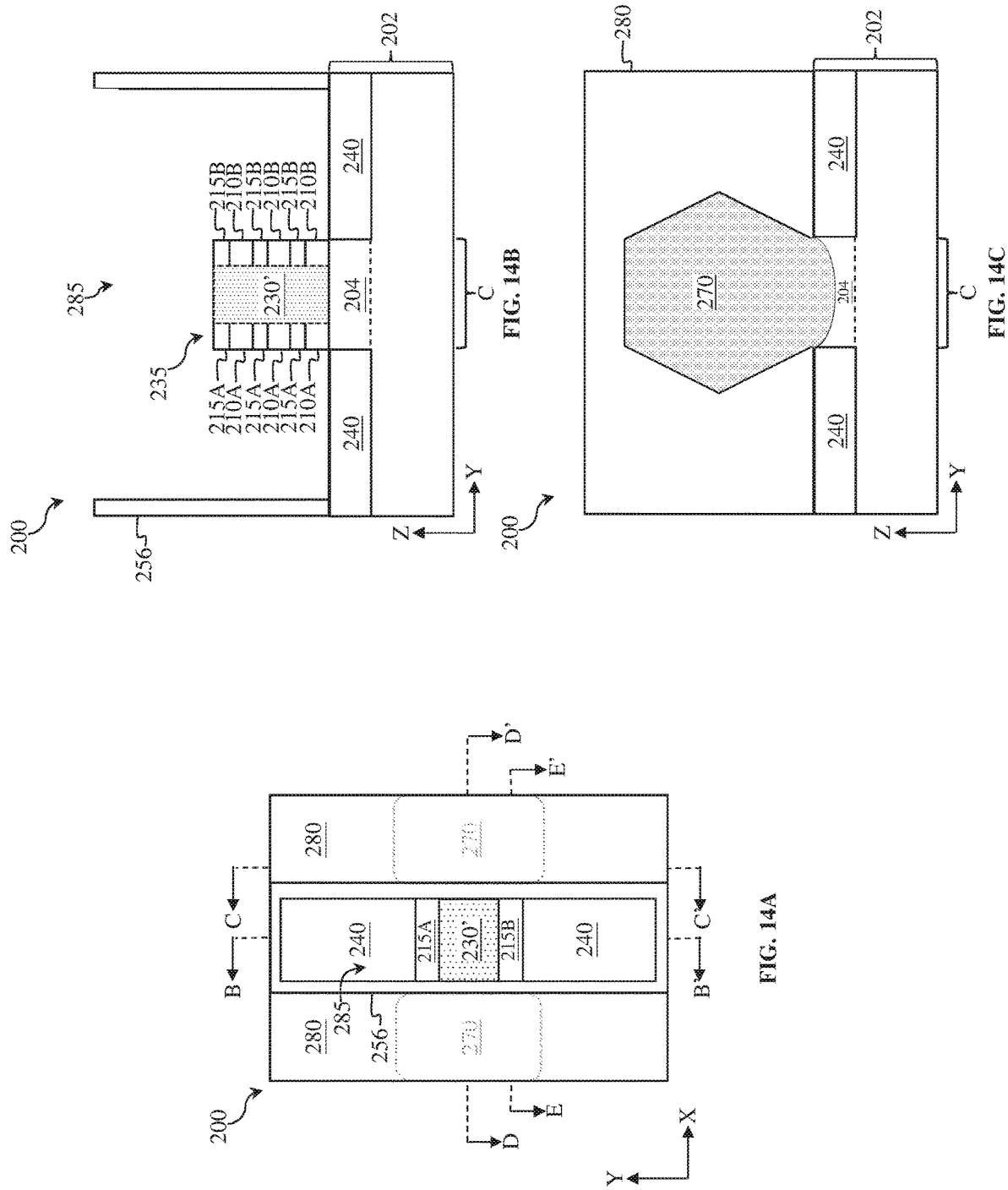

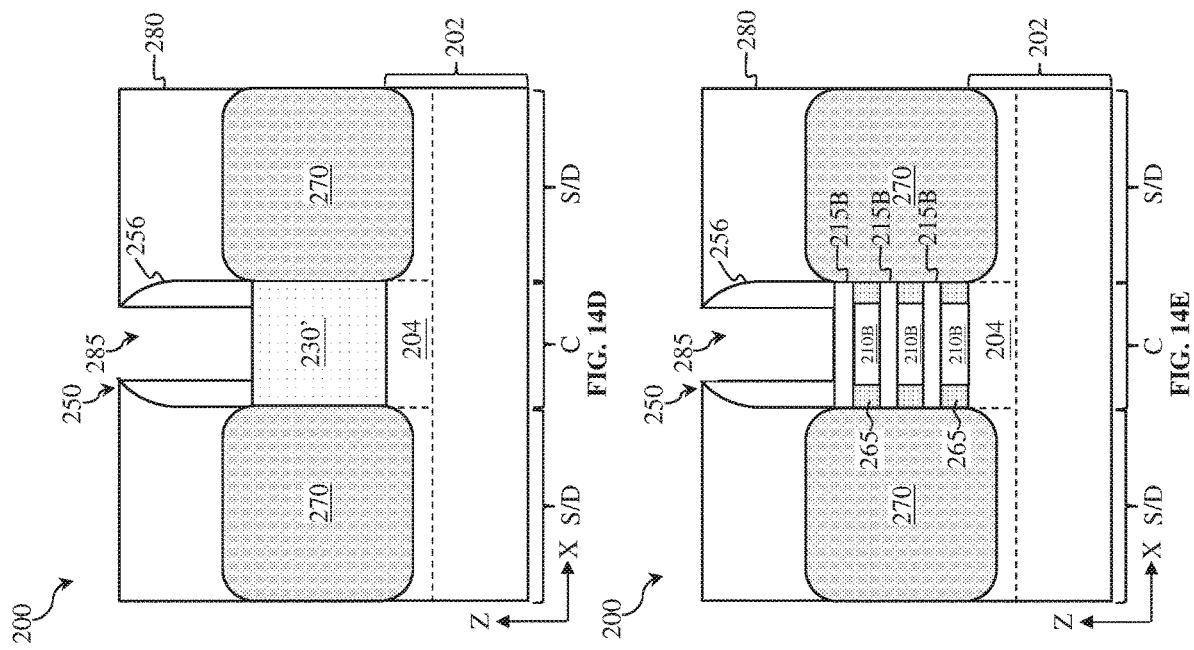

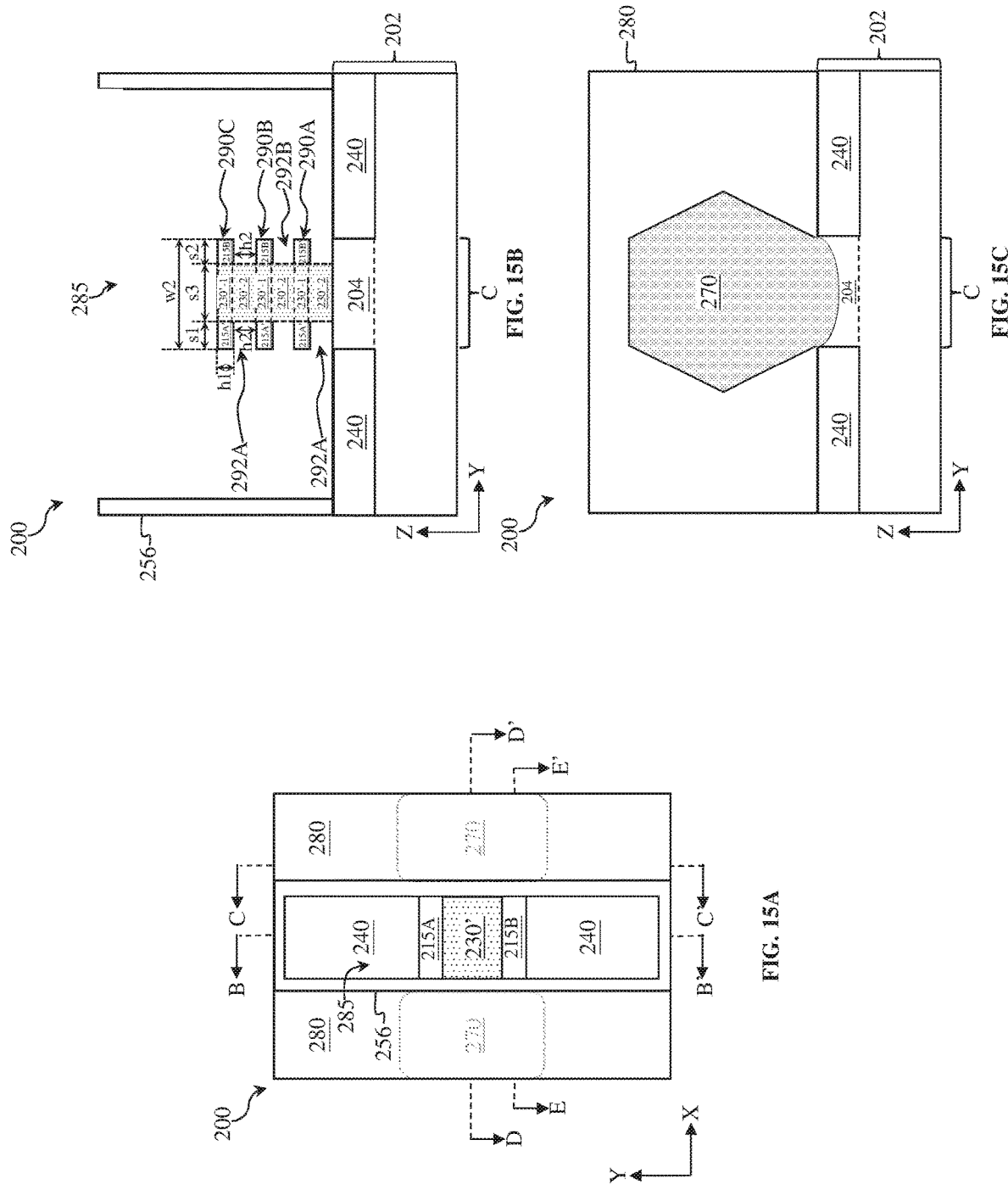

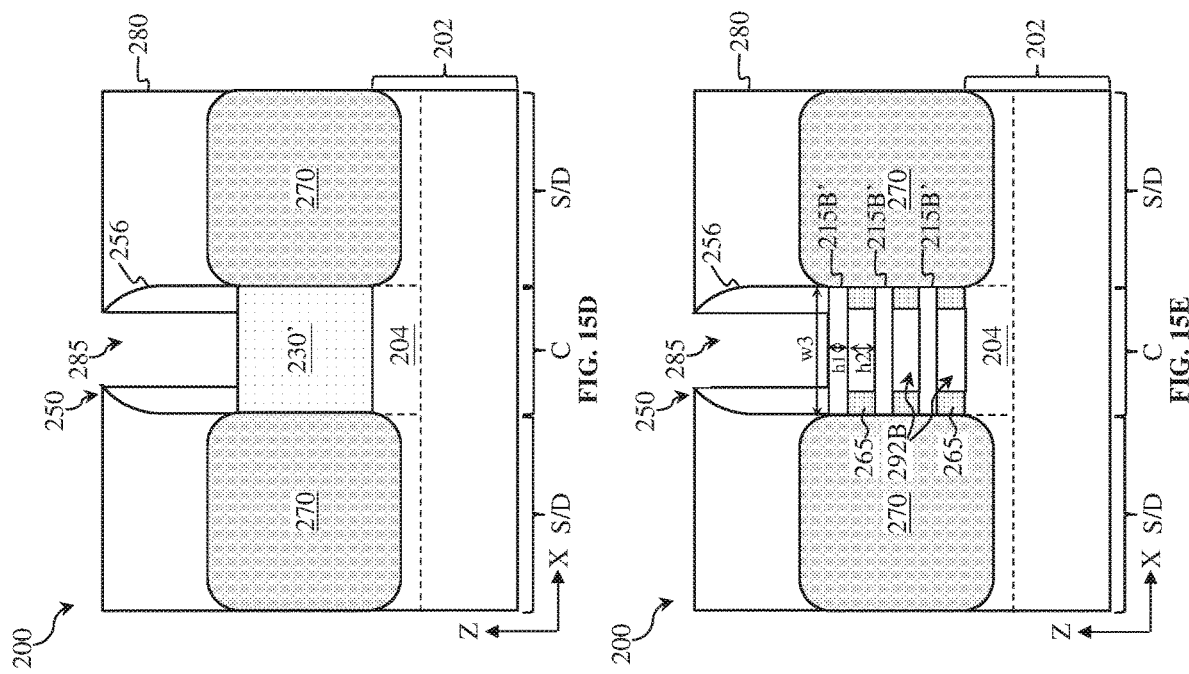

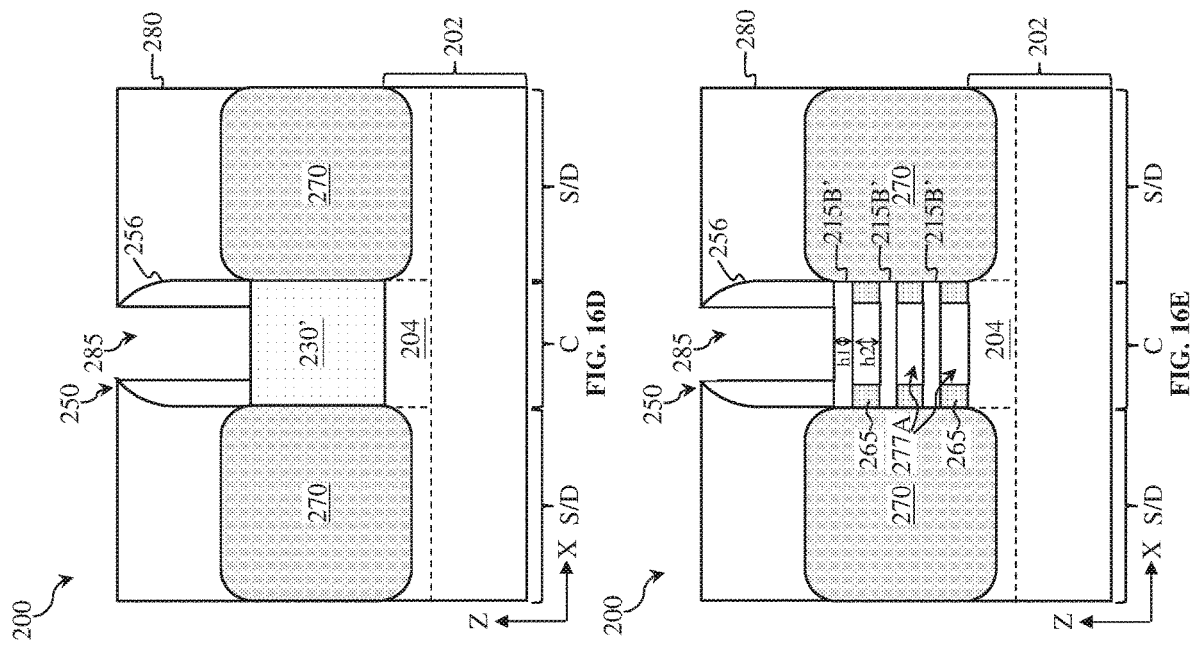

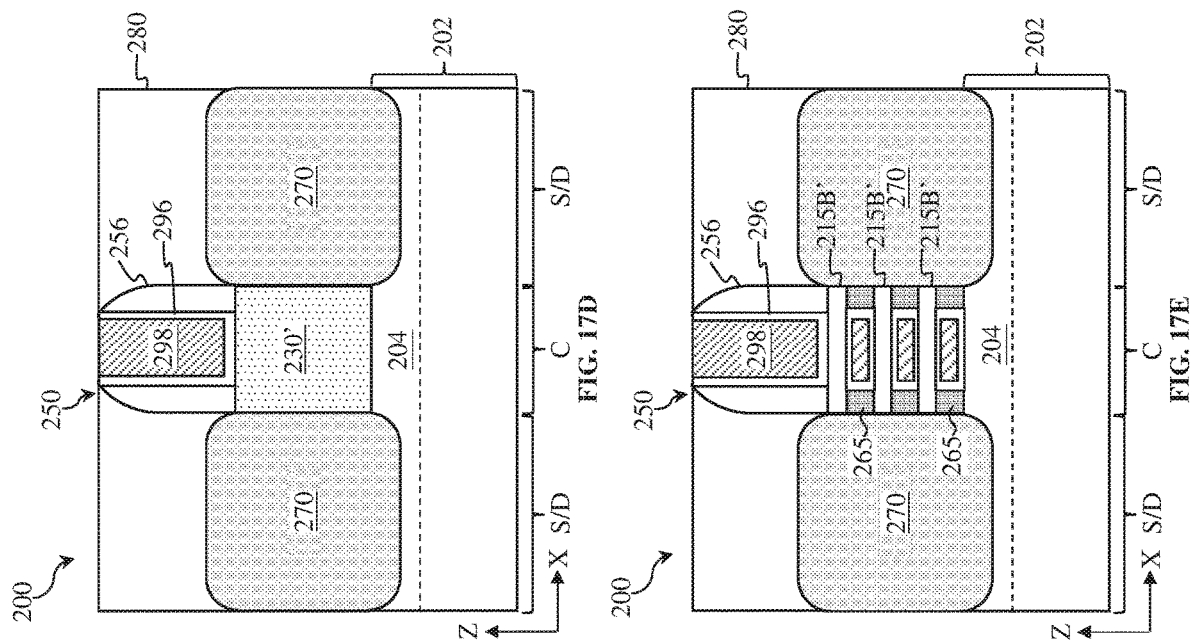

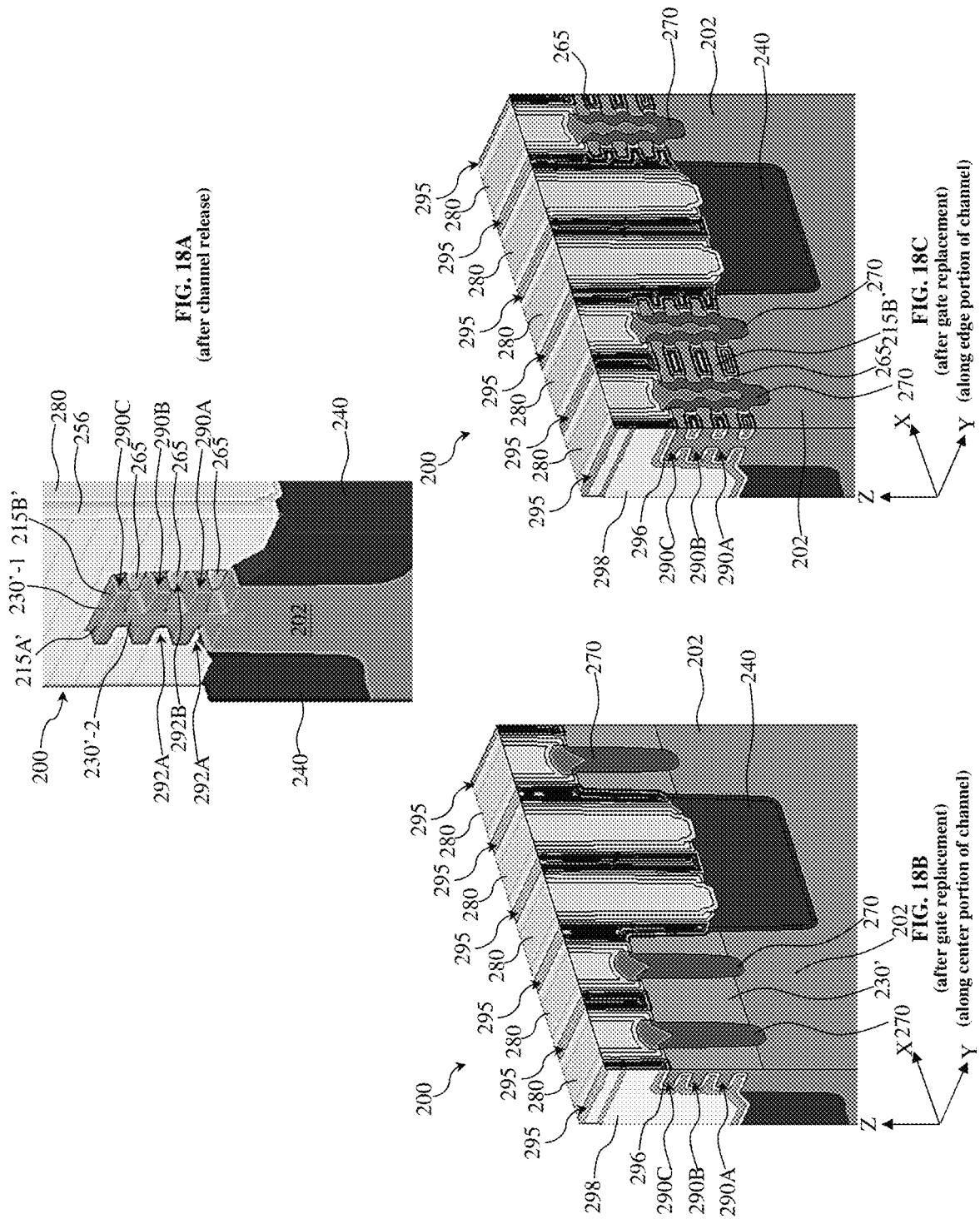

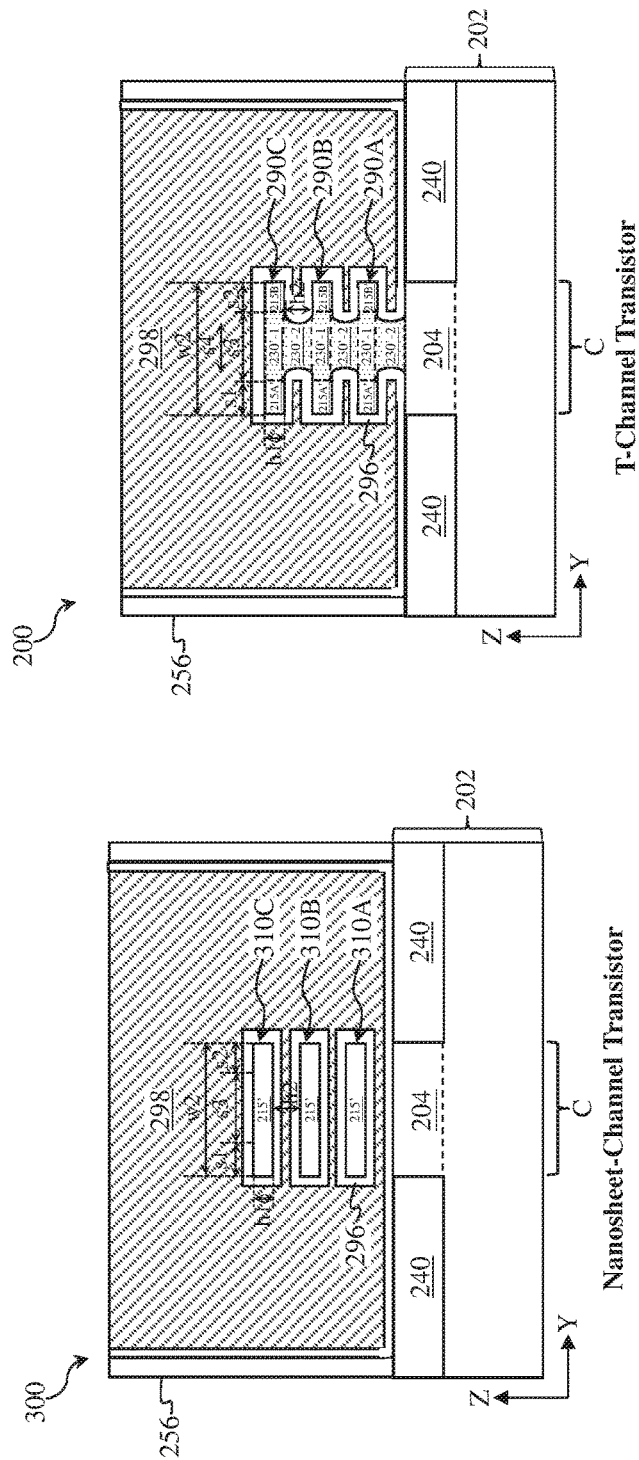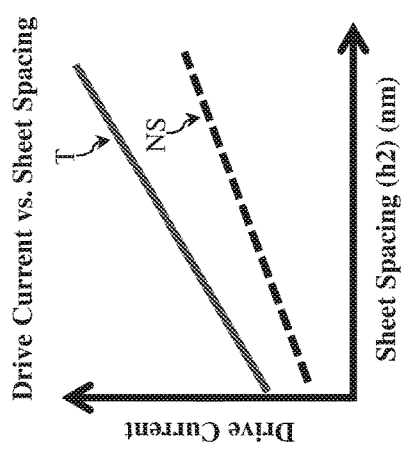
FIG. 20

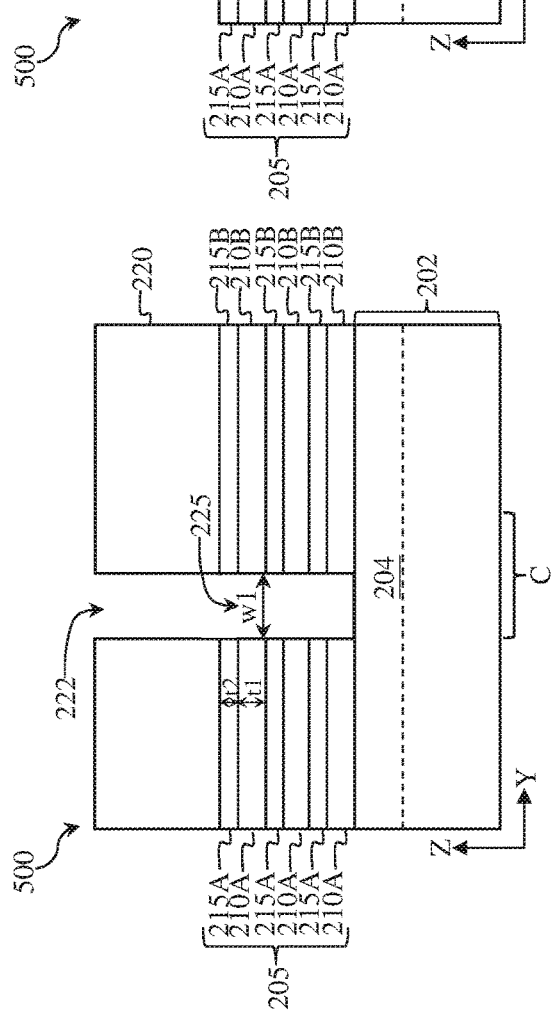
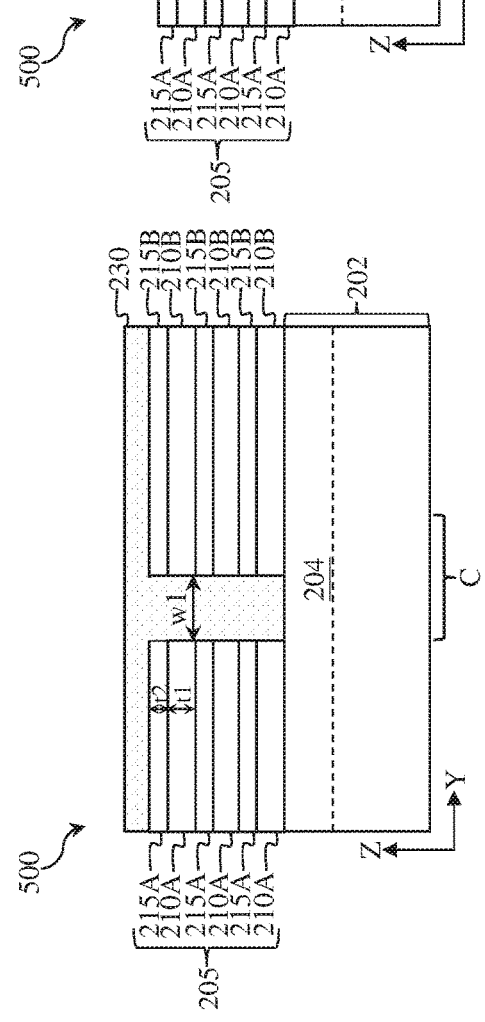
FIG. 22A
FIG. 22B
FIG. 22C
FIG. 22D

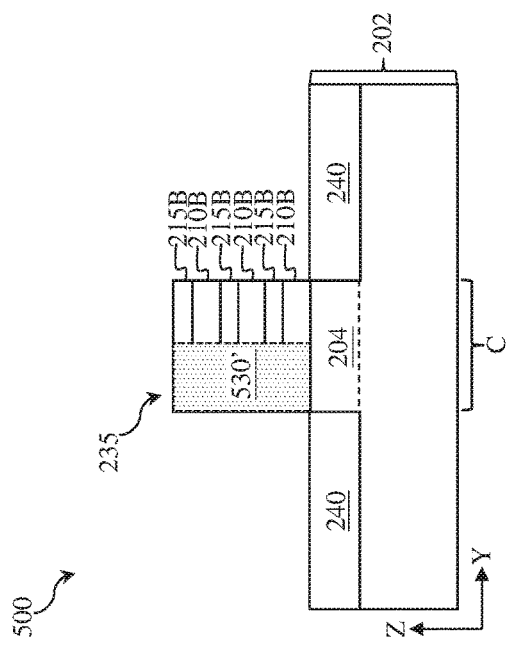
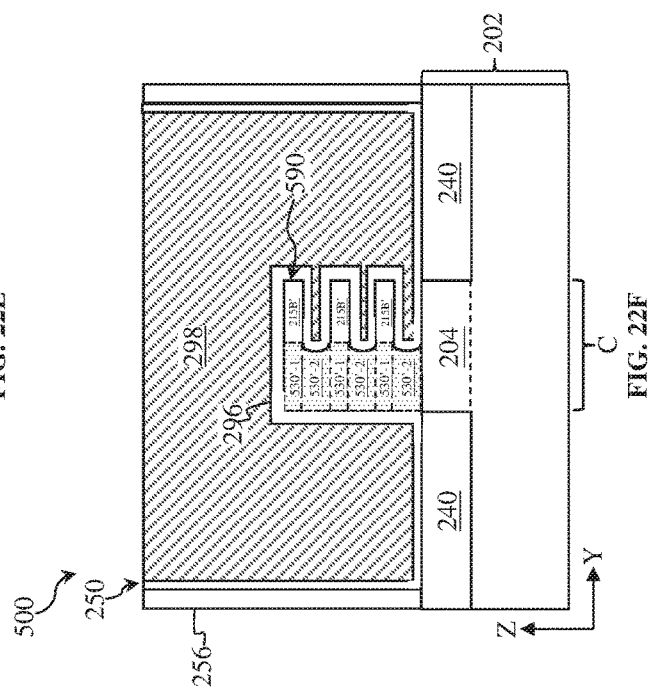
FIG. 22E
FIG. 22F

CHANNEL CONFIGURATIONS WITH STACKED SEGMENTS FOR GATE-ALL-AROUND BASED DEVICES AND METHODS OF FABRICATION THEREOF

This application is a continuation application of U.S. patent application Ser. No. 17/206,646, filed Mar. 19, 2021, which is a non-provisional application of and claims benefit of U.S. Provisional Patent Application Ser. No. 63/030,044, filed May 26, 2020, the entire disclosures of which are incorporated herein by reference.

BACKGROUND

The electronics industry has experienced an ever-increasing demand for smaller and faster electronic devices that are simultaneously able to support a greater number of increasingly complex and sophisticated functions. To meet these demands, there is a continuing trend in the integrated circuit (IC) industry to manufacture low-cost, high-performance, and low-power ICs. Thus far, these goals have been achieved in large part by reducing IC dimensions (for example, minimum IC feature size), thereby improving production efficiency and lowering associated costs. However, such scaling has also increased complexity of the IC manufacturing processes. Thus, realizing continued advances in IC devices and their performance requires similar advances in IC manufacturing processes and technology.

Recently, multigate devices have been introduced to improve gate control. Multigate devices have been observed to increase gate-channel coupling, reduce OFF-state current, and/or reduce short-channel effects (SCEs). One such multigate device is the gate-all around (GAA) device, which includes a gate structure that can extend, partially or fully, around a channel region to provide access to the channel region on at least two sides. GAA devices enable aggressive scaling down of IC technologies, maintaining gate control and mitigating SCEs, while seamlessly integrating with conventional IC manufacturing processes. However, challenges to increasing drive current of GAA devices have arisen as IC density continues to scale. Accordingly, although GAA devices and methods for fabricating have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 2A, FIG. 2B, FIG. 2C, FIG. 2D, FIG. 2E, FIG. 3A, FIG. 3B, FIG. 3C, FIG. 3D, FIG. 3E, FIG. 4A, FIG. 4B, FIG. 4C, FIG. 4D, FIG. 4E, FIG. 5A, FIG. 5B, FIG. 5C, FIG. 5D, FIG. 5E, FIG. 6A, FIG. 6B, FIG. 6C, FIG. 6D, FIG. 6E, FIG. 7A, FIG. 7B, FIG. 7C, FIG. 7D, FIG. 7E, FIG. 8A, FIG. 8B, FIG. 8C, FIG. 8D, FIG. 8E, FIG. 9A, FIG. 9B, FIG. 9C, FIG. 9D, FIG. 9E, FIG. 10A, FIG. 10B, FIG. 10C, FIG. 10D, FIG. 10E, FIG. 11A, FIG. 11B, FIG. 11C, FIG. 11D, FIG. 11E, FIG. 12A, FIG. 12B, FIG. 12C, FIG. 12D, FIG. 12E, FIG. 13A, FIG. 13B, FIG. 13C, FIG. 13D, FIG. 13E, FIG. 14A, FIG. 14B, FIG. 14C, FIG. 14D, FIG. 14E, FIG. 15A, FIG. 15B, FIG. 15C, FIG. 15D, FIG. 15E, FIG. 16A, FIG. 16B, FIG. 16C, FIG. 16D, FIG. 16E, FIG. 17A, FIG. 17B, FIG. 17C, FIG. 17D, and FIG. 17E are fragmentary diagrammatic views of a multigate device, in portion or entirety, at various fabrication stages (such as those associated with the method in FIG. 1) according to various aspects of the present disclosure.

FIG. 18A, FIG. 18B, FIG. 18C are three-dimensional perspective views of the multigate device, in portion or entirety, at stages of fabrication associated with FIGS. 15A-15E (FIG. 18A) or FIGS. 17A-17E (FIG. 18B and FIG. 18C) according to various aspects of the present disclosure.

FIG. 20 provides cross-sectional views of two different multigate devices, one of which is fabricated according to the method of FIG. 1, and a plot of drive current as a function of sheet spacing the according to various aspects of the present disclosure.

FIG. 22A, FIG. 22B, FIG. 22C, FIG. 22D, FIG. 22E, and FIG. 22F are fragmentary cross-sectional views of another multigate device, in portion or entirety, at various fabrication stages (such as those associated with the method in FIG. 1) according to various aspects of the present disclosure.

DETAILED DESCRIPTION

Figure 1:
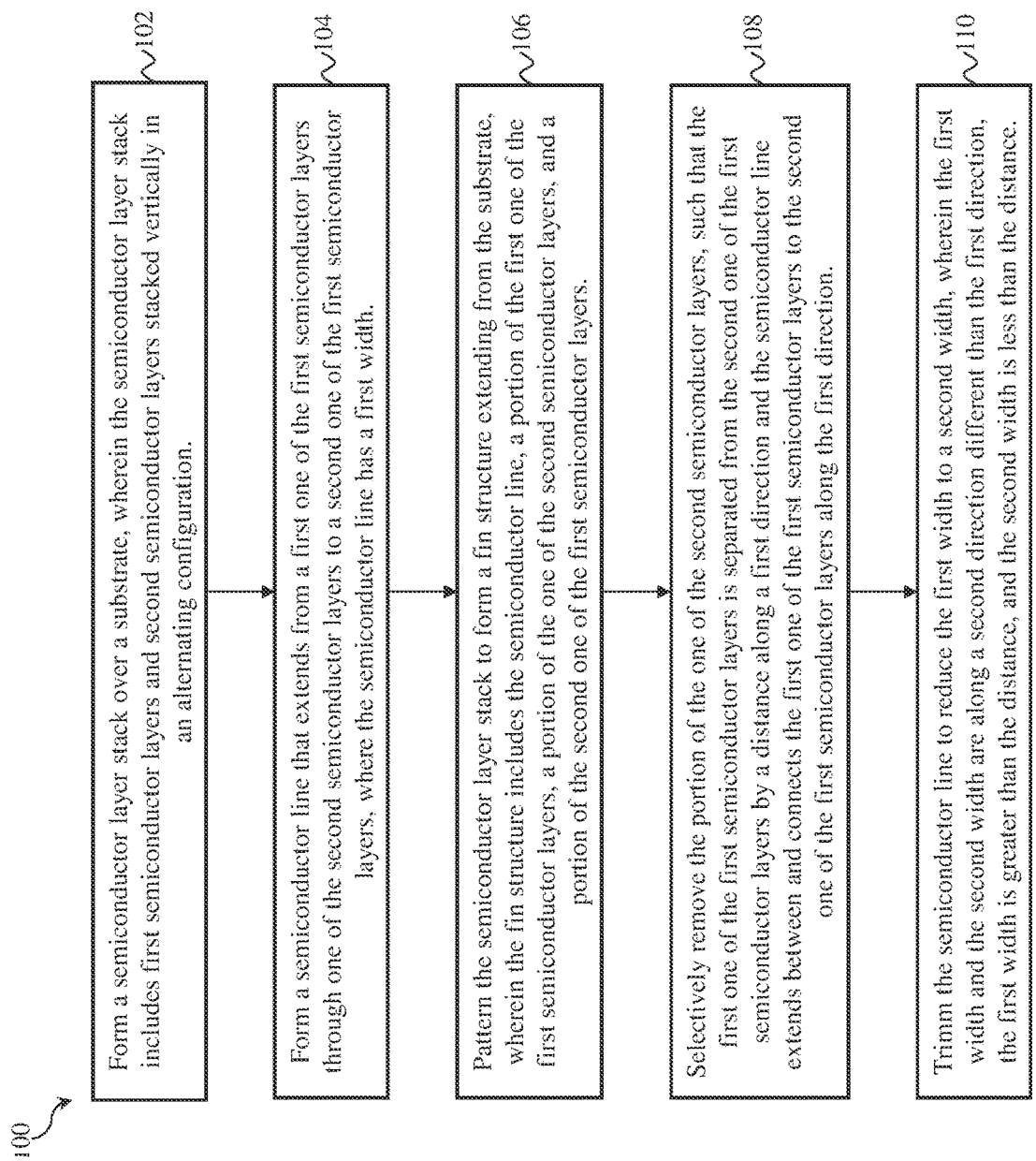
FIG. 1 is a flow chart of a method for fabricating a multigate device according to various aspects of the present disclosure.
Figure 2B:
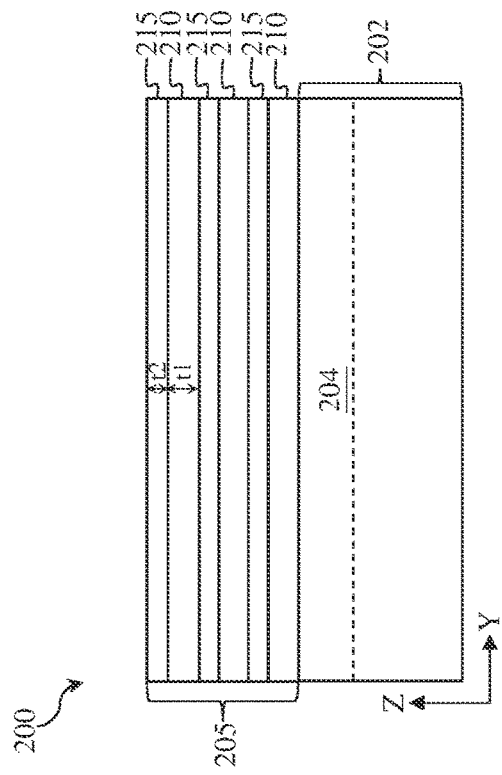
Figure 2C:
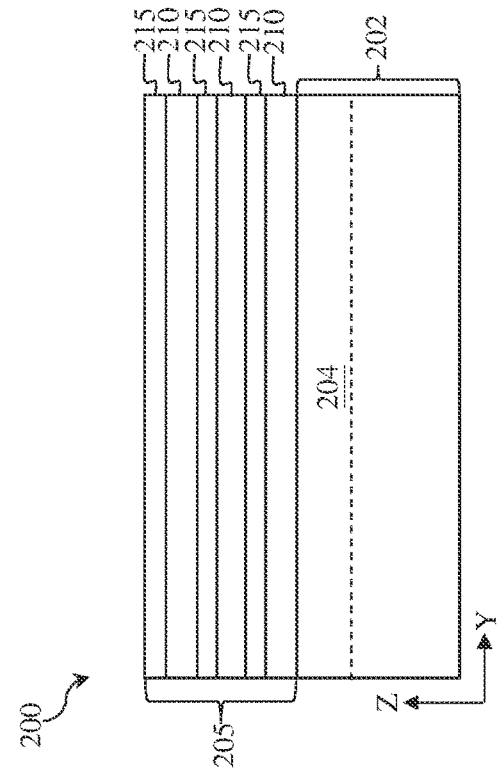
Figure 2A:
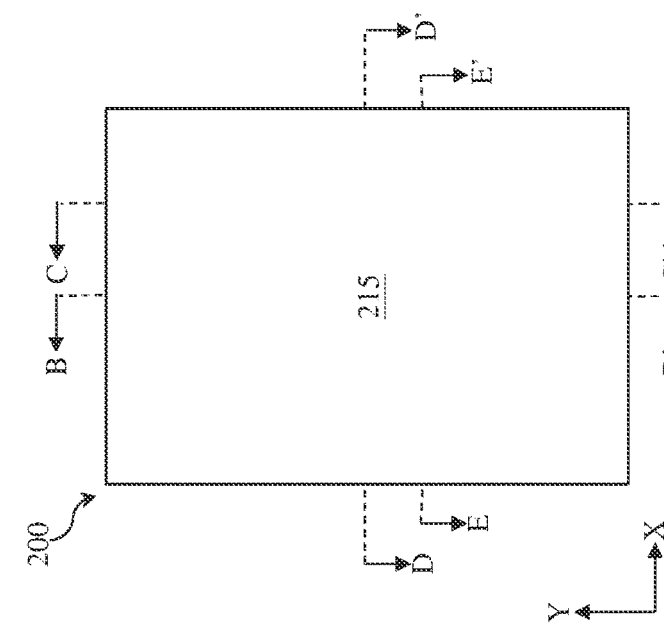
Figure 6B:
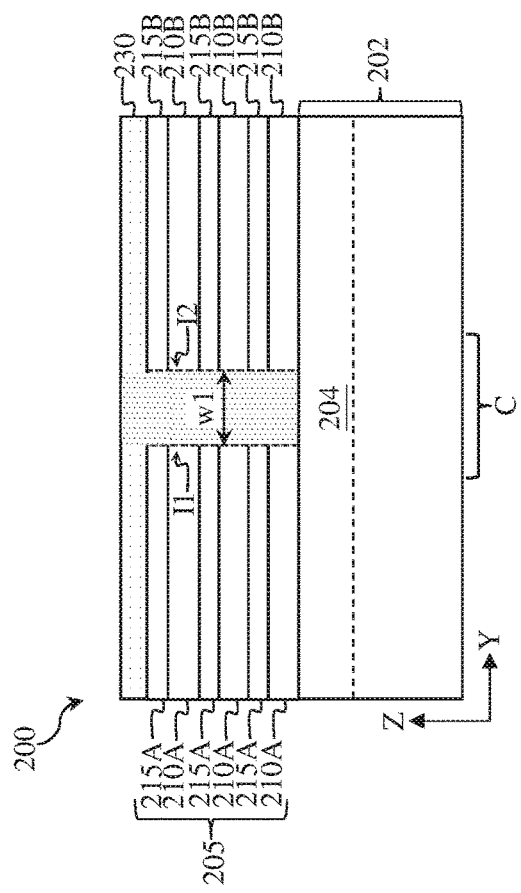
Figure 6C:
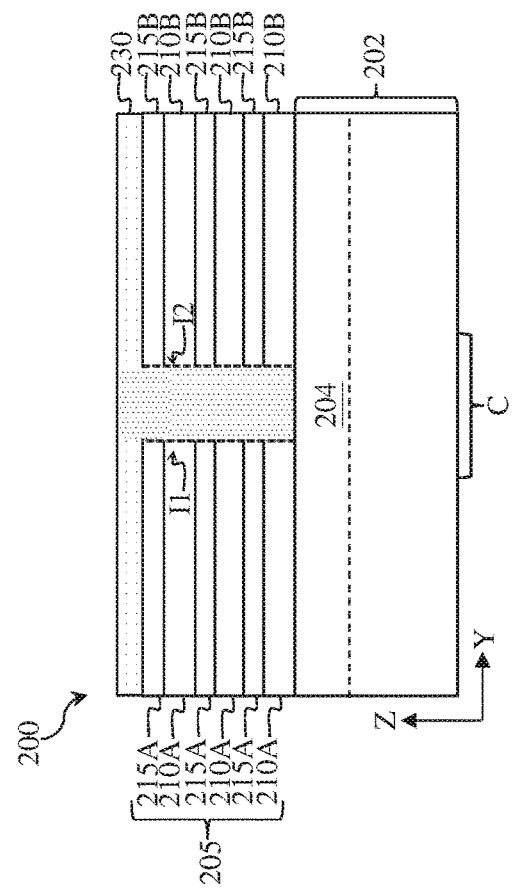
Figure 6A:
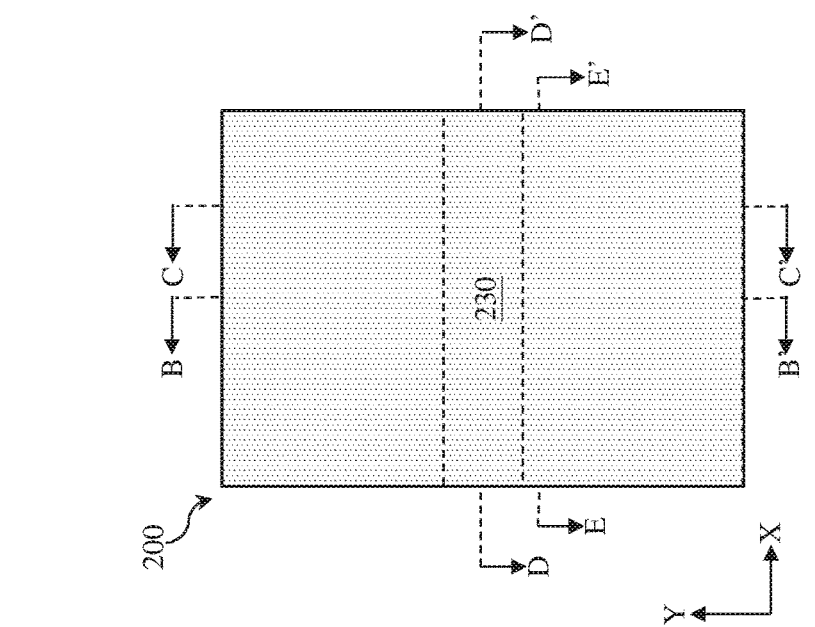
Figure 7D:
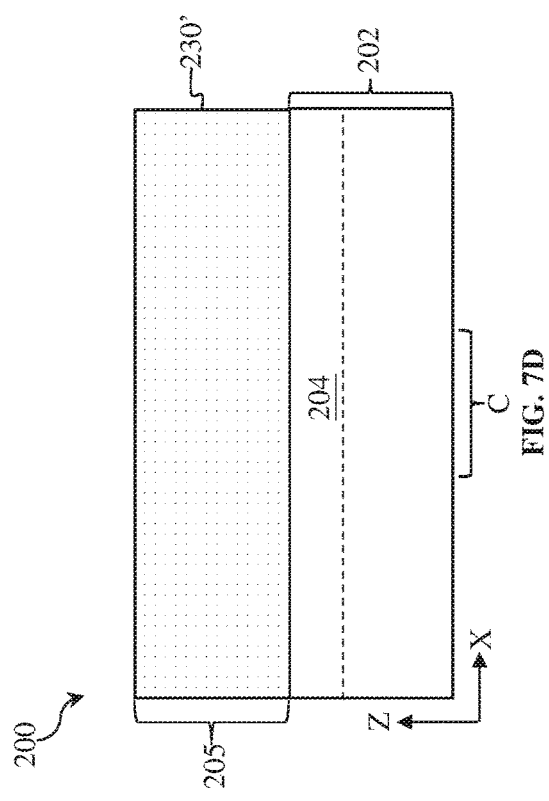
Figure 7E:
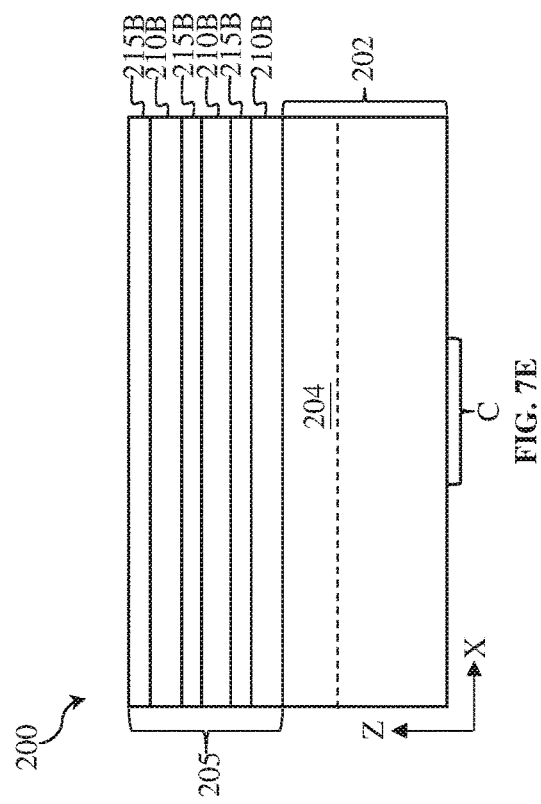
Figure 8B:
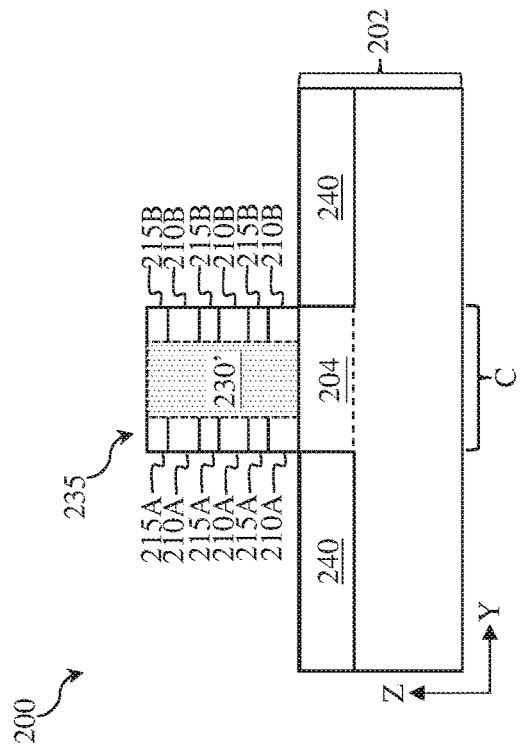
Figure 8C:
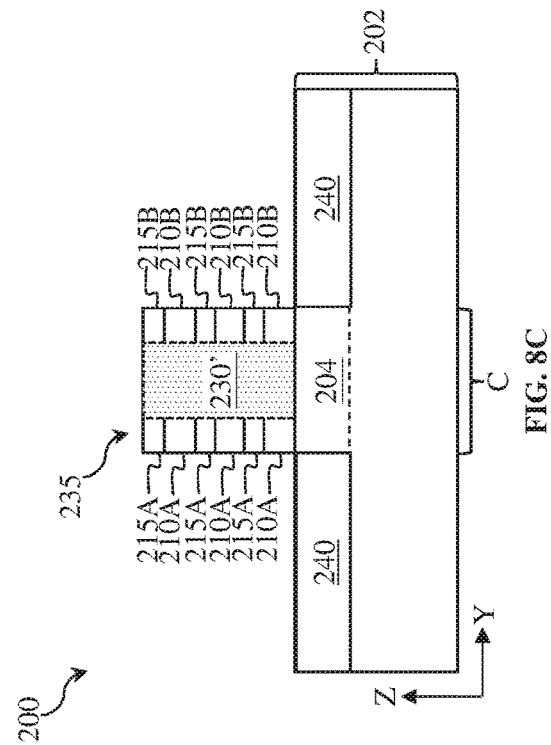
Figure 8A:
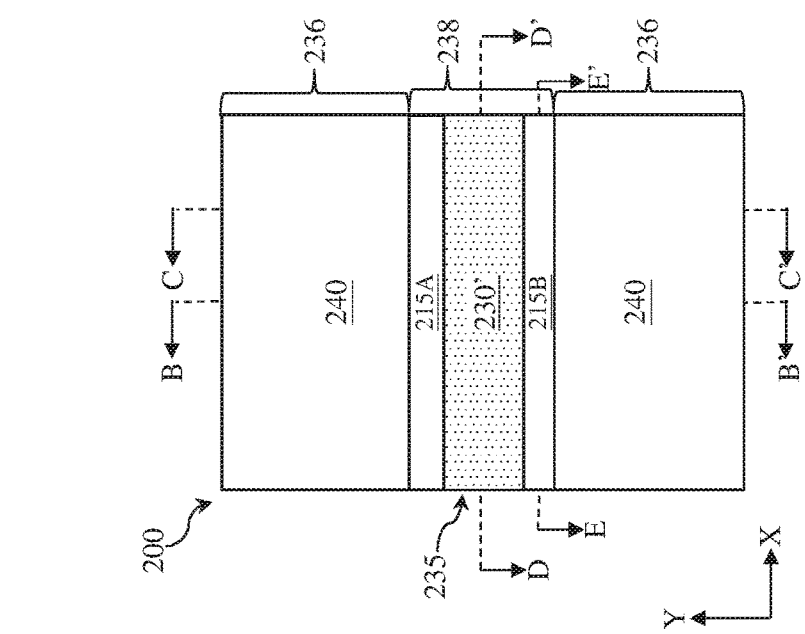
Figures 9A, 9B, 9C:
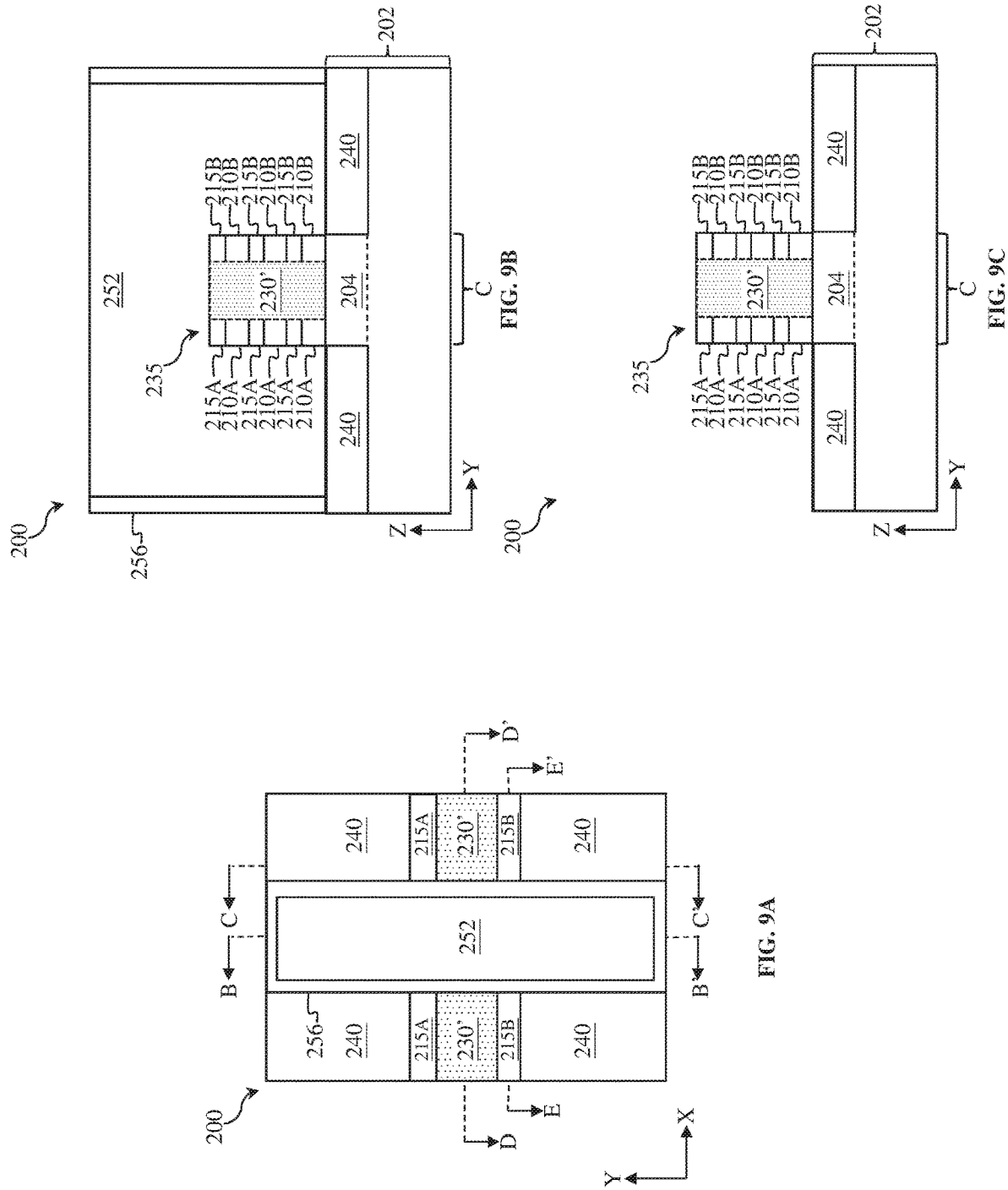
Figures 16A, 16B, 16C:
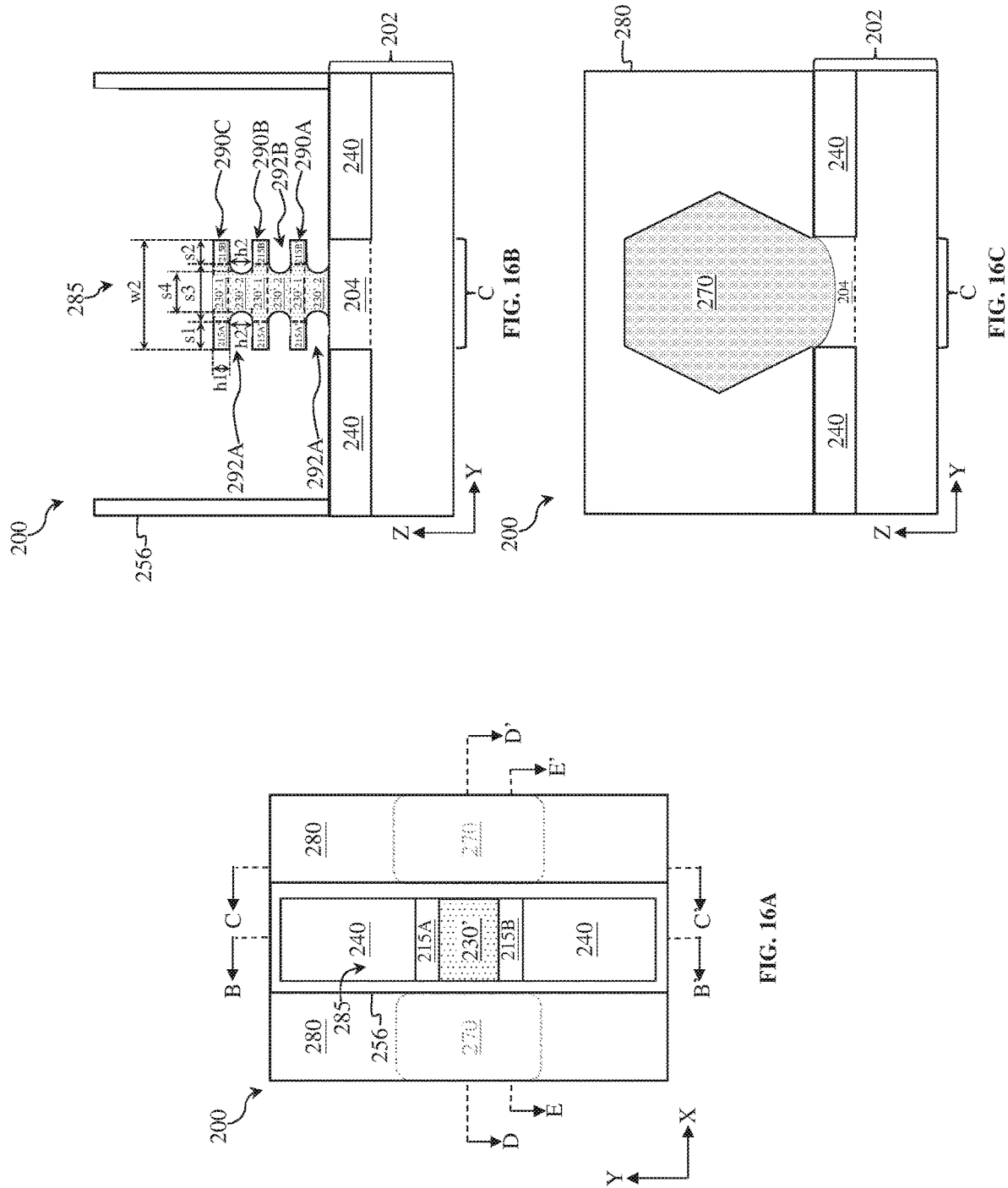
Figure 17B:
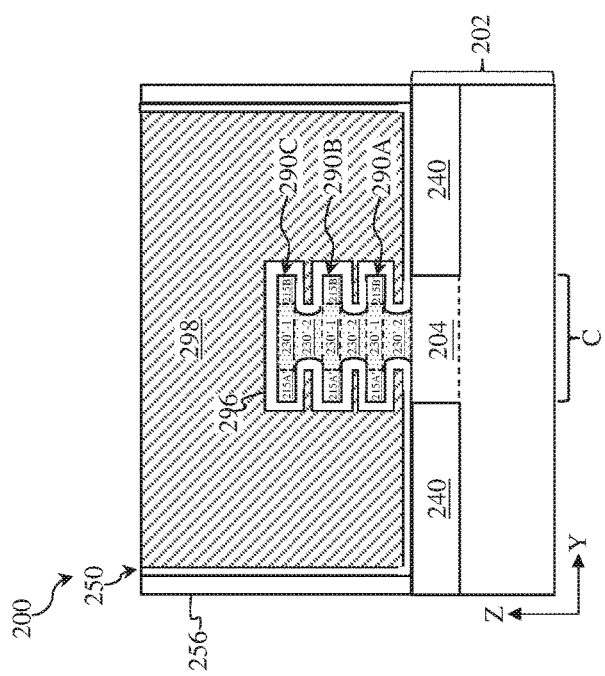
Figure 17C:
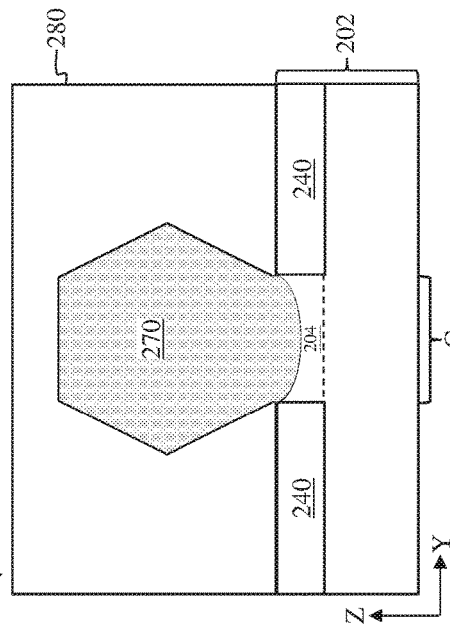
Figure 17A:
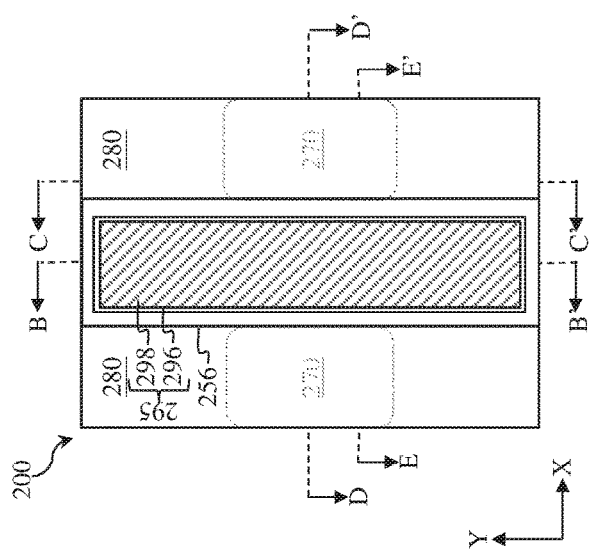

The present disclosure relates generally to integrated circuit devices, and more particularly, to multigate devices, such as gate-all-around (GAA) devices.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to encompass different orientations than as depicted of a device (or system or apparatus) including the element(s) or feature(s), including orientations associated with the device's use or operation. The apparatus may be otherwise oriented (rotated 90 degrees or at other orientations) and the spatially relative descriptors used herein may likewise be interpreted accordingly. Furthermore, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.5 nm to 5.5 nm where manufacturing tolerances associated with depositing the material layer are known to be +/−10% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

Recently, multigate devices have been introduced to improve gate control. Multigate devices have been observed to increase gate-channel coupling, reduce OFF-state current, and/or reduce short-channel effects (SCEs). Multigate devices include a gate structure that extends, partially or fully, around a channel region to provide access to the channel region on at least two sides. One such multigate device is the gate-all around (GAA) device, which includes channel layers (regions) that are vertically or horizontally stacked and suspended in a manner that allows a gate structure to wrap around (or surround) the channel layers. GAA devices enable aggressive scaling down of IC technologies, maintaining gate control and mitigating SCEs, while seamlessly integrating with conventional IC manufacturing processes.

As GAA devices scale, channel layers often have nanometer-sized dimensions and have profiles designed to optimize performance, such as cylindrical shapes (e.g., nanowires), rectangular shapes (e.g., nanobars), and/or sheet shapes (e.g., nanosheets). Because nanosheet channel layers have wider channels (i.e., wider effective channel widths ($W_{eff}$)), GAA devices with nanosheet channel layers can provide higher drive currents, and thus faster on/off switching. Conventional standard cell sizes limit nanosheet channel width increases, and thus corresponding increases to current conduction area and drive current, of nanosheet-based GAA devices. For example, increasing nanosheet channel width increases a footprint of a nanosheet-based GAA device in a standard cell, which hinders dense packing of IC features (e.g., GAA devices) in the standard cell needed for advanced IC technology nodes. Though further increases in drive current can be obtained by increasing a number of nanosheet channel layers in the nanosheet-based GAA device without increasing its footprint, increasing the number of nanosheet channel layers has also been observed to undesirably increase parasitic capacitance and thus decrease performance of the nanosheet-based GAA device. Source/drain design and fabrication challenges also arise as the number of nanosheet channel layers increases, which may offset any drive current increases obtained by the additional nanosheet channel layers.

To overcome such challenges, the present disclosure proposes multigate devices, such as GAA devices, having at least two sheet-like channel layers connected by a channel connecting portion. Such configuration provides multigate devices having sheet-like channels, T-channels, H-channels, E-channels, F-channels, and/or combinations thereof. Multigate devices having the sheet-like channel layers connected by channel connecting portions have increased current conduction areas compared to conventional GAA devices, and thus can provide higher drive current than conventional GAA devices. The proposed techniques for fabricating the sheet-like channel layers connected by channel connecting portions are easily and seamlessly integrated into existing multigate device fabrication. The proposed techniques for fabricating sheet-like channel layers connected by channel connecting portions also allow for current conduction area tuning (for example, by adjusting a spacing between sheet-like channel layers (e.g., nanosheets) and/or a thickness of the channel connecting portions) and thus drive current tuning based on design considerations of the disclosed multigate devices. In some embodiments, a metal gate fill window is increased by tuning the current conduction area. Details of the proposed sheet-like channel layers connected by channel connecting portions for multigate devices and methods of fabrication thereof are described herein in the following pages and/or drawings.

FIG. 1 is a flow chart of a method 100 for fabricating a multigate device according to various aspects of the present disclosure. In some embodiments, method 100 fabricates a transistor of a multigate device that includes sheet-like channel layers, where at least two of the sheet-like channel layers are connected by a channel connecting portion. At block 102, a semiconductor layer stack is formed over a substrate. The semiconductor layer stack includes first semiconductor layers and second semiconductor layers stacked vertically in an alternating configuration. At block 104, a semiconductor line is formed in the semiconductor layer stack. The semiconductor line extends from a first one of the first semiconductor layers through one of the second semiconductor layers to a second one of the first semiconductor layers. The semiconductor line has a first width. At block 106, the semiconductor layer stack is patterned to form a fin structure extending from the substrate. The fin structure includes a portion of the first one of the first semiconductor layers, a portion of the one of the second semiconductor layers, and a portion of the second one of the first semiconductor layers. The fin structure further includes the semiconductor line. In some embodiments, the semiconductor line is formed before patterning the semiconductor layer stack to form the fin structure. In some embodiments, the semiconductor line is formed after patterning the semiconductor layer stack to form the fin structure. At block 108, the portion of the one of the second semiconductor layers is selectively removed from the semiconductor layer stack, such that the first one of the first semiconductor layers is separated from the second one of the first semiconductor layers by a distance along a first direction. The semiconductor line extends between and connects the first one of the first semiconductor layers to the second one of the first semiconductor layers along the first direction. At block 110, the semiconductor line is trimmed to reduce the first width to a second width. The first width and the second width are along a second direction different than the first direction. In some embodiments, the first width is greater than the distance, and the second width is less than the distance. Additional steps can be provided before, during, and after method 100, and some of the steps described can be moved, replaced, or eliminated for additional embodiments of method 100. The discussion that follows illustrates various embodiments of multigate devices having improved performance characteristics that can be fabricated using method 100.

FIGS. 2A-17A, FIGS. 2B-17B, FIGS. 2C-17C, FIGS. 2D-17D, and FIGS. 2E-17E are fragmentary diagrammatic views of a multigate device 200, in portion or entirety, at various fabrication stages (such as those associated with method 100 in FIG. 1) according to various aspects of the present disclosure. In particular, FIGS. 2A-17A are top views of multigate device 200 in an X-Y plane; FIGS. 2B-17B are diagrammatic cross-sectional views of multigate device 200 in a Y-Z plane along lines B-B' respectively of FIGS. 2A-17A, FIGS. 2C-17C are diagrammatic cross-sectional views of multigate device 200 in a Y-Z plane along lines C-C' respectively of FIGS. 2A-17A; FIGS. 2D-17D are diagrammatic cross-sectional views of multigate device 200 in the X-Z plane along lines D-D' respectively of FIGS. 2A-17A; and FIGS. 2E-17E are diagrammatic cross-sectional views of multigate device 200 in the X-Z plane along lines E-E' respectively of FIGS. 2A-17A. FIGS. 18A-18C are three-dimensional perspective views of multigate device 200, in portion or entirety, at stages of fabrication associated with FIGS. 15A-15E (FIG. 18A) or FIGS. 17A-17E (FIG. 18B and FIG. 18B). Multigate device 200 may be included in a microprocessor, a memory, and/or other IC device. In some embodiments, multigate device 200 is a portion of an IC chip, a system on chip (SoC), or portion thereof, that includes various passive and active microelectronic devices such as resistors, capacitors, inductors, diodes, p-type field effect transistors (PFETs), n-type field effect transistors (NFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, other suitable components, or combinations thereof. FIGS. 2A-17A, FIGS. 2B-17B, FIGS. 2C-17C, FIGS. 2D-17D, and FIGS. 2E-17E have been simplified for the sake of clarity to better understand the inventive concepts of the present disclosure. Additional features can be added in multigate device 200, and some of the features described below can be replaced, modified, or eliminated in other embodiments of multigate device 200.

Turning to FIGS. 2A-2E, multigate device 200 includes a substrate (wafer) 202. In the depicted embodiment, substrate 202 includes silicon. Alternatively or additionally, substrate 202 includes another elementary semiconductor, such as germanium; a compound semiconductor, such as silicon carbide, gallium arsenide, gallium phosphide, indium phosphide, indium arsenide, and/or indium antimonide; an alloy semiconductor, such as silicon germanium (SiGe), GaAsP, AlInAs, AlGaAs, GaInAs, GaInP, and/or GaInAsP; or combinations thereof. Alternatively, substrate 202 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. Substrate 202 can include various doped regions depending on design requirements of multigate device 200. In the depicted embodiment, substrate 202 includes a doped region 204 (referred to hereinafter as a doped well) that includes n-type dopants, p-type dopants, or a combination thereof. For example, doped well 204 is a p-type doped region, such as a p-well, configured for an n-type GAA transistor. In another example, doped well 204 is an n-type doped region, such as an n-well, configured for a p-type GAA transistor. N-type doped regions are doped with n-type dopants, such as phosphorus, arsenic, other n-type dopant, or combinations thereof. P-type doped regions are doped with p-type dopants, such as boron, indium, other p-type dopant, or combinations thereof. In some embodiments, substrate 202 includes doped regions formed with a combination of p-type dopants and n-type dopants. The various doped regions, such as doped well 204, can be formed directly on and/or in substrate 202, for example, providing a p-well structure, an n-well structure, a dual-well structure, a raised structure, or combinations thereof. An ion implantation process, a diffusion process, and/or other suitable doping process can be performed to form the various doped regions, such as doped well 204.

A semiconductor layer stack 205 is formed over substrate 202, where semiconductor layer stack 205 includes semiconductor layers 210 and semiconductor layers 215 stacked vertically (e.g., along the z-direction) in an interleaving or alternating configuration from a surface of substrate 202. In some embodiments, semiconductor layers 210 and semiconductor layers 215 are epitaxially grown in the depicted interleaving and alternating configuration. For example, a first one of semiconductor layers 210 is epitaxially grown on substrate 202, a first one of semiconductor layers 215 is epitaxially grown on the first one of semiconductor layers 215, a second one of semiconductor layers 210 is epitaxially grown on the first one of semiconductor layers 215, and so on until semiconductor layer stack 205 has a desired number of semiconductor layers 210 and semiconductor layers 215. In such embodiments, semiconductor layers 210 and semiconductor layers 215 can be referred to as epitaxial layers. In some embodiments, epitaxial growth of semiconductor layers 210 and semiconductor layers 215 is achieved by a molecular beam epitaxy (MBE) process, a chemical vapor deposition (CVD) process, a metalorganic chemical vapor deposition (MOCVD) process, other suitable epitaxial growth process, or combinations thereof. A composition of semiconductor layers 210 is different than a composition of semiconductor layers 215 to achieve etching selectivity and/or different oxidation rates during subsequent processing. In some embodiments, semiconductor layers 210 have a first etch rate to an etchant and semiconductor layers 215 have a second etch rate to the etchant, where the second etch rate is different than the first etch rate. In some embodiments, semiconductor layers 210 have a first oxidation rate and semiconductor layers 215 have a second oxidation rate, where the second oxidation rate is different than the first oxidation rate. In the depicted embodiment, semiconductor layers 210 and semiconductor layers 215 include different materials, constituent atomic percentages, constituent weight percentages, thicknesses, and/or characteristics to achieve desired etching selectivity during an etching process, such as an etching process implemented to form suspended channel layers in channel regions of multigate device 200. For example, where semiconductor layers 210 include silicon germanium and semiconductor layers 215 include silicon, a silicon etch rate of semiconductor layers 215 is different than a silicon germanium etch rate of semiconductor layers 210. In some embodiments, semiconductor layers 210 and semiconductor layers 215 can include the same material but with different constituent atomic percentages to achieve the etching selectivity and/or different oxidation rates. For example, semiconductor layers 210 and semiconductor layers 215 can include silicon germanium, where semiconductor layers 210 have a first silicon atomic percent and/or a first germanium atomic percent and semiconductor layers 215 have a second, different silicon atomic percent and/or a second, different germanium atomic percent. The present disclosure contemplates that semiconductor layers 210 and semiconductor layers 215 include any combination of semiconductor materials that can provide desired etching selectivity, desired oxidation rate differences, and/or desired performance characteristics (e.g., materials that maximize current flow), including any of the semiconductor materials disclosed herein.

As described further below, semiconductor layers 215 or portions thereof form channel regions (channels) of multigate device 200. In the depicted embodiment, semiconductor layer stack 205 includes three semiconductor layers 210 and three semiconductor layers 215 configured to form three semiconductor layer pairs disposed over substrate 202, each semiconductor layer pair having a respective first semiconductor layer 210 and a respective second semiconductor layer 215. After undergoing subsequent processing, such configuration will result in multigate device 200 having three channels. However, the present disclosure contemplates embodiments where semiconductor layer stack 205 includes more or less semiconductor layers, for example, depending on a number of channels desired for multigate device 200 (e.g., a GAA transistor) and/or design requirements of multigate device 200. For example, semiconductor layer stack 205 can include two to ten semiconductor layers 210 and two to ten semiconductor layers 215. In furtherance of the depicted embodiment, semiconductor layers 210 have a thickness t1 and semiconductor layers 215 have a thickness t2, where thickness t1 and thickness t2 are chosen based on fabrication and/or device performance considerations for multigate device 200. For example, thickness t1 can be configured to define a desired distance (or gap) between adjacent channels of multigate device 200 (e.g., between semiconductor layers 215), thickness t2 can be configured to achieve desired thickness of channels of multigate device 200, and both thickness t1 and thickness t2 can be configured to achieve desired performance of multigate device 200. In some embodiments, thickness t1 is about 6 nm to about 15 nm. In some embodiments, thickness t2 is about 6 nm to about 15 nm.

Turning to FIGS. 3A-3E, an extreme ultraviolet (EUV) lithography process is performed to form a patterned EUV mask layer, such as an EUV mask 220, over multigate device 200. EUV mask 220 has an opening 222 that partially exposes a channel region C of multigate device 200, which can correspond with a channel region of a transistor of multigate device 200. In FIGS. 3A-3E, EUV mask 220 exposes a central portion of channel region C and covers edge portions of channel region C. EUV lithography process generally refers to a lithography process that uses EUV light (radiation) during exposure. For example, EUV mask 220 is formed by depositing an EUV resist layer over semiconductor layer stack 205 (in some embodiments, by spin-coating), performing an exposure process using a mask, and performing a developing process. During the exposure process, the EUV resist layer is exposed to EUV light, where the mask reflects EUV light to the EUV resist layer depending on a mask pattern of the mask, such that an image that corresponds with the mask pattern is projected onto the EUV resist layer. In some embodiments, a wavelength of the EUV light is about 11 nm to about 15 nm (for example, about 13.5 nm). Since the EUV resist layer is sensitive to EUV light, exposed portions of the EUV resist layer chemically change, becoming resistant (insoluble) or not resistant (soluble) to a developing solution. During the developing process, exposed (or non-exposed) portions of the EUV resist layer are dissolved by the developing solution depending on characteristics of the EUV resist layer and characteristics of the developing solution. After development, the patterned EUV resist layer (i.e., EUV mask 220) includes a resist pattern that corresponds with the mask. In some embodiments, the EUV lithography process incudes performing a pre-exposure baking process and/or performing a post-exposure baking process. The EUV resist layer includes a resist material that is sensitive to EUV light (i.e., characteristics of the resist material change in response to exposure to EUV light). The resist material can include a polymer that is resistant to an IC process (for example, an etching process and/or an implantation process), an acid labile group (ALG) component, an acid generating component (such as a photoacid generator (PAG)), a thermal acid generator (TAG) component, a quencher (base) component, a chromophore component, a cross-linker component, a surfactant component, a solvent component, and/or other suitable component. In some embodiments, the EUV resist layer is a metal resist layer, such as a metal oxide resist layer.

Turning to FIGS. 4A-4E, an etching process is performed on the exposed portion of channel region C of semiconductor layer stack 205 using EUV mask 220 as an etch mask. For example, a portion of semiconductor layer stack 205 exposed by opening 222 of EUV mask 220 is removed to form a trench 225 in channel region C of multigate device 200, thereby forming semiconductor layer portions 210A separated from semiconductor layer portions 210B by trench 225 and semiconductor layer portions 215A separated from semiconductor layer portions 215B by trench 225. A depth of trench 225 is selected based on a desired configuration of channel layers of multigate device 200. In the depicted embodiment, semiconductor layer stack 205 exposed by EUV mask 220 is completely removed by the etching process, such that trench 225 exposes substrate 202. In some embodiments, as described further below, semiconductor layer stack 205 exposed by EUV mask 220 is partially removed by the etching process, such that trench 225 extends to one of semiconductor layers 210 or one of semiconductor layers 215. A width w1 of trench 225 (for example, along the y-direction) is selected based on a desired channel configuration and/or a desired performance (e.g., drive current) of multigate device 200. For example, width w1 is greater than a spacing between channel layers, such as sheet channel layers, to be formed for multigate device 200. In such example, width w1 is greater than thickness t1, which corresponds with the spacing between channel layers. In some embodiments, width w1 is about 3 nm to about 15 nm. In some embodiments, width w1 is substantially the same as or less than thickness t1. The etching process can include a dry etching process, a wet etching process, other suitable etching process, or combinations thereof. In some embodiments, the etching process is a multi-step etch process. For example, the etching process may alternate etchants to separately and alternately remove semiconductor layers 210 and semiconductor layers 215. In some embodiments, the etching process uses an etchant that can remove both semiconductor layers 210 and semiconductor layers 215 without alternate tuning of other etch parameters. In some embodiments, parameters of the etching process are configured to selectively etch semiconductor layer stack 205 with minimal (to no) etching of EUV mask 220. In some embodiments, the etching process may partially etch EUV mask 220. In some embodiments, EUV mask 220 is formed over a hard mask layer disposed over semiconductor layer stack 205. In such embodiments, a first etching process removes portions of the hard mask layer to form a patterned hard mask layer, and a second etching process removes portions of semiconductor layer stack 205 using the patterned hard mask layer as an etch mask.

Turning to FIGS. 5A-5E and FIGS. 6A-6E, EUV mask 220 is removed from multigate device 200 by any suitable process (e.g., a resist stripping process and/or an etching process) (FIGS. 5A-5E), and a semiconductor layer 230 is formed over multigate device 200 that fills trench 225 (FIGS. 6A-6E). In the depicted embodiment, a deposition process forms a semiconductor material that overfills trench 225 and covers a top surface of semiconductor layer stack 205, such as top surfaces of topmost semiconductor layer portions 215A, 215B. In some embodiments, the semiconductor material has a crystalline structure (i.e., a material having an ordered atomic structure), such as crystalline silicon (e.g., c-Si), crystalline germanium, and/or crystalline silicon germanium (e.g., c-SiGe), and/or another crystalline semiconductor material. In some embodiments, the semiconductor material has a non-crystalline structure (i.e., a material having a disordered atomic structure), such as amorphous silicon (e.g., a-Si), amorphous germanium (e.g., a-Ge), amorphous silicon germanium (e.g., a-SiGe), and/or another amorphous semiconductor material. In some embodiments, the semiconductor material has n-type dopants (e.g., arsenic, phosphorus, and/or antimony), p-type dopants (boron, gallium, and/or indium), or combinations thereof. In the depicted embodiment, the semiconductor material is crystalline silicon or amorphous silicon, and semiconductor layer 230 can be referred to as a silicon layer or an amorphous silicon layer, respectively. In some embodiments, semiconductor layer 230 includes silicon and/or amorphous silicon doped with boron, phosphorous, carbon, fluorine, other suitable dopant, or combinations thereof. In some embodiments, a dopant concentration of the dopant in semiconductor layer 230 is less than or equal to about $2\times10^{18}$ cm$^{-3}$. In some embodiments, semiconductor layer 230 is doped with carbon. In some embodiments, a concentration of carbon in semiconductor layer 230 is less than or equal to about 2%. Incorporating dopant, such as carbon, into semiconductor layer 230 can modify an etch rate of semiconductor layer 230 relative to an etch rate of semiconductor layer portions 210A, 215A and/or semiconductor layer portions 210B, 215B, such that etching selectivity can be achieved during subsequent processing between semiconductor layer 230 and semiconductor layer portions 210A, 215A and/or semiconductor layer portions 210B, 215B, such as that described below with reference to FIGS. 16A-16E. The deposition process is CVD, physical vapor deposition (PVD), atomic layer deposition (ALD), high density plasma CVD (HDPCVD), MOCVD, remote plasma CVD (RPCVD), plasma enhanced CVD (PECVD), low-pressure CVD (LPCVD), atomic layer CVD (ALCVD), atmospheric pressure CVD (APCVD), other suitable methods, or combinations thereof. In some embodiments, semiconductor layer 230 is epitaxially grown from semiconductor layer portions 210A, 210B and/or semiconductor layer portions 215A, 215B. An epitaxy process can use CVD deposition techniques (for example, VPE, UHV-CVD, LPCVD, and/or PECVD), molecular beam epitaxy, other suitable selective epitaxial growth processes, or combinations thereof. In such embodiments, semiconductor layer 230 can be referred to as an epitaxial semiconductor layer, such as an epitaxial silicon layer. The epitaxy process can use gaseous and/or liquid precursors, which interact with the composition of semiconductor layer portions 210A, 210B and/or semiconductor layer portions 215A, 215B. In some embodiments, semiconductor layer 230 is formed by a deposition process that blanket deposits a semiconductor material over multigate device 200.

A quality of semiconductor layer 230 and interfaces between semiconductor layer 230 and semiconductor layer stack 205, such as an interface I1 formed between semiconductor layer 230 and semiconductor layer portions 210A, 215A and an interface I2 formed between semiconductor layer 230 and semiconductor layer portions 210B, 215B, can affect performance of a transistor of multigate device 200. In some embodiments, semiconductor material formed by the deposition process may fill or close (pinch) off a top of trench 225 before completely filling trench 225, resulting in semiconductor layer 230 having one or more voids (seams) therein after deposition, such as a void (i.e., an air gap) that runs vertically through a center of a portion of semiconductor layer 230 filling trench 225. Void formation is particularly likely when trench 225 has a high aspect ratio, such as when trench 225 is a narrow width trench and a depth d of trench 225 is substantially greater than width w1 of trench 225 (e.g., a ratio of depth d to width w1 is greater than about 1.05). Voids may also form at interface I1 and/or interface I2 when semiconductor layer 230 does not adhere well to semiconductor layer portions 210A, 215A and/or semiconductor layer portions 210B, 215B, respectively. Since semiconductor layer 230 will form a portion of channel layers of a transistor, any voids therein will resist and/or impede current (e.g., carriers, such as electrons or holes) from traveling through the channel layers of the transistor, thereby degrading operation and/or performance of the transistor. In some embodiments, silicon dangling bonds at interface I1 and interface I2, which can trap and accumulate charge, can create current leakage paths and/or undesirably shift a threshold voltage of the transistor. In some embodiments, to balance manufacturing demands and electronic performance demands, it may be desired to form semiconductor layer 230 by depositing amorphous semiconductor material (e.g., a-Si), which is easier and cheaper to deposit than crystalline semiconductor material (e.g., amorphous semiconductor material can be formed by a low-cost, low-temperature process, such as PECVD), but then convert the amorphous semiconductor material into crystalline semiconductor material, which current can flow through more easily (e.g., carrier mobility of c-Si is greater than carrier mobility of a-Si).

To address such issues, after deposition, an annealing process is performed on semiconductor layer 230 to (1) reflow the semiconductor material of semiconductor layer 230 to reduce (and, in some embodiments, eliminate) any voids that formed in semiconductor layer 230 and/or at interfaces I1, I2 during deposition; (2) repair dangling bonds, such as silicon dangling bonds, in semiconductor layer 230 and/or at interfaces I1, I2; and/or (3) convert (crystallize) amorphous semiconductor material (i.e., semiconductor material having a non-crystalline structure) into crystalline semiconductor material (i.e., semiconductor material having a crystalline structure). Any suitable annealing process is implemented so long as a temperature and other parameters of the annealing process are tuned (controlled) to sufficiently reflow, repair, and/or convert as described herein to improve quality of semiconductor layer 230 and/or quality of interfaces I1, I2. In some embodiments, parameters of the annealing process are selected based on various properties of semiconductor layer 230 and/or semiconductor layer stack 205, such as reflow temperature and/or crystallization temperature. In some embodiments, a temperature of the annealing process is about 550°

C. to about 950° C. When the temperature of the annealing process is below 550° C., little or no reflow of semiconductor material (e.g., silicon) may take place to improve crystallinity of semiconductor layer 230 and/or to reduce silicon dangling bonds. When the temperature of the annealing process is above 950° C., damage may occur to semiconductor layer portions 210A, 210B, semiconductor layer portions 215A, 215B, and/or semiconductor layer 230. In some embodiments, a duration of the annealing process is about 1 minute to about 30 minutes. In some embodiments, the annealing process is performed at a pressure of about 1 atmosphere (atm) to about 10 atm. In some embodiments, the annealing process is performed in a gas ambient that includes hydrogen, nitrogen, helium, argon, neon, other suitable annealing gas ambient, or combinations thereof. In some embodiments, the gas ambient includes hydrogen, where a concentration of the hydrogen is about 0.5% to about 4% in the gas ambient. In some embodiments, the annealing process causes semiconductor layer 230 to flow in a manner that reduces or eliminates voids in semiconductor layer 230, at interface I1, and/or at interface I2. In some embodiments, the annealing process reduces silicon dangling bonds at interface I1 and/or interface I2, thereby reducing a density of silicon dangling bonds (and thus a density of interface trap charge) at interface I1 and/or interface I2, which can improve carrier mobility through channel layers and/or stabilize a threshold voltage of multigate device 200. In some embodiments, the annealing process reduces lattice defects and/or dislocations at interface I1, interface I2, and/or within semiconductor layer 230, which can improve carrier mobility through channel layers of multigate device 200. In some embodiments, the annealing process crystallizes an amorphous semiconductor material of semiconductor layer 230 (in other words, reorders its atomic structure), such that semiconductor layer 230 includes crystalline semiconductor material. For example, where semiconductor layer 230 includes amorphous silicon, the annealing process recrystallizes the amorphous silicon (i.e., reorders its atomic structure), such that semiconductor layer 230 includes crystalline silicon (i.e., silicon having an ordered atomic structure).

Turning to FIGS. 7A-7E, a chemical mechanical planarization (CMP) process and/or other planarization process is performed on semiconductor layer 230. In the depicted embodiment, the CMP process removes portions of semiconductor layer 230 that are disposed over semiconductor layer stack 205. A remainder of semiconductor layer 230 after the CMP process forms a semiconductor line 230' having width w1 and a height that is substantially the same as a height of semiconductor layer stack 205. Semiconductor line 230' is formed in an active region of multigate device 200, such as a region of multigate device 200 where a channel region and source/drain regions are formed for a transistor of multigate device 200. Semiconductor line 230' is disposed between semiconductor layer portions 210A, 215A and semiconductor layer portions 210B, 215B. Semiconductor line 230' and semiconductor layer portions 210A, 215A have interface I1 therebetween, and semiconductor line 230' and semiconductor layer portions 210B, 215B have interface I2 therebetween. Accordingly, semiconductor layer stack 205 has first semiconductor layers formed from respective semiconductor layer portions 210A, respective semiconductor layer portions 210B, and respective portions of semiconductor line 230' disposed therebetween and second semiconductor layers formed from respective semiconductor layer portions 215A, respective semiconductor layer portions 215B, and respective portions of semiconductor line 230' disposed therebetween. In some embodiments, topmost semiconductor layer portions 215A, 215B function as a CMP stop layer, such that the CMP process is performed until reaching and exposing topmost semiconductor layer portions 215A, 215B. In some embodiments, a composition of semiconductor layer 230 is different than a composition of semiconductor layer portions 215A, 215B, such that the CMP process stops upon reaching semiconductor layer portions 215A, 215B. In some embodiments, a duration of the CMP process is selected to ensure that the CMP process stops upon reaching semiconductor layer portions 215A, 215B. The CMP process can planarize top surface of semiconductor line 230' and top surfaces of topmost semiconductor layer portions 215A, 215B, such that these surfaces are substantially planar after the CMP process.

Turning to FIGS. 8A-8E, semiconductor layer stack 205 is patterned to form a fin 235 (also referred to as a fin structure, a fin element, etc.), and an isolation feature(s) 240 is formed over and/or in substrate 202 in isolation regions 236 to separate and isolate active device regions, such as active region 238 from other active regions of multigate device 200. Fin 235 includes a substrate portion (i.e., a portion of substrate 202) and a semiconductor layer stack portion (i.e., a remaining portion of semiconductor layer stack 205 that includes semiconductor layer portions 210A, 210B, semiconductor layer portions 215A, 215B, and semiconductor line 230'). Fin 235 extends along an x-direction, having a length defined in the x-direction, a width defined in a y-direction, and a height defined in a z-direction. In some embodiments, a lithography and/or etching process is performed to pattern semiconductor layer stack 205 to form fin 235. The lithography process can include forming a resist layer over semiconductor layer stack 205 (for example, by spin coating), performing a pre-exposure baking process, performing an exposure process using a mask, performing a post-exposure baking process, and performing a developing process. During the exposure process, the resist layer is exposed to radiation energy (such as ultraviolet (UV) light, deep UV (DUV) light, or EUV light), where the mask blocks, transmits, and/or reflects radiation to the resist layer depending on a mask pattern of the mask and/or mask type (for example, binary mask, phase shift mask, or EUV mask), such that an image is projected onto the resist layer that corresponds with the mask pattern. Since the resist layer is sensitive to radiation energy, exposed portions of the resist layer chemically change, and exposed (or non-exposed) portions of the resist layer are dissolved during the developing process depending on characteristics of the resist layer and characteristics of a developing solution used in the developing process. After development, the patterned resist layer includes a resist pattern that corresponds with the mask, where the resist pattern covers an active device region of multigate device 200 and exposes an isolation region of multigate device 200. For example, the resist pattern exposes portions of semiconductor layer portions 210A, 215A and portions of semiconductor layer portions 210B, 215B disposed in isolation regions 236 of multigate device 200 and covers semiconductor line 230', portions of semiconductor layer portions 210A, 215A, unexposed portions of semiconductor layer portions 210B, 215B disposed in an active region 238 of multigate device 200. The etching process removes exposed portions of semiconductor layer portions 210A, 215A and exposed portions of semiconductor layer portions 210B, 215B in isolation regions 236 using the patterned resist layer as an etch mask. In some embodiments, the patterned resist layer is formed over a hard mask layer disposed over semiconductor layer stack 205, a first etching process removes portions of the hard mask layer to form a patterned hard mask layer, and a second etching process removes portions of semiconductor layer stack 205 using the patterned hard mask layer as an etch mask. The etching process can include a dry etching process, a wet etching process, other suitable etching process, or combinations thereof. After the etching process, the patterned resist layer (and, in some embodiments, a hard mask layer) is removed, for example, by a resist stripping process or other suitable process. In some embodiments, fin 235 is formed by a multiple patterning process, such as a double patterning lithography (DPL) process (for example, a lithography-etch-lithography-etch (LELE) process, a self-aligned double patterning (SADP) process, a spacer-is-dielectric (SID) SADP process, other double patterning process, or combinations thereof), a triple patterning process (for example, a lithography-etch-lithography-etch-lithography-etch (LELELE) process, a self-aligned triple patterning (SATP) process, other triple patterning process, or combinations thereof), other multiple patterning process (for example, self-aligned quadruple patterning (SAQP) process), or combinations thereof. In some embodiments, directed self-assembly (DSA) techniques are implemented while patterning semiconductor layer stack 205. Further, in some embodiments, the exposure process can implement maskless lithography, electron-beam (e-beam) writing, and/or ion-beam writing for patterning the resist layer.

After forming fin 235, isolation features 240 are formed, for example, by depositing an insulator material (e.g., an oxide material) over substrate 202 after forming fin 235, such that a thickness of the insulator material is greater than a height of fin 235 (i.e., the insulator material overfills gaps (trenches) between fin 235 and other fins); planarizing (for example, by a CMP process) the insulator material, thereby reducing the thickness of the insulator material, for example, until it is substantially the same as the height of fin 235; and etching back (recessing) the insulator material. The deposition process is a flowable CVD (FCVD) process, a high aspect ratio deposition (HARP) process, a high-density plasma CVD (HDPCVD) process, other suitable deposition process, or combinations thereof. In some embodiments, topmost semiconductor layer portions 215A, 215B and/or semiconductor line 230' function as a planarization (e.g., CMP) stop layer, such that the planarization process is performed until reaching and exposing topmost semiconductor layer portions 215A, 215B and/or semiconductor line 230'. In some embodiments, the etching back recesses the insulator material until achieving a desired (target) height of an upper fin active region of fin 235. In the depicted embodiment, the etching back proceeds until fully exposing the semiconductor layer stack portion of fin 235 (e.g., semiconductor layer portions 210A, 210B, semiconductor layer portions 215A, 215B, and semiconductor line 230') and reaching the substrate portion of fin 235 (e.g., substrate 202/doped well 204), such that a top surface of the substrate portion of fin 235 is substantially planar with top surfaces of isolation features 240 relative to a top surface of substrate 202. In some embodiments, the etching back proceeds until also partially exposing the substrate portion of fin 235, such that the top surface of the substrate portion of fin 235 is higher than top surfaces of isolation features 240 relative to the top surface of substrate 202. In some embodiments, the semiconductor layer stack portion of fin 235 is partially, instead of fully, exposed by the etching back, such that the top surface of the substrate portion of fin 235 is lower than top surfaces of isolation features 240 relative to the top surface of substrate 202.

Isolation features 240 surround a bottom portion of fin 235, thereby providing the upper fin active region of fin 235 (generally referring to a portion of fin 235 that extends from and above top surfaces of isolation features 240) and a lower fin active region of fin 235 (generally referring to a portion of fin 235 surrounded by isolation features 240 and extending from the top surface of substrate 202 to the top surface of isolation features 240). Isolation features 240 separate and electrically isolate fin 235 from other fins, other active regions and/or passive regions of multigate device 200, and/or other features of multigate device 200. Isolation features 240 include silicon oxide, silicon nitride, silicon oxynitride, other suitable isolation material (for example, including silicon, oxygen, nitrogen, carbon, or other suitable isolation constituent), or combinations thereof. Dimensions and/or characteristics of isolation features 240 can be configured during processing to provide shallow trench isolation (STI) structures, deep trench isolation (DTI) structures, local oxidation of silicon (LOCOS) structures, other suitable isolation structures, or combinations thereof. In the depicted embodiment, isolation features 240 are STIs. In some embodiments, isolation features 240 include a multi-layer structure, such as a silicon nitride bulk layer disposed over an oxide liner layer. In some embodiments, isolation features 240 include a dielectric bulk layer disposed over a doped liner layer (including, for example, boron silicate glass (BSG) and/or phosphosilicate glass (PSG)). In some embodiments, isolation features 240 include a bulk dielectric layer (e.g., a bulk silicon oxide layer) disposed over a dielectric liner layer(s) (e.g., a silicon nitride liner, a silicon oxide liner, a silicon liner, and/or other suitable liner), where the bulk dielectric layer and dielectric liner layer include materials depending on design requirements.

Turning to FIGS. 9A-9E, gate structure 250 is formed over fin 235 and isolation features 240. Gate structure 250 extends lengthwise in a direction that is different than (e.g., orthogonal to) the lengthwise direction of fin 235. For example, gate structure 250 extends along the y-direction, having a length defined in the y-direction, a width defined in the x-direction, and a height defined in the z-direction. Gate structure 250 traverses fin 235, such that channel region C is disposed between source/drain regions S/D of multigate device 200, which can correspond with source/drain regions of a transistor of multigate device 200. In the Y-Z plane, gate structure 250 wraps a top surface and sidewall surfaces of fin 235. In the X-Z plane, gate structure 250 is disposed over a top surface of fin 235 in channel region C and interposes source/drain regions S/D. In FIGS. 9A-9E, gate structure 250 includes a dummy gate stack 252 and gate spacers 256 disposed adjacent to (i.e., along sidewalls of) dummy gate stack 252. A width (here, along the x-direction) of dummy gate stack 252 can correspond with a gate length ($L_g$) of a transistor, where the gate length is a distance (or length) that current (e.g., carriers, such as electrons or holes) travels between source/drain regions S/D when the transistor is switched (turned) on.

Dummy gate stack 252 includes a dummy gate electrode, and in some embodiments, a dummy gate dielectric. The dummy gate electrode includes a suitable dummy gate material, such as polysilicon layer. In embodiments where dummy gate stack 252 includes a dummy gate dielectric disposed between the dummy gate electrode and fin 235, the dummy gate dielectric includes a dielectric material, such as silicon oxide. Dummy gate stack 252 can include numerous other layers, for example, capping layers, interface layers, diffusion layers, barrier layers, hard mask layers, or combinations thereof. For example, dummy gate stack 252 can further include a hard mask layer disposed over the dummy gate electrode. Dummy gate stack 252 is formed by deposition processes, lithography processes, etching processes, other suitable processes, or combinations thereof. For example, a deposition process is performed to form a dummy gate dielectric layer (e.g., an oxide layer) over fin 235 and isolation features 240, and a deposition process is performed to form a dummy gate electrode layer (e.g., a polysilicon layer) over the dummy gate dielectric layer. In some embodiment, a hard mask layer is deposited over the dummy gate electrode layer. The deposition process includes CVD, PVD, ALD, HDPCVD, MOCVD, RPCVD, PECVD, LPCVD, ALCVD, APCVD, other suitable methods, or combinations thereof. A lithography and etching process is then performed to pattern the dummy gate dielectric layer and the dummy gate electrode layer (and, in some embodiments, the hard mask layer) to form dummy gate stack 252, such that dummy gate stack 252 (including the dummy gate electrode layer, the dummy gate dielectric layer, the hard mask layer, and/or other suitable layers) is configured as depicted in FIGS. 9A-9D. The lithography patterning processes include resist coating (for example, spin-on coating), soft baking, mask aligning, exposure, post-exposure baking, developing the resist, rinsing, drying (for example, hard baking), other suitable lithography processes, or combinations thereof. The etching processes include dry etching processes, wet etching processes, other etching methods, or combinations thereof.

Gate spacers 256 are formed by any suitable process and include a dielectric material. The dielectric material can include silicon, oxygen, carbon, nitrogen, other suitable material, or combinations thereof (e.g., silicon oxide, silicon nitride, silicon oxynitride (SiON), silicon carbide, silicon carbon nitride (SiCN), silicon oxycarbide (SiOC), silicon oxycarbon nitride (SiOCN)). For example, a silicon nitride layer can be deposited over dummy gate stack 252 and subsequently etched (e.g., anisotropically etched) to form gate spacers 256. In some embodiments, gate spacers 256 include a multi-layer structure, such as a first dielectric layer that includes silicon nitride and a second dielectric layer that includes silicon oxide. In some embodiments, more than one set of spacers, such as seal spacers, offset spacers, sacrificial spacers, dummy spacers, and/or main spacers, are formed adjacent to dummy gate stack 252. In such embodiments, the various sets of spacers can include materials having different etch rates. For example, a first dielectric layer including silicon and oxygen (e.g., silicon oxide) can be deposited and etched to form a first spacer set adjacent to dummy gate stack 252, and a second dielectric layer including silicon and nitrogen (e.g., silicon nitride) can be deposited and etched to form a second spacer set adjacent to the first spacer set.

Turning to FIGS. 10A-10E, exposed portions of fin 235 (i.e., source/drain regions S/D, which are not covered by gate structure 250) are at least partially removed to form source/drain recesses (trenches) 260. In the depicted embodiment, an etching process completely removes semiconductor line 230', semiconductor layer portions 215A, 215B, and semiconductor layer portions 210A, 210B in source/drain regions S/D, thereby exposing the substrate portion of fin 235 in source/drain regions S/D (e.g., doped well 204). Source/drain recesses 260 thus have sidewalls formed by remaining portions of fin 235 in channel region C (for example, semiconductor line 230', semiconductor layer portions 215A, 215B, and semiconductor layer portions 210A, 210B under gate structure 250) and bottoms formed by substrate 202 in source/drain regions S/D. In some embodiments, the etching process removes some, but not all, of semiconductor line 230', semiconductor layer portions 215A, 215B, and/or semiconductor layer portions 210A, 210B, such that source/drain recesses 260 have bottoms formed by semiconductor line 230', semiconductor layer portions 215A, 215B, and/or semiconductor layer portions 210A, 210B in source/drain regions S/D. In some embodiments, such as depicted, the etching process further removes some, but not all, of the substrate portion of fin 235, such that source/drain recesses 260 extend below a topmost surface of substrate 202. The etching process can include a dry etching process, a wet etching process, other suitable etching process, or combinations thereof. In some embodiments, the etching process is a multi-step etch process. For example, the etching process may alternate etchants to separately and alternately remove semiconductor line 230', semiconductor layer portions 215A, 215B, and/or semiconductor layer portions 210A, 210B. In some embodiments, parameters of the etching process are configured to selectively etch semiconductor line 230', semiconductor layer portions 215A, 215B, and/or semiconductor layer portions 210A, 210B with minimal (to no) etching of gate structure 250 (i.e., dummy gate stack 252 and gate spacers 256) and/or isolation features 240. In some embodiments, a lithography process, such as those described herein, is performed to form a patterned mask layer that covers gate structure 250 and/or isolation features 240, and the etching process uses the patterned mask layer as an etch mask.

Turning to FIGS. 11A-11E, inner spacers 265 are formed in channel regions C along sidewalls of semiconductor layer portions 210A and semiconductor layer portions 210B by any suitable process. For example, a first etching process is performed that selectively etches semiconductor layer portions 210A, 210B exposed by source/drain recesses 260 with minimal (to no) etching of semiconductor line 230' and semiconductor layer portions 215A, 215B, such that gaps are formed between semiconductor layer portions 215A, between semiconductor layer portions 215B, between semiconductor layer portions 215A and substrate 202, and between semiconductor layer portions 215B and substrate 202 under gate spacers 247. Portions (edges) of semiconductor layer portions 215A, 215B are thus suspended in channel region C under gate spacers 256. In some embodiments, the gaps extend partially under dummy gate stack 252. The first etching process is configured to laterally etch (e.g., along the x-direction) semiconductor layer portions 210A, 210B, thereby reducing a length of semiconductor layer portions 210A, 210B along the x-direction. In some embodiments, the first etching process is configured to modify a length of semiconductor layer portions 210A, 210B along the x-direction, such that the length is substantially equal to a desired gate length. The first etching process is a dry etching process, a wet etching process, other suitable etching process, or combinations thereof. A deposition process then forms a spacer layer over gate structure 250 and over features forming source/drain recesses 260 (e.g., semiconductor line 230', semiconductor layer portions 215A, 215B, semiconductor layer portions 210A, 210B, and substrate 202), such as CVD, PVD, ALD, HDPCVD, MOCVD, RPCVD, PECVD, LPCVD, ALCVD, APCVD, other suitable methods, or combinations thereof. The spacer layer partially (and, in some embodiments, completely) fills the source/drain recesses 260. The deposition process may be configured to ensure that the spacer layer fills the gaps between semiconductor layer portions 215A, between semiconductor layer portions 215B, between semiconductor layer portions 215A and substrate 202, and between semiconductor layer portions 215B and substrate 202 under gate spacers 256. A second etching process is then performed that selectively etches the spacer layer to form inner spacers 265 as depicted in FIGS. 11A-11E with minimal (to no) etching of semiconductor line 230', semiconductor layer portions 215A, 215B, and gate structure 250. In some embodiments, the spacer layer is removed from sidewalls of gate spacers 256, sidewalls of semiconductor line 230', sidewalls of semiconductor layer portions 215A, 215B, dummy gate stack 256, and substrate 202. The spacer layer (and thus inner spacers 265) includes a material that is different than a material of semiconductor line 230', a material of semiconductor layer portions 215A, 215B, and a material of gate spacers 256 to achieve desired etching selectivity during the second etching process. In some embodiments, the spacer layer includes a dielectric material that includes silicon, oxygen, carbon, nitrogen, other suitable material, or combinations thereof (for example, silicon oxide, silicon nitride, silicon oxynitride, silicon carbide, or silicon oxycarbonitride). In some embodiments, the spacer layer includes a low-k dielectric material, such as those described herein. In some embodiments, dopants are introduced into the dielectric material, such that spacer layer includes a doped dielectric material.

Turning to FIGS. 12A-12E, epitaxial source/drain features are formed in source/drain recesses 260. For example, a semiconductor material is epitaxially grown from portions of substrate 202, semiconductor line 230', and semiconductor layer portions 215A, 215B exposed by source/drain recesses 260, forming epitaxial source/drain features 270 in source/drain regions S/D. An epitaxy process can use CVD deposition techniques (for example, VPE and/or UHV-CVD), molecular beam epitaxy, other suitable epitaxial growth processes, or combinations thereof. The epitaxy process can use gaseous and/or liquid precursors, which interact with the composition of substrate 202, semiconductor line 230', and/or semiconductor layer portions 215A, 215B. Epitaxial source/drain features 270 are doped with n-type dopants and/or p-type dopants. In embodiments where multigate device 200 is configured as an n-type GAA transistor, epitaxial source/drain features 270 can include silicon. In such embodiments, epitaxial source/drain features 270 can be doped with carbon, phosphorous, arsenic, other n-type dopant, or combinations thereof. In embodiments where multigate device 200 is configured as a p-type GAA transistor, epitaxial source/drain features 270 can include silicon germanium or germanium. In such embodiments, epitaxial source/drain features 270 can be doped with boron, other p-type dopant, or combinations thereof. In some embodiments, epitaxial source/drain features 270 include more than one epitaxial semiconductor layer, where the epitaxial semiconductor layers include the same or different materials and/or dopant concentrations. For example, epitaxial source/drain features 270 can include a first epitaxial layer disposed over a second epitaxial layer, wherein a dopant concentration of a dopant in the first epitaxial layer is greater than a dopant concentration of the dopant in the second epitaxial layer. In some embodiments, epitaxial source/drain features 270 include materials and/or dopants that achieve desired tensile stress and/or compressive stress in channel region C. In some embodiments, epitaxial source/drain features 270 are doped during deposition by adding impurities to a source material of the epitaxy process (i.e., in-situ). In some embodiments, epitaxial source/drain features 270 are doped by an ion implantation process after deposition. In some embodiments, annealing processes (e.g., rapid thermal annealing (RTA) and/or laser annealing) are performed to activate dopants in epitaxial source/drain features 270, heavily doped source/drain regions and/or lightly doped source/drain (LDD) regions of multigate device 200.

Turning to FIGS. 13A-13E, an inter-level dielectric (ILD) layer 280 is formed over isolation features 240, epitaxial source/drain features 270, and gate spacers 256, for example, by a deposition process (such as CVD, PVD, ALD, HDPCVD, MOCVD, RPCVD, PECVD, LPCVD, ALCVD, APCVD, other suitable methods, or combinations thereof). In some embodiments, ILD layer 280 is formed by a flowable CVD (FCVD) process that includes, for example, depositing a flowable material (such as a liquid compound) over multigate device 200 and converting the flowable material to a solid material by a suitable technique, such as thermal annealing and/or ultraviolet radiation treating. ILD layer 280 includes a dielectric material including, for example, silicon oxide, silicon nitride, silicon oxynitride, TEOS formed oxide, PSG, BPSG, low-k dielectric material, other suitable dielectric material, or combinations thereof. Exemplary low-k dielectric materials include FSG, carbon doped silicon oxide, Black Diamond® (Applied Materials of Santa Clara, California), Xerogel, Aerogel, amorphous fluorinated carbon, Parylene, BCB, SiLK (Dow Chemical, Midland, Michigan), polyimide, other low-k dielectric material, or combinations thereof. In the depicted embodiment, ILD layer 280 is a dielectric layer that includes a low-k dielectric material (generally referred to as a low-k dielectric layer). ILD layer 280 can include a multilayer structure having multiple dielectric materials. In some embodiments, a contact etch stop layer (CESL) is disposed between ILD layer 280 and isolation features 240, epitaxial source/drain features 280, and gate spacers 256. The CESL includes a material different than ILD layer 280, such as a dielectric material that is different than the dielectric material of ILD layer 280. For example, where ILD layer 280 includes a low-k dielectric material, the CESL includes silicon and nitrogen, such as silicon nitride or silicon oxynitride. Subsequent to the deposition of ILD layer 280 and/or the CESL, a CMP process and/or other planarization process can be performed until reaching (exposing) a top portion (or top surface) of dummy gate stack 252. In some embodiments, the planarization process removes hard mask layers of dummy gate stack 252 to expose an underlying dummy gate electrode of dummy gate stack 252, such as a polysilicon gate electrode.

Turning to FIGS. 14A-14E, dummy gate stack 252 is removed from gate structure 250, thereby forming a gate opening (trench) 285 that exposes fin 235 in channel region C. For example, gate trench 275 exposes semiconductor line 230, semiconductor layer portions 215A, semiconductor layer portions 215B, semiconductor layer portions 210A, and semiconductor layer portions 210B. In the depicted embodiment, an etching process completely removes dummy gate stack 252. The etching process is a dry etching process, a wet etching process, other suitable etching process, or combinations thereof. In some embodiments, the etching process is a multi-step etch process. For example, the etching process may alternate etchants to separately remove various layers of dummy gate stack 252, such as the dummy gate electrode layers, the dummy gate dielectric layers, and/or the hard mask layers. In some embodiments, the etching process is configured to selectively etch dummy gate stack 252 with minimal (to no) etching of other features of multigate device 200, such as ILD layer 280, gate spacers 256, isolation features 240, semiconductor line 230', semiconductor layer portions 215A, semiconductor layer portions 215B, semiconductor layer portions 210A, and semiconductor layer portions 210B. In some embodiments, a lithography process, such as those described herein, is performed to form a patterned mask layer that covers ILD layer 280 and/or gate spacers 256, and the etching process uses the patterned mask layer as an etch mask.

Turning to FIGS. 15A-15E and FIG. 18A, a channel release process is performed, for example, by selectively removing semiconductor layer portions 210A and semiconductor layer portions 210B of fin 235 (exposed by gate opening 285) from channel region C, thereby forming suspended semiconductor layer portions 215A', suspended semiconductor layer portions 215B', semiconductor line portions 230'-1, and semiconductor line portions 230'-2. The channel release process provides sheet-like channel layers, each of which is formed by a respective suspended semiconductor layer portion 215A', a respective suspended semiconductor layer portions 215B', and a respective semiconductor line portion 230'-1, and channel layer connecting portions, each of which is formed by a respective semiconductor line portion 230'-2. The sheet-like channel layers extend substantially parallel with substrate 202, such as with a top surface of substrate 202, and the channel layer connecting portions extend substantially perpendicular to substrate 202. In FIGS. 15A-15E, the sheet-like channel layers and the channel layer connecting portions exposed by gate opening 285 provide multigate device 200 with at least one T-shaped sheet channel layer (also referred to as a T-shaped channel). For example, three T-shaped channels are vertically stacked along the z-direction, such as a T-shaped channel 290A disposed over and connected to substrate 202, a T-shaped channel 290B disposed over and connected to T-shaped channel 290A, and a T-shaped channel 290C disposed over and connected to T-shaped channel 290B, which are described further below. T-shaped channels 290A-290C provide three channels through which current can flow between epitaxial source/drain features 270 during operation of multigate device 200. In some embodiments, an etching process selectively etches semiconductor layer portions 210A, 210B with minimal (to no) etching of semiconductor layer portions 215A, semiconductor layer portions 215B, semiconductor line 230', and substrate 202. For example, an etchant is selected for the etching process that etches the material of semiconductor layer portions 210A, 210B (e.g., silicon germanium) at a higher rate than the material of semiconductor layer portions 215A, semiconductor layer portions 215B, and semiconductor liner 230' (e.g., silicon) (i.e., the etchant has a high etch selectivity with respect to the material of semiconductor layer portions 210A, 210B). The etching process is a dry etching process, a wet etching process, other suitable etching process, or combinations thereof. In some embodiments, a dry etching process (such as a reactive ion etch (RIE) process) utilizes a fluorine-containing gas (e.g., $SF_6$) to selectively etch semiconductor layer portions 210A, 210B. In some embodiments, a ratio of the fluorine-containing gas to an oxygen-containing gas (e.g., $O_2$), an etching temperature, and/or a power may be tuned to selectively etch silicon germanium. In some embodiments, a wet etching process utilizes an etching solution that includes ammonium hydroxide ($NH_4OH$) and water to selectively etch semiconductor layer portions 210A, 210B. In some embodiments, a chemical vapor phase etching process uses hydrochloric acid (HCl) to selectively etch semiconductor layer portions 210A, 210B. In some embodiments, the etching process is further configured to selectively etch semiconductor layer portions 210A, 210B with minimal (to no) etching of isolation features 240, gate spacers 256, inner spacers 265, and/or ILD layer 280.

Each of T-shaped channels 290A-290C has a first segment extending along a first direction and a second segment extending along a second direction that is different than (and, in some embodiments, substantially orthogonal to) the first direction. In FIGS. 15A-15E, the first segment extends substantially along the y-direction and can be referred to hereafter as a horizontal segment, and the second segment extends substantially along the z-direction and can be referred to hereafter as a vertical segment. The horizontal segment is formed by a respective suspended semiconductor layer portion 215A', a respective suspended semiconductor layer portion 215B', and a respective semiconductor line portion 230'-1 that extends from the respective suspended semiconductor layer portion 215A' to the respective suspended semiconductor layer portion 215B'. The horizontal segment has a width w2 in the Y-Z plane, a width w3 in the X-Z plane, and a thickness h1 in the Y-Z plane and the X-Z plane. Width w2 is a sum of a width s1 of the respective suspended semiconductor layer portion 215A', a width s2 of the respective suspended semiconductor layer portion 215B', and a width s3 of the respective semiconductor line portion 230'-1. In the depicted embodiment, width s1 is substantially the same as width s2, and width s3 is substantially the same as width w1. In some embodiments, width s1 is about 1 nm to about 20 nm, width s2 is about 1 nm to about 20 nm, and width s3 is about 3 nm to about 20 nm. Width s3 is greater than, less than, or substantially the same as width s1 and/or width s2 depending on desired channel configuration. In some embodiments, width s1 is different than width s2. Width w3 can be substantially the same as, greater than, or less than width w2 depending on desired channel configuration. In some embodiments, thickness h1 is about 2 nm to about 10 nm. In some embodiments, such as depicted, thickness h1 is substantially the same as thickness t2 of semiconductor layers 215. The vertical segment includes a respective semiconductor line portion 230'-2 that extends from the respective semiconductor line portion 230'-1 to another T-shaped channel (in particular, to a respective semiconductor line portion 230'-1 of a horizontal segment of another T-shaped channel) or substrate 202. The vertical segment also has width s3 and a thickness h2 (i.e., semiconductor line portions 230'-2 have width w3 and thickness h2). In some embodiments, thickness h2 is about 8 nm to about 15 nm. In some embodiments, such as depicted, thickness h2 is substantially the same as thickness t1 of semiconductor layers 210. Widths of gaps 292A separating suspended semiconductor layer portions 215A' and gaps 292B separating suspended semiconductor layer portions 215B' correspond with thickness h2, and thus spacing between adjacent sheet-like channels (i.e., spacing between adjacent suspended semiconductor layer portions 215A' of T-shaped channels 290A-290C and spacing between adjacent suspended semiconductor layer portions 215B' of T-shaped channels) are substantially the same as thickness h2. In the depicted embodiments, spacing between adjacent suspended semiconductor layer portions 215A' is the same as spacing between adjacent suspended semiconductor layer portions 215B'. In some embodiments, spacing between adjacent suspended semiconductor layer portions 215A' is different than spacing between adjacent suspended semiconductor layer portions 215B'. In some embodiments, T-shaped channels 290A-290C have nanometer-sized dimensions, the vertical stack of T-shaped channels 290A-290C can be referred to as a nanostructure, the horizontal segments of T-shaped channels 290A-290C can be referred to as nanostructure members, such as nanosheets, and the vertical segments of T-shaped channels 290A-290C can be referred to as nanostructure connecting members (or portions), such as nanosheet connecting members. The present disclosure further contemplates embodiments where T-shaped channels 290A-290C have sub-nanometer dimensions or above-nanometer dimensions depending on design requirements of multigate device 200.

Turning to FIGS. 16A-16E, a trimming process is performed to reduce widths of channel connecting portions of multigate device 200, such as the vertical segments of T-shaped channel layers 290A-290C. For example, the trimming process laterally etches (e.g., along the y-direction) semiconductor line portions 230'-2, thereby providing semiconductor line portions 230'-2 with a width s4 that is less than width s3. Width w4 can be selected (tuned) based on a desired drive current and/or a desired current conduction area of a transistor. In some embodiments, to maximize drive current of a transistor, width s4 is less than spacing between sheet-like channels of multigate device 200, such as less than a spacing between adjacent horizontal segments of T-shaped channels 290A-290C (e.g., between adjacent suspended semiconductor layer portions 215A' and/or between adjacent suspended semiconductor layer portions 215B') (i.e., thickness h2). In some embodiments, width s4 is about 3 nm to about 10 nm. In the depicted embodiment, semiconductor line portions 230'-2 have curved sidewalls after the trimming process, such that semiconductor line portions 230'-2 have widths that vary along thickness h2. For example, semiconductor line portions 230'-2 have a narrow middle portion disposed between wider end portions, where the wider end portions are connected to horizontal segments of respective ones of T-shaped channel layers 290A-290C. In such embodiments, a width of semiconductor line portions 230'-2 decreases from a maximum width (i.e., width s3) at a horizontal segment of a first one of T-shaped channel layers 290A-290C to a minimum width and then increases from the minimum width to the maximum width at a horizontal segment of a second one of T-shaped channel layers 290A-290C. In such embodiments, width s4, which is less than width s3, is an average width of semiconductor line portions 230'-2. In some embodiments, semiconductor line portions 230'-2 have substantially straight, parallel sidewalls after the trimming process, such that semiconductor line portions 230'-2 have substantially uniform widths along thickness h2. In such embodiments, width s4 is substantially the same along thickness h2. In some embodiments, semiconductor line portions 230'-2 have tapered sidewalls after the trimming process, such that semiconductor line portions 230'-2 have widths that increase or decrease along thickness. In some embodiments, the trimming process partially exposes bottom surfaces and/or top surfaces of semiconductor line portions 230'-1, which can increase a current conduction area in some embodiments.

The trimming process implements any suitable process that can selectively reduce widths of vertical segments of T-shaped channel layers 290A-290C (i.e., semiconductor line portions 230'-2) with minimal to no effect on profiles and/or dimensions of horizontal segments of T-shaped channel layers 290A-290C (i.e., suspended semiconductor layer portions 215A', suspended semiconductor layer portions 215B', and semiconductor line portions 230'-1). In some embodiments, the trimming process is an etching process, such as a dry etching process, a wet etching process, other suitable etching process, or combinations thereof. In some embodiments, the etching process is an anisotropic etch process, which generally refers to an etch process having different etch rates in different directions, such that the etch process removes material in specific directions, such as substantially in one direction. In the depicted embodiment, the etch process can be configured to have a horizontal etch rate that is greater than a vertical etch rate (in some embodiments, the vertical etch rate equals zero). The anisotropic etch process thus removes material in substantially the horizontal direction (here, y-direction) with minimal (to no) material removal in the vertical direction (here, z-direction). In such embodiments, the anisotropic etch does not remove, or minimally removes, portions of T-shaped channel layers 290A-290C along the z-direction. In some embodiments, the etching process is a directional etching process that directs etchant along the y-direction, but not along the x-direction or the z-direction, to achieve lateral etching of semiconductor line portions 230'-2 along the y-direction. In some embodiments, the etching process selectively removes semiconductor line portions 230'-2 with minimal (to no) etching of suspended semiconductor layer portions 215A', 215B'. For example, an etchant is selected for the etching process that etches the material of semiconductor line portions 230'-2 (e.g., silicon having a first composition) at a higher rate than the material of suspended semiconductor layer portions 215A', 215B' (e.g., silicon having a second composition) (i.e., the etchant has a high etch selectivity with respect to the material of semiconductor line portions 230'-2). In some embodiments, the etching process is further configured to selectively etch semiconductor line portions 230'-2 with minimal (to no) etching of isolation features 240, gate spacers 256, inner spacers 265, and/or ILD layer 280. In some embodiments, the trimming process is further configured to modify dimensions and/or shapes of horizontal segments of T-shaped channel layers 290A-290C. In some embodiments, the trimming process is used to modify and/or tune profiles and/or dimensions of horizontal segments of T-shaped channel layers 290A-290C (i.e., suspended semiconductor layer portions 215A', semiconductor layer portions 215B', and semiconductor line portions 230'-1). For example, the trimming process can reduce height h1 of suspended semiconductor layer portions 215A', semiconductor layer portions 215B', and/or semiconductor line portions 230'-1. In another example, the trimming process can reduce width s2 and/or width s3 of suspended semiconductor layer portions 215A', 215B', respectively. In yet another example, the trimming process can tune profiles of suspended semiconductor layer portions 215A', 215B', such that cross-sectional profiles of suspended semiconductor layer portions 215A', 215B' have a desired shape, such as circular, rectangular, square, hexagonal, and/or other suitable shape.

Turning to FIGS. 17A-17E, FIG. 18B, and FIG. 18C, a metal gate stack 295 (also referred to as a metal gate and/or a high-k/metal gate) is formed in and fills gate opening 285. Metal gate stack 295 includes a gate dielectric 296 (for example, a gate dielectric layer) and a gate electrode 298 (for example, a work function layer and a bulk metal layer). Metal gate stack 295 may include numerous other layers. In some embodiments, forming metal gate stack 295 includes depositing a gate dielectric layer over multigate device 200 that partially fills gate opening 285, depositing a gate electrode layer over the gate dielectric layer that fills a remainder of gate opening 285, and performing a planarization process on the gate electrode layer and the gate dielectric layer (for example, until reaching and exposing ILD layer 280), thereby forming metal gate stack 295 having gate dielectric 296 and gate electrode 298.

Gate dielectric 296 partially fills gate opening 285 and wraps T-shaped channels 290A-290C, such that gate dielectric 296 partially fills gaps 292A and gaps 292B. In FIGS.

17A-17E, gate dielectric 296 covers exposed surfaces of T-shaped channels 290A-290C, such that gate dielectric 296 is disposed along top surfaces, bottom surfaces, and sidewalls of suspended semiconductor layer portions 215A', 215B' of T-shaped channels 290A-290C, sidewalls of semiconductor line portions 230'-2 of T-shaped channels 290A-290C, and top surface of T-shaped channel 290C. Gate dielectric 296 is further disposed over a fin portion of substrate 202 (i.e., substrate portion of fin 235 and also referred to as a substrate extension portion), isolation features 240, and gate spacers 256 in channel region C. Gate dielectric 296 includes a high-k dielectric layer, which includes a high-k dielectric material, which generally refers to a dielectric material having a dielectric constant that is greater than that of silicon dioxide (k≈3.9). For example, the high-k dielectric layer includes $HfO_2$, HfSiO, $HfSiO_4$, HfSiON, HfLaO, HfTaO, HfTiO, HfZrO, HfAlOx, ZrO, $ZrO_2$, $ZrSiO_2$, AlO, AlSiO, $Al_2O_3$, TiO, $TiO_2$, LaO, LaSiO, $Ta_2O_3$, $Ta_2O_5$, $Y_2O_3$, $SrTiO_3$, BaZrO, $BaTiO_3$ (BTO), (Ba, Sr)$TiO_3$ (BST), $Si_3N_4$, hafnium dioxide-alumina ($HfO_2$—$Al_2O_3$) alloy, other suitable high-k dielectric material for metal gate stacks, or combinations thereof. The high-k dielectric layer is formed by any of the processes described herein, such as ALD, CVD, PVD, oxidation-based deposition process, other suitable process, or combinations thereof. For example, an ALD process deposits the high-k dielectric layer. In some embodiments, the ALD process is a conformal deposition process, such that a thickness of the high-k dielectric layer is substantially uniform (conformal) over the various surfaces of multigate device 200. In some embodiments, gate dielectric 296 includes an interfacial layer disposed between the high-k dielectric layer and T-shaped channels 290A-290C. The interfacial layer includes a dielectric material, such as $SiO_2$, HfSiO, SiON, other silicon-comprising dielectric material, other suitable dielectric material, or combinations thereof. The interfacial layer is formed by any of the processes described herein, such as thermal oxidation, chemical oxidation, ALD, CVD, other suitable process, or combinations thereof.

Gate electrode 298 is formed over gate dielectric 296, filling a remainder of gate opening 285 and wrapping T-shaped channels 290A-290C, such that gate electrode 298 fills remainders of gaps 292A and gaps 292B. In the depicted embodiment, gate electrode 298 is disposed along top surfaces, bottom surfaces, and sidewalls of suspended semiconductor layer portions 215A', 215B' of T-shaped channels 290A-290C, sidewalls of semiconductor line portions 230'-2 of T-shaped channels 290A-290C, and top surface of T-shaped channel 290C. Gate electrode 298 is further disposed over the fin portion of substrate 202, isolation features 240, and gate spacers 256 in channel region C. Gate electrode 298 includes a conductive material, such as polysilicon, aluminum, copper, titanium, tantalum, tungsten, molybdenum, cobalt, TaN, NiSi, CoSi, TiN, WN, TiAl, TiAlN, TaCN, TaC, TaSiN, other conductive material, or combinations thereof. In some embodiments, gate electrode 298 includes a work function layer and a bulk conductive layer. The work function layer is a conductive layer tuned to have a desired work function (e.g., an n-type work function or a p-type work function), and the conductive bulk layer is a conductive layer formed over the work function layer. In some embodiments, the work function layer includes n-type work function materials, such as Ti, silver, manganese, zirconium, TaAl, TaAlC, TiAlN, TaC, TaCN, TaSiN, other suitable n-type work function materials, or combinations thereof. In some embodiments, the work function layer includes a p-type work function material, such as ruthenium, Mo, Al, TiN, TaN, WN, $ZrSi_2$, $MoSi_2$, $TaSi_2$, $NiSi_2$, WN, other suitable p-type work function materials, or combinations thereof. The bulk (or fill) conductive layer includes a suitable conductive material, such as Al, W, Ti, Ta, polysilicon, Cu, metal alloys, other suitable materials, or combinations thereof. Gate electrode 298 is formed by any of the processes described herein, such as ALD, CVD, PVD, plating, other suitable process, or combinations thereof.

Figure 19A:
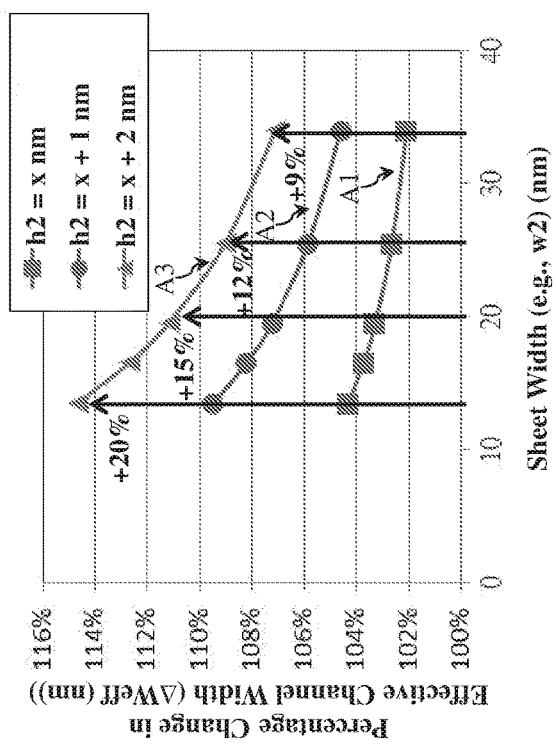
FIG. 19A and FIG. 19B provide plots of a percentage change in effective channel width as a function of horizontal segment sheet width, sheet spacing, and vertical segment sheet width of a multigate device according to various aspects of the present disclosure.
Figure 19B:
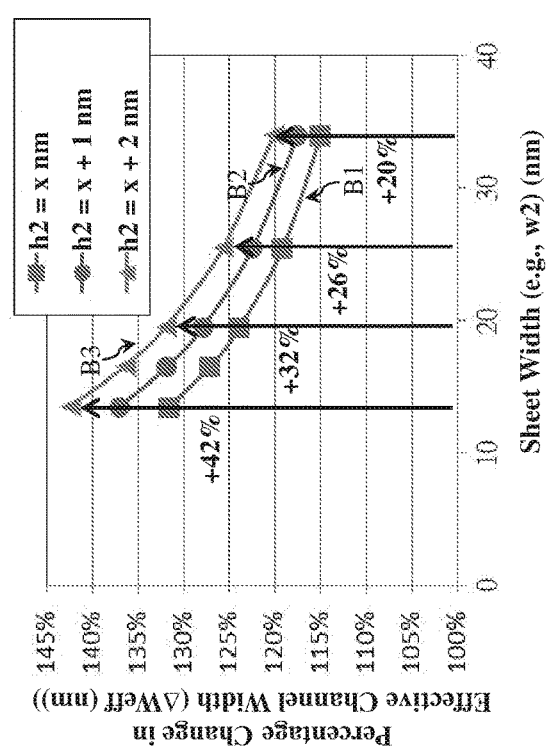

Multigate device 200 thus includes a T-channel transistor having metal gate 295 disposed between epitaxial source/drain features 270. Metal gate 295 (i.e., gate dielectric 296 and gate electrode 298) is disposed over T-shaped channels 290A-290C of the T-channel transistor, such that each of T-shaped channels 290A-290C is wrapped and/or surrounded by metal gate 295 (for example, in the Y-Z plane), and each of T-shaped channels 290A-290C extends between epitaxial source/drain features 270 (for example, in the X-Z plane). A sheet spacing (here, thickness t2) and vertical segment sheet width (here, width w4) can be tuned to achieve desired drive current and/or desired current conduction area, thereby providing a transistor with optimal performance for a desired application. It has been observed that an effective channel width (Weff), and thus an amount of current conduction region/area, of the proposed T-channel transistor increases as sheet spacing (here, thickness h2) increases and vertical segment sheet width (here, width s4) decreases, such as illustrated in FIG. 19A and FIG. 19B. FIG. 19A and FIG. 19B provide plots of a percentage change in effective channel width (ΔWeff) as a function of horizontal segment sheet width in nm (e.g., width w2), sheet spacing in nm (e.g., thickness h2), and vertical segment sheet width in nm (e.g., width s4) according to various aspects of the present disclosure. FIG. 19A indicates ΔWeff when vertical segment sheet width is about 10 nm (e.g., width s4≈10 nm) and FIG. 19B indicates ΔWeff when vertical sheet width is about 5 nm (e.g., width s4≈5 nm), where line A1 and line B1 correspond with the T-channel transistor having sheet spacing of x nm (i.e., thickness h2=x nm), line A2 and line B2 correspond with the T-channel transistor having sheet spacing of x nm+1 nm (i.e., thickness h2=x nm+1 nm), and line A3 and line B3 correspond with the T-channel transistor having sheet spacing of x nm+2 nm (i.e., thickness h2=x nm+2 nm). In some embodiments, x is about 8 nm to about 15 nm. Lines A1-A3 and lines B1-B3 indicate that ΔWeff decreases as horizontal segment sheet (width w2) increases but increases as sheet spacing (thickness h2) increases and further increases as vertical segment sheet width (width s4) decreases. For example, in FIG. 19A and FIG. 19B, each one nm increase in sheet spacing results in increases in ΔWeff (e.g., line A1's ΔWeff values (gains) are less than line A2's ΔWeff values, which are less than line A3's ΔWeff values; line B1's ΔWeff values are less than line B2's ΔWeff values, which are less than line B3's ΔWeff values). Further, decreasing vertical sheet segment width (here, by about 5 nm) increases ΔWeff (e.g., ΔWeff values for line A1 are greater than ΔWeff values for line B1, ΔWeff values for line B1 are greater than ΔWeff values for line B2, and ΔWeff values for line A3 are greater than ΔWeff values for line A (for example, for a sheet width of about 15 nm, ΔWeff is about 20% when vertical sheet segment width is about 10 nm (line A3), but about 42% when vertical sheet segment width decreased 5 nm to about 5 nm (line B3).

Further, the T-channel transistor, such as depicted and described above, can perform better than a conventional nanosheet-channel transistor. For example, FIG. 20 provides cross-sectional views of a T-channel transistor, such as the T-channel transistor of multigate device 200, and a nanosheet-channel transistor 300. Nanosheet-channel transistor 300 can be fabricated according to the process described above, but such fabrication omits processing associated with FIGS. 3A-3E, FIGS. 4A-4E, FIGS. 5A-5E, FIGS. 6A-6E, FIGS. 7A-7E, and FIGS. 16A-16E, thereby providing nanosheet-channel transistor 300 with three suspended sheet-like channel layers 215' (referred to hereinafter as nanosheet channels 310A-310C) surrounded by metal gate 295. Nanosheet channels 310A-310C have substantially the same dimensions as T-shaped channels 290A-290C. For example, nanosheet channels 310A-310C have width w2 (i.e., a sum of width s1, width s2, and width s3) and thickness h1, and nanosheet channels 310A-310C have a spacing that is substantially the same as thickness h2. FIG. 20 further provides a plot of drive current as a function of sheet spacing in nanometers (nm) according to various aspects of the present disclosure, where line T corresponds to the T-shape transistor and line NS corresponds with nanosheet-channel transistor 300. Line T and line NS indicate that both the T-channel transistor and nanosheet-channel transistor 300 have a drive current that is proportional to sheet spacing. In other words, drive current (and thus performance improvements) can be increased by increasing spacing (i.e., thickness h2) between sheets, such as spacing between horizontal segments of T-channels 290A-290C of the T-channel transistor (which can be referred to as sheet-like channels or nanosheets of the T-channel transistor) and spacing between suspended channel layers 215' of nanosheet-channel transistor 300. It is noted that sheet spacing may vary intentionally or unintentionally between adjacent sheets, such that the sheet spacing of the plot in FIG. 20 and/or the sheet spacings of the T-channel transistor and/or nanosheet-channel transistor 300 (i.e., thickness h2) may represent an average sheet spacing.

The plot also indicates that a drive current of the T-channel transistor is greater than a drive current of nanosheet-channel transistor 300 and further indicates that the T-channel transistor can provide greater increases in drive current with sheet spacing increases than nanosheet-channel transistor 300. Such improvements can be realized because a current conduction area of the T-channel transistor is greater than a current conduction area of nanosheet-channel transistor 300, and the current conduction area of the T-channel transistor increases more than the current conduction area of nanosheet-channel transistor 300 as sheet spacing increases. For example, each of nanosheet channels 310A-310C has an effective sheet width (i.e., perimeter) that is equal to a sum of width w2 of a top surface of its respective suspended channel layer 215' (i.e., w2=s1+s2+s3), width w2 of a bottom surface of its respective suspended channel layer 215' (i.e., w2=s1+s2+s3), a length of a first sidewall of its respective suspended channel layer 215' (i.e., thickness h1), and a length of a second sidewall of its respective suspended channel layer 215' (i.e., thickness h1) (i.e., effective sheet width$_{310A, 310B, or 310C}$=(2*s1)+(2*s2)+(2*s3)+(2*h1)). A total effective sheet width (TESW$_{310A-310C}$) of nanosheet-channel transistor 300 is thus equal to three times the effective sheet width$_{310A, 310B, or 310C}$, as provided by equation (1):

$$TESW_{310A-310C}=3*((2*s1)+(2*s2)+(2*s3)+(2*h1)) \\ =6s1+6s2+6s3+6h1, \quad (1)$$

and, where s2=s1 as in the depicted embodiment, the total effective sheet width of nanosheet-channel transistor 300 is provided by equation (2):

$$TESW_{310A-310C}=12s1+6h1+6s3. \quad (2)$$

With such configuration, though drive current of nanosheet-channel transistor 300 increases as sheet spacing increases, such increases are not achieved by increasing sheet spacing to increase TESW$_{310A-310C}$ (and thus current conduction area) because TESW$_{310A-310C}$ does not depend on sheet spacing. In contrast, for the T-channel transistor, each of T-shaped channels 290A, 290B has an effective sheet width that is equal to a sum of width s1 of a top surface of its respective suspended semiconductor layer portion 215A', width s2 of a top surface of its respective suspended semiconductor layer portion 215B', a length of a sidewall of its respective suspended semiconductor layer portion 215A' (i.e., thickness h1), a length of a sidewall of its respective suspended semiconductor layer portion 215B' (i.e., thickness h1), width s1 of a bottom surface of its respective suspended semiconductor layer portion 215A', width s2 of a bottom surface of its respective semiconductor layer portion 215B', a length of a first sidewall of its respective semiconductor line portion 230'-2 (i.e., thickness h2), and a length of a second sidewall of its respective semiconductor line portion 230'-2 (i.e., thickness h2) (i.e., effective sheet width$_{290A or 290B}$=(2*s1)+(2*s2)+(2*h1)+(2*h2)); and T-shaped channel 290C has an effective width (i.e., perimeter) that is equal to a sum of width s3 of its respective semiconductor line portion 230'1 and an effective width of T-shaped channels 290A, 290B (i.e., effective sheet width$_{290C}$=s3+(2*s1)+(2*s2)+(2*h1)+(2*h2)). A total effective sheet width (TESW$_{290A-290C}$) of the T-channel transistor is thus equal to a sum of width s3 and three times the effective sheet width 290A or 290B, as provided by equation (3):

$$TESW_{290A-290C}=s3+(3*((2*s1)+(2*s2)+(2*h1)+ \\ (2*h2)))=s3+6s1+6s2+6h1+6h2, \quad (3)$$

and, where s2=s1 as in the depicted embodiment, the total effective sheet width of the T-channel transistor is provided by equation (4):

$$TESW_{290A-290C}=s3+12s1+6h1+6h2. \quad (4)$$

With such configurations, since TESW$_{290A-290C}$ depends directly and proportionally on sheet spacing (i.e., thickness h2), a current conduction area and/or drive current of the T-channel transistor may directly and proportionally increase as sheet spacing increases. In some embodiments, current conduction area and/or drive current are optimized when sheet spacing is greater than width s4 (e.g., h2≥s4), such as when sheet spacing is about two times to about five times greater than width s4. For example, decreasing width s4 (thickness) increases surface contact area between metal gate 295 and top surfaces and/or bottom surfaces of horizontal segments of T-channels 290A-290C, thereby further increasing TESW$_{290A-290C}$. In some embodiments, current conduction area and/or drive current are optimized when sheet spacing is about 8 nm to about 15 nm and width s4 is about 3 nm to about 10 nm. Increasing sheet spacing to increase current conduction area and/or drive current also increases a metal gate fill window, such that gate electrode 298 and/or gate dielectric 296 can better fill gaps 292A, 292B between adjacent sheet-like channel layers (i.e., horizontal segments of T-shaped channels 290A-290C) and void formation within metal gate 295 is reduced and/or eliminated. Increasing sheet spacing to tune current conduction area, drive current, and/or other performance characteristics of multigate devices as described herein also seamlessly integrates into existing IC manufacturing processes for fabricating multigate devices. Different embodiments may have different advantages, and no particular advantage is necessarily required of any embodiment.

Fabrication can proceed to continue fabrication of multigate device 200. For example, various contacts can be formed to facilitate operation of the transistor. For example, one or more ILD layers, similar to ILD layer 280, and/or CESL layers can be formed over substrate 202 (in particular, over ILD layer 280 and gate structure 250). Contacts can then be formed in ILD layer 280 and/or ILD layers disposed over ILD layer 280. For example, contacts are respectively electrically and/or physically coupled with gate structure 250 and contacts are respectively electrically and/or physically coupled to epitaxial source/drain features 270. Contacts include a conductive material, such as metal. Metals include aluminum, aluminum alloy (such as aluminum/silicon/copper alloy), copper, copper alloy, titanium, titanium nitride, tantalum, tantalum nitride, tungsten, polysilicon, metal silicide, other suitable metals, or combinations thereof. The metal silicide may include nickel silicide, cobalt silicide, tungsten silicide, tantalum silicide, titanium silicide, platinum silicide, erbium silicide, palladium silicide, or combinations thereof. In some implementations, ILD layer 280, ILD layers disposed over ILD layer 280, and the contacts (for example, disposed in ILD layer 280 and/or the other ILD layers) are a portion of a multilayer interconnect (MLI) feature. The MLI feature electrically couples various devices (for example, transistors, resistors, capacitors, and/or inductors) and/or components (for example, gate structures and/or epitaxial source/drain features), such that the various devices and/or components can operate as specified by design requirements of multigate device 200. The MLI feature includes a combination of dielectric layers and electrically conductive layers (e.g., metal layers) configured to form various interconnect structures. The conductive layers are configured to form vertical interconnect features, such as device-level contacts and/or vias, and/or horizontal interconnect features, such as conductive lines. Vertical interconnect features typically connect horizontal interconnect features in different layers (or different planes) of the MLI feature. During operation, the interconnect features are configured to route signals between the devices and/or the components of multigate device 200 and/or distribute signals (for example, clock signals, voltage signals, and/or ground signals) to the devices and/or the components of multigate device 200.

The present disclosure contemplates implementing the processing associated with FIGS. 3A-3E, FIGS. 4A-4E, FIGS. 5A-5E, FIGS. 6A-6E, FIGS. 7A-7E, and FIGS. 16A-16E to achieve various channel shapes that have greater TESWs than conventional nanosheet-channel transistors, thereby enhancing drive current of nanosheet-based transistors. The various channel shapes can be achieved by forming a semiconductor material trench in a semiconductor layer stack that is processed to form nanosheets, where the semiconductor material trench has a first thickness that is greater than a sheet spacing (e.g., an average sheet spacing, which can correspond with a thickness with some layers of the semiconductor layer stack) and the first thickness is reduced to a second thickness that is less than the sheet spacing during gate replacement. The first thickness, the second thickness, and the sheet spacing can be tuned to provide different current conduction areas and/or drive current performance.

Figure 21A:
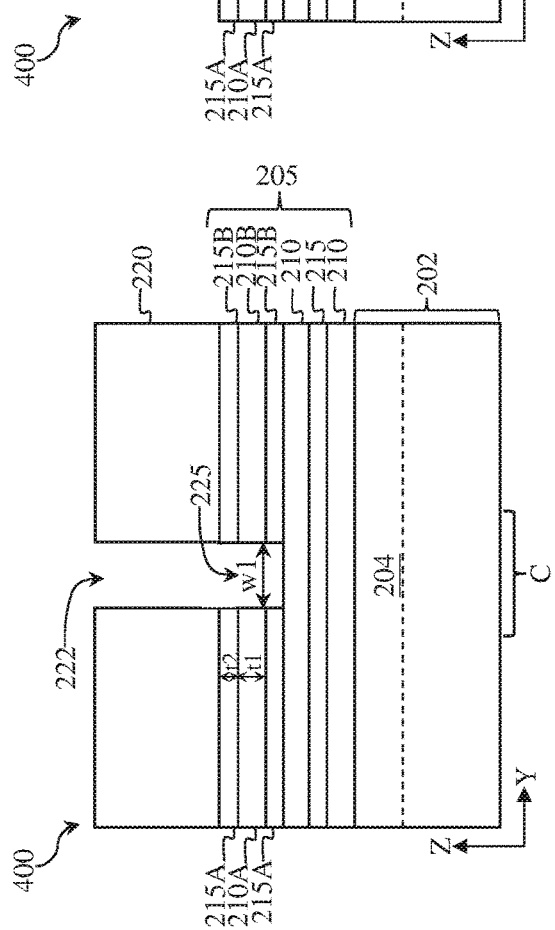
FIG. 21A, FIG. 21B, FIG. 21C, FIG. 21D, FIG. 21E, and FIG. 21F are fragmentary cross-sectional views of another multigate device, in portion or entirety, at various fabrication stages (such as those associated with the method in FIG. 1) according to various aspects of the present disclosure.
Figure 21B:
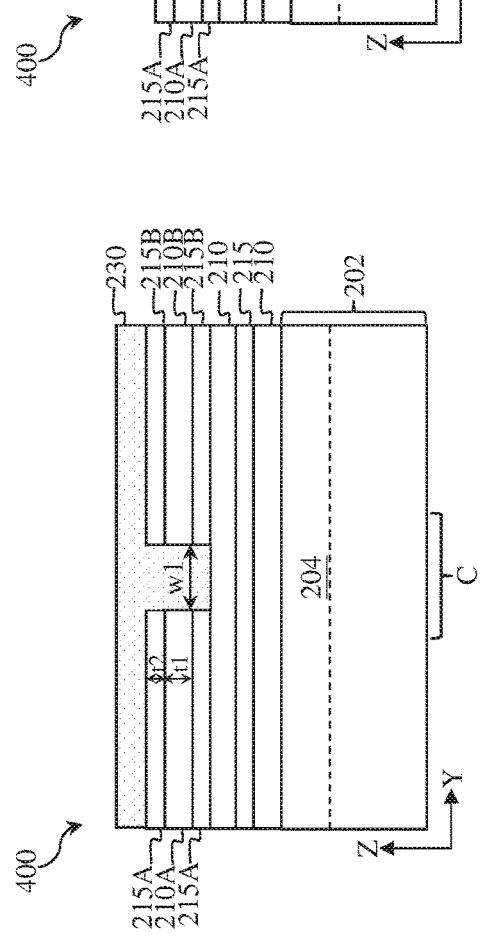
Figure 21C:
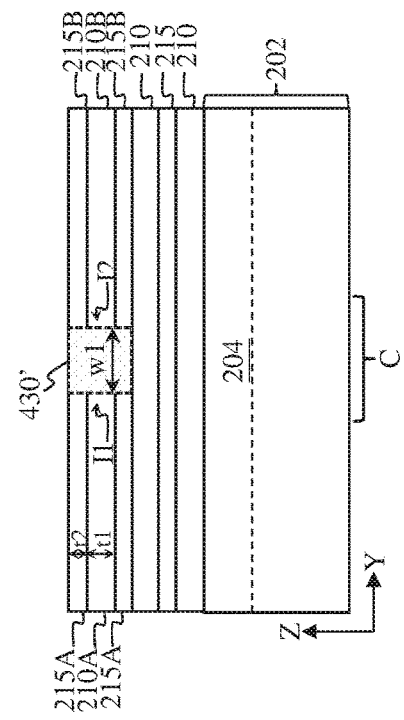
Figure 21D:
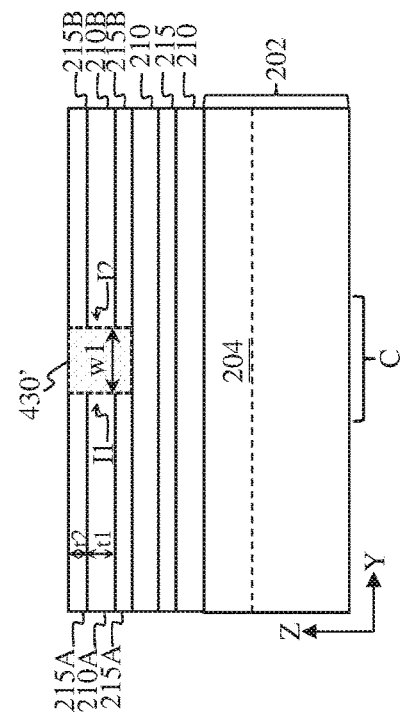
Figure 21E:
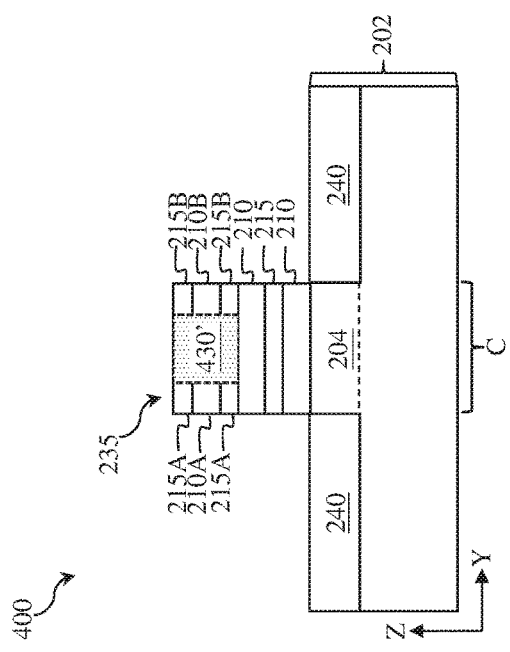

For example, in some embodiments, instead of completely removing semiconductor layer stack 205 exposed by EUV mask 220 as described with reference to FIGS. 4A-4E, semiconductor layer stack 205 exposed by EUV mask 220 is partially removed by the etching process. FIGS. 21A-21F are fragmentary cross-sectional views of a multigate device 400, in portion or entirety, at various fabrication stages according to such embodiments. In FIG. 21A, multigate device 400 has undergone processing described with reference to FIGS. 2A-2E and FIGS. 3A-3E and then undergoes processing similar to that described with reference to FIGS. 4A-4E, except semiconductor layer stack 205 exposed by EUV mask 220 is partially removed by the etching process, such that trench 225 extends partially through semiconductor layer stack 205, instead of completely through semiconductor layer stack 205. For example, trench 225 extends through top semiconductor layer 215, top semiconductor layer 210, and middle semiconductor layer 215, thereby forming semiconductor layer portions 210A separated from semiconductor layer portions 210B by trench 225 and semiconductor layer portions 215A separated from semiconductor layer portions 215B by trench 225 in a top half of semiconductor layer stack 205. In such embodiments, semiconductor layers 210, 215 of a bottom half of semiconductor layer stack 205 (or bottom portion depending on depth of trench 225) remain continuous. In FIGS. 21B-21D, multigate device 400 then undergoes processing similar to that described above with reference to FIGS. 5A-5E, FIGS. 6A-6E, and FIGS. 7A-7E, respectively, where a remainder of semiconductor layer 230 after the CMP process forms a semiconductor line 430' having width w1 and a height that is less than a height of semiconductor layer stack 205. Semiconductor line 430' is formed in an active region of multigate device 400, such as a region of multigate device 400 where a channel region and source/drain regions are formed for a transistor of multigate device 400. Accordingly, semiconductor layer stack 205 has a top portion having semiconductor line 430' disposed between semiconductor layer portions 210A, 215A and semiconductor layer portions 210B, 215B and a bottom portion having semiconductor layers 210, 215. Semiconductor line 430' and semiconductor layer portions 210A, 215A have interface I1 therebetween and semiconductor line 430' and semiconductor layer portions 210B, 215B have interface I2 therebetween. In FIG. 21E, multigate device 400 then undergoes processing similar to that described above with reference to FIGS. 8A-8E, respectively, where fin 235 is formed from semiconductor layer stack 205. In the depicted embodiment, fin 235 includes a substrate portion (i.e., a portion of substrate 202) and a semiconductor layer stack portion (i.e., a remaining portion of semiconductor layer stack 205, which includes a top portion (here, top half) having semiconductor layer portions 210A, 210B, semiconductor layer portions 215A, 215B, and semiconductor line 430' and a bottom portion (here, bottom half) having semiconductor layers 210 and semiconductor layers 215).

Figure 21F:
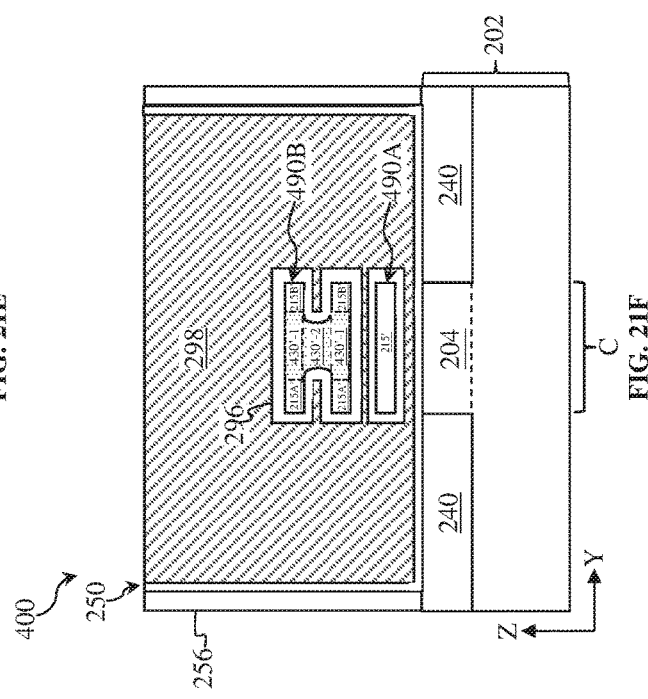

In FIG. 21F, multigate device 400 has undergone processing described with reference to FIGS. 9A-9E, FIGS. 10A-10E, FIGS. 11A-11E, FIGS. 12A-12E, FIGS. 13A-13E, FIGS. 14A-14E, FIGS. 15A-15E, FIGS. 16A-16E, and FIGS. 17A-17E. Because semiconductor line 430' extends partially through fin 235, multigate device 400 has a different channel configuration than multigate device 200. For example, multigate device 400 has a nanosheet channel 490A and a H-shaped channel 490B, both of which are surrounded by metal gate 295. In such embodiments, the channel release process of FIGS. 15A-15E and the trimming process of FIGS. 16A-16E form a suspended channel layer 215' from bottom semiconductor layer 215 of fin 235, suspended semiconductor layer portions 215A', 215B' from semiconductor layer portions 215A, 215B of fin 235, and semiconductor line portions 430'-1 and a semiconductor line portion 430'-2 from semiconductor line 430' of fin 235.

Nanosheet channel 490A includes suspended channel layer 215'. H-shaped channel 490B includes two horizontal segments (which can be referred to as nanosheets) and a vertical segment that extends between and connects the horizontal segments. Each of the horizontal segments if formed by a respective suspended semiconductor layer portion 215A' (having, for example, width s1), a respective semiconductor layer portion 215B' (having, for example, width s2), and a respective semiconductor line portion 430'-1 (having, for example, width s3) that extends between and connects the respective suspended semiconductor layer portion 215A' and the respective semiconductor layer portion 215B'. The vertical segment is formed by semiconductor line portion 430'-2 (having, for example, width s4). In the depicted embodiment, a spacing between nanosheet channel 490A and H-shaped channel 490B is the same as a thickness of semiconductor line portion 430'-2, such as thickness h2 (which also provides a spacing between horizontal segments of H-shaped channel 490B). In some embodiments, the spacing between nanosheet channel 490A and H-shaped channel 490B is the different than the thickness of semiconductor line portion 430'-2. Similar to multigate device 200, sheet spacing (e.g., thickness h2), vertical segment width (e.g., width s4), horizontal segment width (e.g., width w2), and/or other channel dimension can be tuned to achieve a desired conduction current area and/or a desired drive current from multigate device 400 that optimizes transistor performance for a particular application. For clarity and simplicity, similar features of multigate device 400 and multigate device 200 described above are identified by the same reference numerals. FIGS. 21A-21F have been simplified for the sake of clarity to better understand the inventive concepts of the present disclosure. Additional features can be added in multigate device 400, and some of the features described below can be replaced, modified, or eliminated in other embodiments of multigate device 400.

In some embodiments, an alignment of opening 222 in EUV mask 220 with channel region C is shifted to change a location of a semiconductor line within semiconductor layer stack 205 (and fin 235) and thus provide a multigate device with a different channel configuration. FIGS. 22A-22F are fragmentary cross-sectional views of a multigate device 500, in portion or entirety, at various fabrication stages according to such embodiments. In FIG. 22A, multigate device 500 has undergone processing described with reference to FIGS. 2A-2E, FIGS. 3A-3E, and FIGS. 4A-4E, except instead of aligning a center of opening 222 in EUV mask 220 with a center of channel region C as when fabricating multigate device 200, an EUV lithography patterning process aligns an edge of opening 222 in EUV mask 220 with an edge of channel region C, such as a left edge of channel region C. Accordingly, an edge of trench 225 is aligned with an edge of channel region C, semiconductor layer portions 210A and semiconductor layer portions 215A are disposed outside of channel region C, and portions of semiconductor layer portions 210B and portions of semiconductor layer portions 215B are disposed in channel region C. In FIGS. 22B-22D, multigate device 500 then undergoes processing similar to that described above with reference to FIGS. 5A-5E, FIGS. 6A-6E, and FIGS. 7A-7E, respectively, where a remainder of semiconductor layer 230 after the CMP process forms a semiconductor line 530' having width w1 and a height that is substantially the same as a height of semiconductor layer stack 205. Accordingly, semiconductor layer stack 205 has semiconductor line 530' disposed between semiconductor layer portions 210A, 215A and semiconductor layer portions 210B. Semiconductor line 530' and semiconductor layer portions 210A, 215A have interface I1 therebetween and semiconductor line 530' and semiconductor layer portions 210B, 215B have interface I2 therebetween. In FIG. 22E, multigate device 500 then undergoes processing similar to that described above with reference to FIGS. 8A-8E, respectively, where fin 235 is formed from semiconductor layer stack 205. In the depicted embodiment, because semiconductor line 530' is aligned with an edge of channel region C, fin 235 includes a substrate portion (i.e., a portion of substrate 202) and a semiconductor layer stack portion (i.e., a remaining portion of semiconductor layer stack 205). In contrast to fin 235 of multigate device 200, fin 235 of multigate device 500 does not include semiconductor layer portions 210A, 210B. Instead, fin 235 of multigate device 500 includes semiconductor line 530', semiconductor layer portions 210B, and semiconductor layer portions 215B, where semiconductor layer portions 210B, and semiconductor layer portions 215B extend from semiconductor line 530'.

In FIG. 22F, multigate device 500 has undergone processing described with reference to FIGS. 9A-9E, FIGS. 10A-10E, FIGS. 11A-11E, FIGS. 12A-12E, FIGS. 13A-13E, FIGS. 14A-14E, FIGS. 15A-15E, FIGS. 16A-16E, and FIGS. 17A-17E. Because fin 235 of multigate device 500 does not include semiconductor layer portions 210A, 210B, multigate device 500 has a different channel configuration than multigate device 200. For example, multigate device 500 has an E-shaped channel 590 that is surrounded by metal gate 295. In such embodiments, the channel release process of FIGS. 15A-15E and the trimming process of FIGS. 16A-16E suspended semiconductor layer portions 215B' from semiconductor layer portions 215B of fin 235 and semiconductor line portions 530'-1 and semiconductor line portions 530'-2 from semiconductor line 530' of fin 235. E-shaped channel 590B includes three horizontal segments (which can be referred to as nanosheets), two vertical segments that extend between and connect the horizontal segments, and one vertical segment that extends between and connects a bottom one of the horizontal segments to substrate 202 (in particular, to a fin portion (substrate extension portion) of substrate 202). Each of the horizontal segments is formed by a respective semiconductor line portion 530'-1 and a respective suspended semiconductor layer portion 215B' extending therefrom. The vertical segments are formed by semiconductor line portions 530'-2. A width of semiconductor line portions 530'-1 is less than, greater than, or substantially the same as a width of suspended semiconductor layer portions 215B' depending on desired channel configuration and/or desired transistor performance. A width of semiconductor line portions 530'-2 is configured less than a spacing between the horizontal segments (i.e., less than a thickness of semiconductor line portions 530'-2) to optimize performance of multigate device 500. The width of semiconductor line portions 530'-2 may be less than, greater than, or substantially the same as the width of semiconductor line portions 530'-1 depending on desired channel configuration and/or desired transistor performance. Similar to multigate device 200, sheet spacing (e.g., thickness of semiconductor line portions 530'-2), vertical segment width (e.g., width of semiconductor line portions 530'-2), horizontal segment width (e.g., a sum of a width of a respective semiconductor line portion 530'-1 and a width of a respective suspended semiconductor layer portions 215B'), and/or other channel dimension can be tuned to achieve a desired conduction current area and/or a desired drive current from multigate device 500 that optimizes transistor performance for a particular application.

For clarity and simplicity, similar features of multigate device 500 and multigate device 200 described above are identified by the same reference numerals. FIGS. 22A-22F have been simplified for the sake of clarity to better understand the inventive concepts of the present disclosure. Additional features can be added in multigate device 500, and some of the features described below can be replaced, modified, or eliminated in other embodiments of multigate device 500.

Figure 23A:
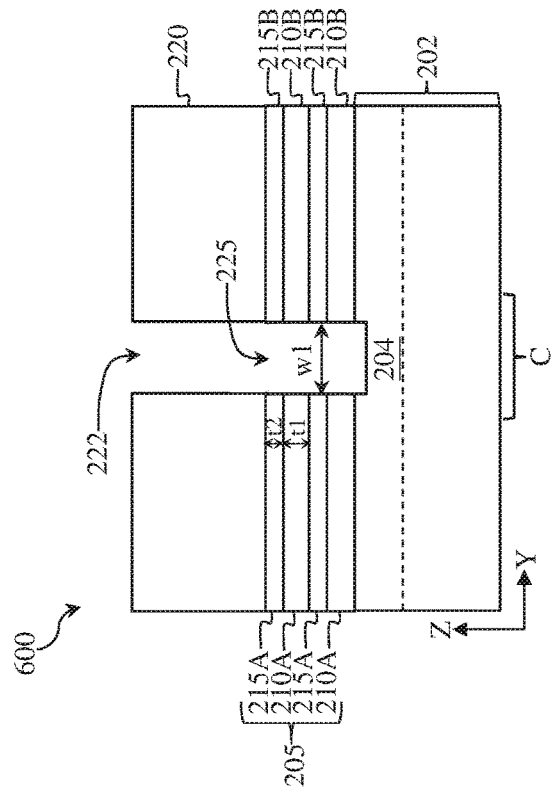
FIG. 23A, FIG. 23B, FIG. 23C, FIG. 23D, FIG. 23E, FIG. 23F, FIG. 23G, and FIG. 23H are fragmentary cross-sectional views of another multigate device, in portion or entirety, at various fabrication stages (such as those associated with the method in FIG. 1) according to various aspects of the present disclosure.
Figure 23B:
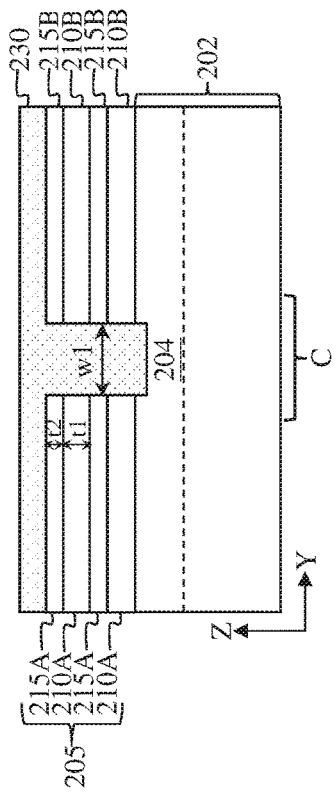
Figure 23C:
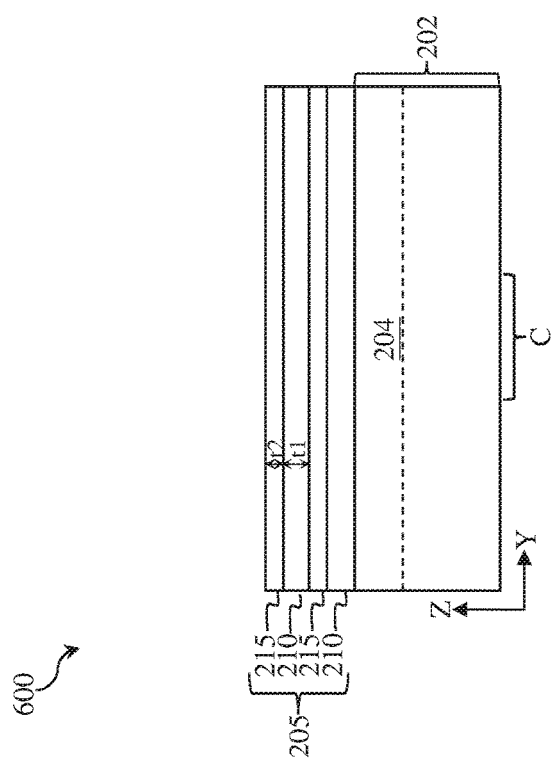
Figure 23D:
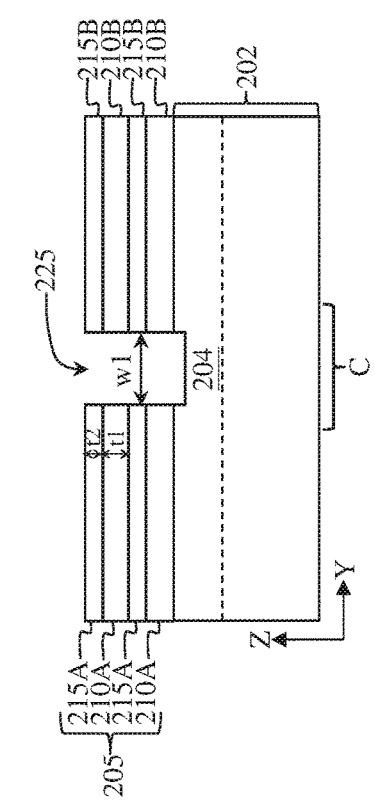
Figure 23E:
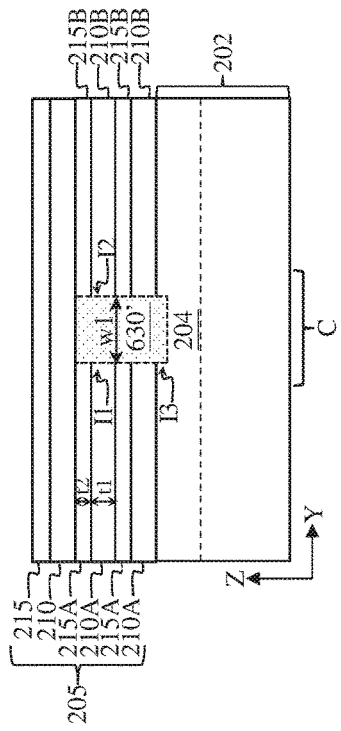
Figure 23F:
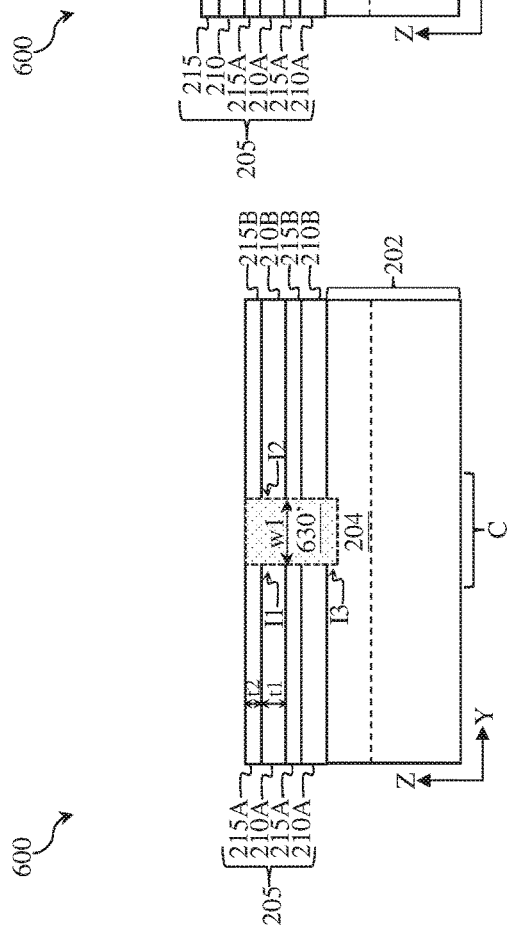
Figure 23H:
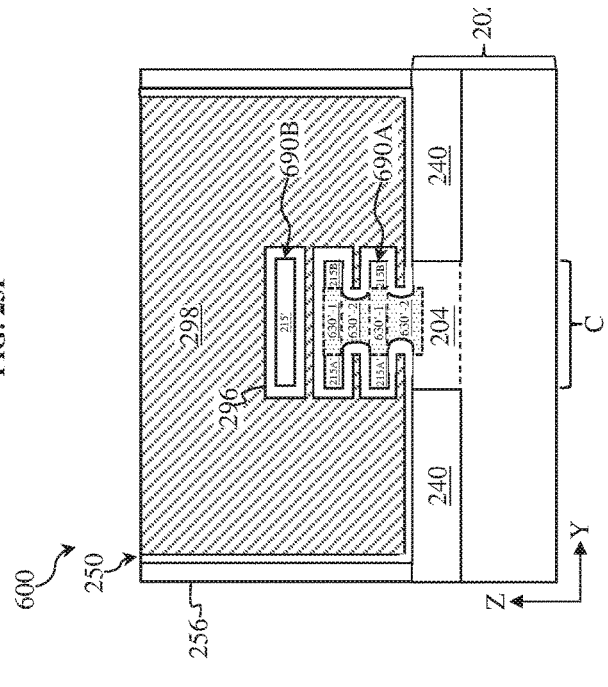
Figure 23G:
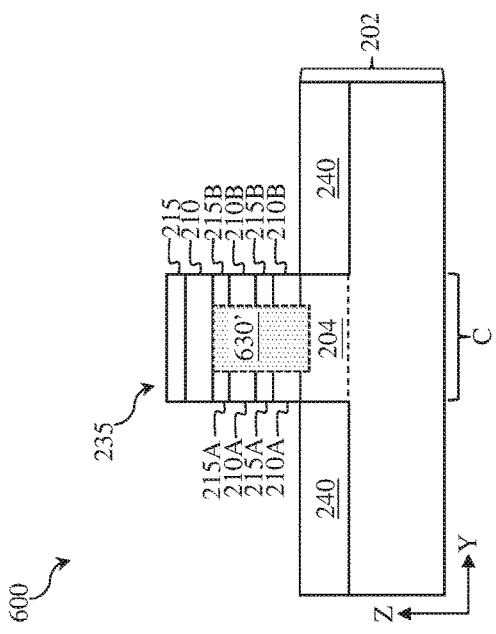

In some embodiments, a semiconductor line is formed in semiconductor layer stack 205 before depositing all semiconductor layers of semiconductor layer stack 205. FIGS. 23A-23H are fragmentary cross-sectional views of a multigate device 600, in portion or entirety, at various fabrication stages according to such embodiments. In FIG. 23A, multigate device 600 has undergone processing described with reference to FIGS. 2A-2E, but two pairs of semiconductor layer pairs are formed over substrate 202, instead of three semiconductor layer pairs as when fabricating multigate device 200. Each semiconductor layer pair includes a respective semiconductor layer 215 disposed over a respective semiconductor layer 210. In FIG. 23B, multigate device 600 has undergone processing described with reference to FIGS. 3A-3E and FIGS. 4A-4E, where trench 225 is formed extending completely through semiconductor layer stack 205 and partially into substrate 202, thereby forming semiconductor layer portions 210A separated from semiconductor layer portions 210B by trench 225 and semiconductor layer portions 215A separated from semiconductor layer portions 215B by trench 225. In FIGS. 23C-23E, multigate device 600 then undergoes processing similar to that described above with reference to FIGS. 5A-5E, FIGS. 6A-6E, and FIGS. 7A-7E, respectively, where a remainder of semiconductor layer 230 after the CMP process forms a semiconductor line 630' having width w1 and a height that is substantially the same as a height of semiconductor layer stack 205 at point in fabrication. Semiconductor line 630' is formed in an active region of multigate device 200, such as a region of multigate device 600 where a channel region and source/drain regions are formed for a transistor of multigate device 600. Accordingly, semiconductor layer stack 205 has semiconductor line 630' disposed between semiconductor layer portions 210A, 215A and semiconductor layer portions 210B, 215B. Semiconductor line 630' and semiconductor layer portions 210A, 215A have interface I1 therebetween and semiconductor line 630' and semiconductor layer portions 210B, 215B have interface I2 therebetween. Semiconductor line 630' and substrate 202 have an interface I3 therebetween. Then, in FIG. 23F, fabrication of semiconductor layer stack 205 is completed before forming fin 235. For example, a third semiconductor layer pair (e.g., a respective semiconductor layer 215 disposed over a respective semiconductor layer 210) is formed over semiconductor layer portions 210A, 215A, semiconductor line 630', and semiconductor layer portions 210B, 215B. In such embodiments, semiconductor layers 210, 215 of a top half of semiconductor layer stack 205 (or top portion depending on a number of semiconductor layer pairs of semiconductor layer stack 205) remain continuous. In FIG. 23G, multigate device 600 then undergoes processing similar to that described above with reference to FIGS. 8A-8E, respectively, where fin 235 is formed from semiconductor layer stack 205. In the depicted embodiment, fin 235 includes a substrate portion (i.e., a portion of substrate 202) and a semiconductor layer stack portion (i.e., a remaining portion of semiconductor layer stack 205. The semiconductor layer stack portion has a top portion that includes semiconductor layer 210 and semiconductor layer 215 and a bottom portion that includes semiconductor layer portions 210A, 215A, semiconductor layer portions 210B, 215B, and semiconductor line 630' disposed therebetween. In furtherance of the depicted embodiment, the substrate portion has a top portion that includes semiconductor line 630' disposed between portions of substrate 202 and a bottom portion that includes a continuous portion of substrate 202, which extends along a bottom of semiconductor line 630'.

In FIG. 22H, multigate device 600 has undergone processing described with reference to FIGS. 9A-9E, FIGS. 10A-10E, FIGS. 11A-11E, FIGS. 12A-12E, FIGS. 13A-13E, FIGS. 14A-14E, FIGS. 15A-15E, FIGS. 16A-16E, and FIGS. 17A-17E. Because semiconductor line 630' extends partially through fin 235 and is disposed at a bottom of fin 235, multigate device 600 has a different channel configuration than multigate device 200. For example, multigate device 600 has a H-shaped channel 690A and a nanosheet channel 690B, both of which are surrounded by metal gate 295. In such embodiments, the channel release process of FIGS. 15A-15E and the trimming process of FIGS. 16A-16E form a suspended channel layer 215' from top semiconductor layer 215 of fin 235, suspended semiconductor layer portions 215A', 215B' from semiconductor layer portions 215A, 215B of fin 235, and semiconductor line portions 630'-1 and semiconductor line portions 630'-2 from semiconductor line 630' of fin 235. Nanosheet channel 690B includes suspended channel layer 215' disposed vertically over H-shaped channel 690A. H-shaped channel 690A includes two horizontal segments (which can be referred to as nanosheets), a vertical segment that extends between and connects the horizontal segments, and a vertical segment that extends between and connects a bottom one of the horizontal segments to substrate 202. Each of the horizontal segments is formed by a respective suspended semiconductor layer portion 215A' (having, for example, width s1), a respective semiconductor layer portion 215B' (having, for example, width s2), and a respective semiconductor line portion 630'-1 (having, for example, width s3) that extends between and connects the respective suspended semiconductor layer portion 215A' and the respective semiconductor layer portion 215B'. The vertical segment is formed by semiconductor line portion 630'-2 (having, for example, width s4). In the depicted embodiment, a spacing between nanosheet channel 690B and H-shaped channel 690A is the same as a thickness of semiconductor line portions 630'-2, such as thickness h2 (which also provides a spacing between horizontal segments of H-shaped channel 690A). In some embodiments, the spacing between nanosheet channel 690B and H-shaped channel 690A is the different than the thickness of semiconductor line portions 630'-2. In the depicted embodiment, since semiconductor line 630' extends into substrate 202, a thickness of a bottom semiconductor line portion 230'-2 is greater than a thickness of semiconductor line portion 230'-2 connecting horizontal segments of H-shaped channel 690A. In some embodiments, semiconductor line portions 230'-2 have the same thickness. Similar to multigate device 200, sheet spacing (e.g., thickness h2), vertical segment width (e.g., width s4), horizontal segment width (e.g., width w2), and/or other channel dimension can be tuned to achieve a desired conduction current area and/or a desired drive current from multigate device 600 that optimizes transistor performance for a particular application. For clarity and simplicity, similar features of multigate device 600 and multigate device 200 described above are identified by the same reference numerals. FIGS. 23A-23H have been simplified for the sake of clarity to better understand the inventive concepts of the present disclosure. Additional features can be added in multigate device 600, and some of the features described below can be replaced, modified, or eliminated in other embodiments of multigate device 600.

The present disclosure provides for many different embodiments. An exemplary device includes a channel layer disposed over a substrate, a first source/drain feature and a second source/drain feature disposed over the substrate, and a metal gate disposed between the first source/drain feature and the second source/drain feature. The metal gate wraps the channel layer. The channel layer has a first horizontal segment, a second horizontal segment, and a vertical segment that extends between and connects the first horizontal segment and the second horizontal segment. The first horizontal segment and the second horizontal segment extend along a first direction and the vertical segment extends along a second direction different than the first direction. The vertical segment has a width along the first direction and a thickness along the second direction. The thickness is greater than the width. The channel layer extends between the first source/drain feature and the second source/drain feature along a third direction that is different than the first direction and the second direction.

In some embodiments, the first horizontal segment and the vertical segment form a first T-channel and the second horizontal segment forms a portion of a second T-channel, where the first T-channel is disposed over the second T-channel. In such embodiments, the vertical segment may a first vertical segment and the channel layer can further include a second vertical segment that extends between and connects the second horizontal segment to the substrate. In furtherance of such embodiments, the second vertical segment may extend along the second direction, and the second vertical segment may form a portion of the second T-channel. In some embodiments, the first horizontal segment, the second horizontal segment, and the vertical segment form an H-shaped channel that is suspended above and separated from the substrate. In such embodiments, the channel layer may be a first channel layer and the device can further include a second channel layer disposed vertically between the H-shaped channel and the substrate. In furtherance of such embodiments, the second channel layer can include a third horizontal segment that is suspended above and separated from the substrate. In furtherance of such embodiments, the third horizontal segment may be different than the first horizontal segment and/or the second horizontal segment.

In some embodiments, the first horizontal segment, the second horizontal segment, and the vertical segment form an H-shaped channel. In such embodiments, the vertical segment may be a first vertical segment, and the channel layer can further include a second vertical segment that extends between and connects the second horizontal segment to the substrate. The second vertical segment extends along the second direction. In furtherance of such embodiments, the channel layer may be a first channel layer, and the device can further include a second channel layer disposed. The H-shaped channel may be disposed vertically between the second channel layer and the substrate. The second channel layer may include a third horizontal segment that is suspended above and separated from the substrate. In furtherance of such embodiments, the third horizontal segment may be different than the first horizontal segment and the second horizontal segment. In some embodiments, the vertical segment is a first vertical segment and the channel layer further includes a third horizontal segment and a second vertical segment. The second vertical segment extends between and connects the second horizontal segment and the third horizontal segment. The first horizontal segment, the second horizontal segment, the third horizontal segment, the first vertical segment, and the second vertical segment form an E-shaped channel. In such embodiments, the channel layer can include a third vertical segment that extends between and connects the third horizontal segment to the substrate.

Another exemplary device includes a channel disposed over a substrate, a first source/drain feature and a second source/drain feature disposed over the substrate, and a metal gate disposed between the first source/drain feature and the second source/drain feature. The metal gate wraps the channel. The channel includes a first nanosheet, a second nanosheet, and a nanosheet connecting portion that connects the first nanosheet and the second nanosheet. A distance is between the first nanosheet and the second nanosheet along a first direction that is substantially perpendicular to the substrate. The nanosheet connecting portion has a thickness along a second direction that is substantially parallel with the substrate. The thickness is less than the distance. The first nanosheet and the second nanosheet extend from the first source/drain feature and the second source/drain feature along a third direction. The third direction is different than the first direction and the second direction. In some embodiments, the channel is connected to the substrate. In some embodiments, the channel is not connected to the substrate. In some embodiments, the nanosheet connecting portion connects a first center of the first nanosheet with a second center of the second nanosheet. In some embodiments, the nanosheet connecting portion connects a first edge of the first nanosheet with a second edge of the second nanosheet. In some embodiments, the channel further includes a third nanosheet that is not connected to the first nanosheet and the second nanosheet. In some embodiments, the nanosheet connecting portion extends from the first source/drain feature to the second source/drain feature along the third direction.

An exemplary method includes forming a semiconductor layer stack over a substrate. The semiconductor layer stack includes first semiconductor layers and second semiconductor layers stacked vertically in an alternating configuration. The method further includes forming a semiconductor line that extends from a first one of the first semiconductor layers through one of the second semiconductor layers to a second one of the first semiconductor layers. The semiconductor line has a first width. The method further includes patterning the semiconductor layer stack to form a fin structure extending from the substrate. The fin structure includes the semiconductor line, a portion of the first one of the first semiconductor layers, a portion of the one of the second semiconductor layers, and a portion of the second one of the first semiconductor layers. The method further includes selectively removing the portion of the one of the second semiconductor layers, such that the first one of the first semiconductor layers is separated from the second one of the first semiconductor layers by a distance along a first direction and the semiconductor line extends between and connects the first one of the first semiconductor layers to the second one of the first semiconductor layers along the first direction. The method further includes trimming the semiconductor line to reduce the first width to a second width. The first width and the second width are along a second direction different than the first direction, the first width is greater than the distance, and the second width is less than the distance. In some embodiments, forming the semiconductor line that extends from the first one of the first semiconductor layers through the one of the second semiconductor layers to the second one of the first semiconductor layers includes performing an extreme ultraviolet (EUV) lithography process to form an EUV mask over the semiconductor layer stack; etching a trench using the EUV mask as an etch mask, wherein the trench extends through the first one of the first semiconductor layers, the one of the second semiconductor layers, and the second one of the first semiconductor layers; and filling the trench with a semiconductor material.

Yet another exemplary device includes a T-shaped channel layer over a substrate, a first source/drain feature and a second source/drain feature over the substrate, and a metal gate disposed between the first source/drain feature and the second source/drain feature. The T-shaped channel layer is disposed between the first source/drain feature and the second source/drain feature. The T-shaped channel layer includes a first channel portion and a second channel portion that each extend along a first direction that is substantially parallel to a top surface of the substrate and a channel extension portion that extends along a second direction that is substantially perpendicular to the top surface of the substrate. The channel extension portion is disposed between and connects the first channel portion and the second channel portion. The metal gate wraps the first channel portion and the second channel portion. The metal gate is disposed along sidewalls of the channel extension portion. In some embodiments, a first material of the first channel portion and the second channel portion is different than a second material of the channel extension portion. In some embodiments, a first material of the first channel portion and the second channel portion is the same as a second material of the channel extension portion. In some embodiments, the channel extension portion has a thickness defined along the first direction, the first channel portion and the second channel portion are separated from the substrate by a spacing defined along the second direction, and the thickness is less than the spacing. In some embodiments, the first channel portion and the second channel portion each have a top surface, a bottom surface, and a sidewall surface that extends between the top surface and the bottom surface. In such embodiments, the metal gate covers the top surface, the bottom surface, and the sidewall surface.

In some embodiments, the T-shaped channel layer is a first T-shaped channel layer and the channel extension portion is a first channel extension portion. In such embodiments, the device can further include a second T-shaped channel layer disposed over and connected to the first T-shaped channel layer. The second T-shaped channel layer includes a third channel portion and a fourth channel portion that each extend along the first direction and a second channel extension portion that extends along the second direction. The second channel extension portion is disposed between and connects the third channel portion and the fourth channel portion. The second channel extension portion is connected to the first channel extension portion. The second T-shaped channel layer is disposed between the first source/drain feature and the second source/drain feature. The metal gate wraps the third channel portion and the fourth channel portion, and the metal gate is disposed along sidewalls of the second channel extension portion. In such embodiments, the first channel extension portion and the second channel extension portion can each have a thickness defined along the first direction, the first channel portion can be separated from the third channel portion by a first spacing defined along the second direction, and the second channel portion can be separated from the fourth channel portion by a second spacing defined along the second direction. Each of the first spacing and the second spacing are greater than the thickness. In some embodiments, the first channel extension portion has a first thickness, the second channel portion has a second thickness, the first thickness and the second thickness are each defined along the first direction. The first thickness may be the same as or different than the second thickness depending on design considerations. In some embodiments, the metal gate may fill the first spacing and the metal gate may fill the second spacing. In some embodiments, the first spacing is different than the second spacing. In some embodiments, the first spacing is the same as the second spacing.

Yet another exemplary device includes an F-shaped channel layer over a substrate, a first source/drain feature and a second source/drain feature over the substrate, and a metal gate disposed between the first source/drain feature and the second source/drain feature. The F-shaped channel layer is disposed between the first source/drain feature and the second source/drain feature. The F-shaped channel layer includes a first channel portion and a second channel portion that each extend along a first direction that is substantially parallel to a top surface of the substrate. The first channel portion is disposed over the second channel portion. The F-shaped channel layer further includes channel extension portion that extends along a second direction that is substantially perpendicular to the top surface of the substrate. Each of the first channel portion and the second channel portion are connected to and extend from a first side of the channel extension portion. The metal gate wraps the first channel portion and the second channel portion. The metal gate is disposed along a second side of the channel extension portion. The metal gate fills a space between the first channel portion and the second channel portion. In some embodiments, the channel extension portion has a thickness defined along the first direction, the spacing between the first channel portion and the second channel portion is defined along the second direction, and the thickness is less than the spacing.

Another exemplary method includes forming a semiconductor layer stack over a substrate. The semiconductor layer stack includes a first semiconductor layer disposed over the substrate and a second semiconductor layer disposed over the first semiconductor layer. The second semiconductor layer is different than the first semiconductor layer. The method includes forming a third semiconductor layer that extends through the second semiconductor layer and the first semiconductor layer of the semiconductor layer stack. The method includes patterning the semiconductor layer stack to form a fin structure extending from the substrate. The fin structure includes a first portion of the second semiconductor layer disposed over a first portion of the first semiconductor layer, a second portion of the second semiconductor layer disposed over a second portion of the first semiconductor layer, and the third semiconductor layer separating the first portion of the second semiconductor layer from the second portion of the second semiconductor layer and separating the first portion of the first semiconductor layer from the second portion of the first semiconductor layer. The method includes etching the fin structure to form source/drain recesses. A channel region of the fin structure is disposed between the source/drain recesses. The method includes forming source/drain features in the source/drain recesses. The method includes, after selectively removing the first portion of the first semiconductor layer and the second portion of the first semiconductor layer from the channel region of the fin structure, forming a metal gate that wraps the first portion of the second semiconductor layer and the second portion of the second semiconductor layer. The metal gate is further disposed along sidewalls of the third semiconductor layer. In some embodiments, the method further includes modifying a thickness of the third semiconductor layer before forming the metal gate and after selectively removing the first portion of the first semiconductor layer and the second portion of the first semiconductor layer from the channel region of the fin structure.

In some embodiments, the modifying the thickness of the third semiconductor layer includes reducing a thickness of the third semiconductor layer, such that the thickness is less than a first spacing between the first portion of the second semiconductor layer and the substrate and a second spacing between the second portion of the second semiconductor layer and the substrate. In some embodiments, forming the third semiconductor layer that extends through the second semiconductor layer and the first semiconductor layer of the semiconductor layer stack includes performing a lithography process to expose a portion of the semiconductor layer stack, etching the exposed portion of the semiconductor layer stack to form a trench, depositing a semiconductor material in the trench and over the semiconductor layer stack, performing an annealing process on the semiconductor material, and performing a planarization process on the semiconductor material, thereby removing the semiconductor material from over the semiconductor layer stack. In some embodiments, the third semiconductor layer extends through the semiconductor layer stack into the substrate. In some embodiments, the lithography process is an extreme ultraviolet (EUV) lithography process that forms an EUV mask over the semiconductor layer stack. The EUV mask has an opening that exposes the portion of the semiconductor layer stack. In some embodiments, the semiconductor material includes silicon. In some embodiments, the semiconductor material includes amorphous silicon. In such embodiments, the annealing process recrystallizes the amorphous silicon.

In some embodiments, the semiconductor layer stack further includes a fourth semiconductor layer disposed between a fifth semiconductor layer and the first semiconductor layer. A material of the fourth semiconductor layer is the same as the second semiconductor layer, a material of the fifth semiconductor layer is the same as a material of the first semiconductor layer, and the fifth semiconductor layer is disposed between the substrate and the fourth semiconductor layer. In such embodiments, the fin structure can further include a first portion of the fourth semiconductor layer disposed over a first portion of the fifth semiconductor layer, a second portion of the fourth semiconductor layer disposed over a second portion of the fifth semiconductor layer, and the third semiconductor layer separating the first portion of the fourth semiconductor layer from the second portion of the fourth semiconductor layer and separating the first portion of the fifth semiconductor layer from the second portion of the fifth semiconductor layer. In such embodiments, after selectively removing the first portion of the fifth semiconductor layer and the second portion of the fifth semiconductor layer from the channel region of the fin structure, the metal gate further wraps the first portion of the fourth semiconductor layer and the second portion of the fourth semiconductor layer. In some embodiments, the method further includes reducing a thickness of the fourth semiconductor layer before forming the metal gate and after selectively removing the first portion of the first semiconductor layer, the second portion of the first semiconductor layer, the first portion of the fifth semiconductor layer, and the second portion of the fifth semiconductor layer from the channel region of the fin structure. The thickness is less than a first spacing between the first portion of the second semiconductor layer and the first portion of the fourth semiconductor layer and a second spacing between the second portion of the second semiconductor layer and the second portion of the fourth semiconductor layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a channel layer over a substrate, wherein the channel layer includes a first semiconductor material and a second semiconductor material, and the channel layer has:
        a first horizontal segment extending along a first direction, the first horizontal segment having a first bulk portion formed from the first semiconductor material and a second bulk portion formed from the second semiconductor material, wherein the second bulk portion is laterally adjacent to the first bulk portion along the first direction,
        a second horizontal segment extending along the first direction, the second horizontal segment having a third bulk portion formed from the first semiconductor material and a fourth bulk portion formed from the second semiconductor material, wherein the third bulk portion is laterally adjacent to the fourth bulk portion along the first direction, the first bulk portion is disposed over the third bulk portion along a second direction, the second bulk portion is disposed over the fourth bulk portion along the second direction, and the second direction is different than the first direction, and
        a vertical segment having a fifth bulk portion formed from the second semiconductor material, wherein the vertical segment extends along the second direction and the fifth bulk portion is connected to the second bulk portion of the first horizontal segment and the fourth bulk portion of the second horizontal segment, and wherein the vertical segment has a width along the first direction, the vertical segment has a thickness along the second direction, and the thickness is greater than the width;
    forming a gate stack that wraps the channel layer; and
    forming a first source/drain and a second source/drain, wherein the channel layer extends between the first source/drain and the second source/drain.

2. The method of claim 1, wherein a gap is between the first horizontal segment and the second horizontal segment along the second direction, and the gate stack fills the gap.

3. The method of claim 1, wherein the forming the channel layer includes configuring and processing a semiconductor layer stack such that the first horizontal segment and the vertical segment form a first T-channel and the second horizontal segment forms a portion of a second T-channel, wherein the first T-channel is over the second T-channel.

4. The method of claim 3, wherein:
the vertical segment is a first vertical segment;
the channel layer further includes a second vertical segment that extends between and connects the second horizontal segment to the substrate; and
the forming the channel layer includes configuring and processing the semiconductor layer stack such that the second vertical segment and the second horizontal segment form the second T-channel.

5. The method of claim 1, wherein the forming the channel layer includes configuring and processing a semiconductor layer stack such that the first horizontal segment, the second horizontal segment, and the vertical segment form an H-shaped channel that is suspended above and separated from the substrate.

6. The method of claim 5, wherein the channel layer is a first channel layer, and the method further includes forming a second channel layer between the H-shaped channel and the substrate, wherein the second channel layer includes a third horizontal segment that is suspended above and separated from the substrate.

7. The method of claim 1, wherein:
the vertical segment is a first vertical segment;
the forming the channel layer includes configuring and processing a semiconductor layer stack such that the first horizontal segment, the second horizontal segment, and the first vertical segment form an H-shaped channel; and
the channel layer further includes a second vertical segment that extends between and connects the second horizontal segment to the substrate.

8. The method of claim 7, wherein:
the channel layer is a first channel layer;
the method further includes forming a second channel layer, wherein the H-shaped channel is disposed vertically between the second channel layer and the substrate; and
the second channel layer includes a third horizontal segment that is suspended above and separated from the substrate.

9. The method of claim 1, wherein:
the vertical segment is a first vertical segment;
the channel layer further includes a third horizontal segment and a second vertical segment, wherein the second vertical segment extends between and connects the second horizontal segment and the third horizontal segment; and
the forming the channel layer includes configuring and processing a semiconductor layer stack such that the first horizontal segment, the second horizontal segment, the third horizontal segment, the first vertical segment, and the second vertical segment form an E-shaped channel.

10. The method of claim 9, wherein the channel layer further includes a third vertical segment that extends between and connects the third horizontal segment to the substrate.

11. A method comprising:
forming a channel over a substrate, wherein the channel includes a first nanosheet that includes a first semiconductor material and a second semiconductor material, a second nanosheet that includes the first semiconductor material and the second semiconductor material, and a nanosheet connecting portion that includes the second semiconductor material and connects the first nanosheet and the second nanosheet, wherein:
a distance is between the first nanosheet and the second nanosheet along a first direction that is substantially perpendicular to the substrate,
the nanosheet connecting portion has a thickness along a second direction that is different than the first direction, and
the thickness is less than the distance;
forming a first source/drain feature and a second source/drain feature over the substrate, wherein the first nanosheet and the second nanosheet extend from the first source/drain feature and the second source/drain feature along a third direction, wherein the third direction is different than the first direction and the second direction; and
forming a gate stack that wraps the channel, wherein the gate stack is disposed between the first source/drain feature and the second source/drain feature.

12. The method of claim 11, wherein the forming the channel includes configuring and processing a semiconductor layer stack such that the channel is connected to the substrate.

13. The method of claim 11, wherein the forming the channel includes configuring and processing a semiconductor layer stack such that the channel is not connected to the substrate.

14. The method of claim 11, wherein the forming the channel includes configuring and processing a semiconductor layer stack such that the nanosheet connecting portion connects a first center of the first nanosheet with a second center of the second nanosheet.

15. The method of claim 11, wherein the forming the channel includes configuring and processing a semiconductor layer stack such that the nanosheet connecting portion connects a first edge of the first nanosheet with a second edge of the second nanosheet.

16. The method of claim 11, wherein the channel further includes a third nanosheet that is not connected to the first nanosheet and the second nanosheet.

17. A device comprising:
a channel layer over a substrate, wherein the channel layer includes a first semiconductor material and a second semiconductor material, and the channel layer has:
a first horizontal segment formed from the first semiconductor material and the second semiconductor material,
a second horizontal segment formed from the first semiconductor material and the second semiconductor material, wherein the first horizontal segment and the second horizontal segment extend along a first horizontal direction,
a vertical segment formed from the second semiconductor material, wherein the vertical segment extends between and connects a first portion of the first horizontal segment and a first portion of the second horizontal segment and a gap is between a second portion of the first horizontal segment and a second portion of the second horizontal segment, and
a third horizontal segment formed from the first semiconductor material, wherein the third horizontal segment is not connected to the first horizontal segment, the second horizontal segment, and the vertical segment;
a first source/drain feature and a second source/drain feature over the substrate, wherein the channel layer extends along a second horizontal direction from the first source/drain feature to the second source/drain feature, the second horizontal direction is different than the first horizontal direction, and the channel layer is connected to the first source/drain feature and the second source/drain feature; and a gate stack that wraps the channel layer, wherein the gate stack fills the gap between the second portion of the first horizontal segment and the second portion of the second horizontal segment and the gate stack is between the first source/drain feature and the second source/drain feature along the second horizontal direction.

18. The device of claim 17, wherein:

the first horizontal segment and the second horizontal segment each include a respective middle portion disposed between respective end portions, wherein the middle portion of the first horizontal segment is the first portion of the first horizontal segment, the middle portion of the second horizontal segment is the first portion of the second horizontal segment, the end portions of the first horizontal segment are the second portion of the first horizontal segment, and the end portions of the second horizontal segment are the second portion of the second horizontal segment; and the middle portions are formed from the second semiconductor material, the end portions are formed from the first semiconductor material, and the vertical segment is connected to the middle portion of the first horizontal segment and the middle portion of the second horizontal segment.

19. The device of claim 17, wherein:

the first portions of the first horizontal segment and the second horizontal segment are formed from the second semiconductor material;

the second portions of the first horizontal segment and the second horizontal segment are formed from the first semiconductor material;

the vertical segment, the first portion of the first horizontal segment, and the first portion of the second horizontal segment form a first side of the channel layer; and the second portion of the first horizontal segment and the second portion of the second horizontal segment form a second side of the channel layer, wherein the first side of the channel layer is adjacent to and extends from the second side of the channel layer.

20. The device of claim 17, wherein the third horizontal segment is between the second horizontal segment and the substrate.

* * * * *